(12) United States Patent
Fujimori

(10) Patent No.: US 7,192,681 B2
(45) Date of Patent: Mar. 20, 2007

(54) POSITIVE PHOTOSENSITIVE COMPOSITION

(75) Inventor: Toru Fujimori, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 179 days.

(21) Appl. No.: 10/188,224

(22) Filed: Jul. 3, 2002

(65) Prior Publication Data

US 2003/0186161 A1   Oct. 2, 2003

(30) Foreign Application Priority Data

| Jul. 5, 2001 | (JP) | ............................. P2001-204969 |
| Jul. 6, 2001 | (JP) | ............................. P2001-206637 |
| Sep. 20, 2001 | (JP) | ............................. P2001-287112 |

(51) Int. Cl.
*G03F 7/039* (2006.01)
*G03F 7/075* (2006.01)

(52) U.S. Cl. ................... 430/270.1; 430/910; 430/914; 430/917; 430/919; 430/920

(58) Field of Classification Search ............. 430/270.1, 430/914, 917, 919, 920, 910
See application file for complete search history.

(56) References Cited

U.S. PATENT DOCUMENTS

| 6,280,898 B1 | 8/2001 | Hasegawa et al. |
| 6,416,928 B1 | 7/2002 | Ohsawa et al. |
| 6,514,664 B1 * | 2/2003 | Touky et al. |
| 6,517,991 B1 | 2/2003 | Kodama et al. |
| 6,528,232 B1 * | 3/2003 | Maeda et al. ............. 430/270.1 |
| 6,537,726 B2 * | 3/2003 | Nakanishi et al. ....... 430/270.1 |
| 6,544,715 B2 * | 4/2003 | Sato et al. ................ 430/270.1 |
| 6,692,897 B2 | 2/2004 | Fujimori et al. |
| 6,800,414 B2 * | 10/2004 | Nishimura et al. ...... 430/270.1 |
| 6,808,860 B2 * | 10/2004 | Sato et al. ................ 430/270.1 |
| 2001/0003772 A1 | 6/2001 | Hatakeyama et al. |
| 2002/0098440 A1 | 7/2002 | Sato et al. |
| 2003/0077540 A1 * | 4/2003 | Kodama et al. |
| 2003/0077543 A1 * | 4/2003 | Sato |

FOREIGN PATENT DOCUMENTS

| EP | 0 789 278 A2 | 8/1997 |
| EP | 0 793 144 A2 | 9/1997 |
| EP | 0 901 043 A1 | 3/1999 |
| EP | 1 014 193 A1 | 6/2000 |
| EP | 1 024 406 A1 | 8/2000 |
| EP | 1 031 879 A1 | 8/2000 |
| EP | 1 041 442 A1 | 10/2000 |
| EP | 1 048 983 A1 | 11/2000 |
| EP | 1 085 379 A1 | 3/2001 |
| EP | 1 091 248 A1 | 4/2001 |
| EP | 1 096 317 A1 | 5/2001 |
| EP | 1 120 689 A2 | 8/2001 |
| EP | 1 126 322 A2 | 8/2001 |
| EP | 1 132 774 A2 | 9/2001 |
| EP | 1 162 506 A1 | 12/2001 |
| EP | 1 231 205 A1 | 8/2002 |
| EP | 1 260 864 A1 | 11/2002 |
| EP | 1 267 210 A2 | 12/2002 |
| EP | 952489 * | 4/2004 |
| GB | 2 373 867 A | 10/2002 |
| JP | 10-111569 A | 4/1998 |
| JP | 11-305444 A | 11/1999 |
| JP | 2000/047386 * | 2/2000 |
| JP | 2001-66779 A | 3/2001 |
| JP | 2001-109154 * | 4/2001 |
| WO | WO 02/08834 A1 | 1/2002 |

OTHER PUBLICATIONS

European Search Report dated Dec. 12, 2003.
Partial Search Report dated Sep. 1, 2003.

* cited by examiner

*Primary Examiner*—Richard L. Schilling
(74) *Attorney, Agent, or Firm*—Sughrue Mion, PLLC

(57) ABSTRACT

A positive photosensitive composition comprising (A) an acid generator that generates an acid upon irradiation of an actinic ray or radiation, (B) a resin that has a monocyclic or polycyclic alicyclic hydrocarbon structure and is decomposed by the action of an acid to increase solubility in an alkali developing solution, and (C) a specific basic compound.

7 Claims, 3 Drawing Sheets

POSITIVE PHOTOSENSITIVE COMPOSITION

FIELD OF THE INVENTION

Figure 1:
Figure 1:
Figure 1:
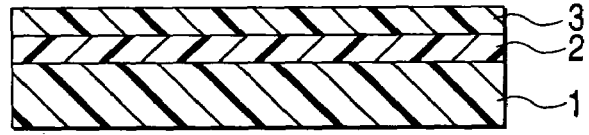
Figure 1:
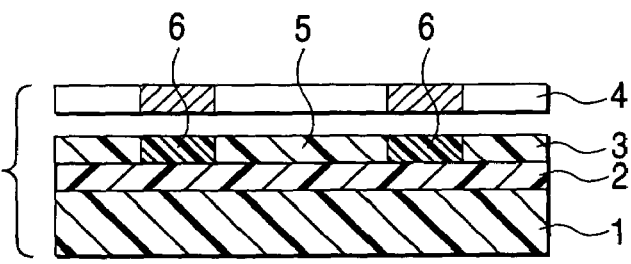
Figure 2:
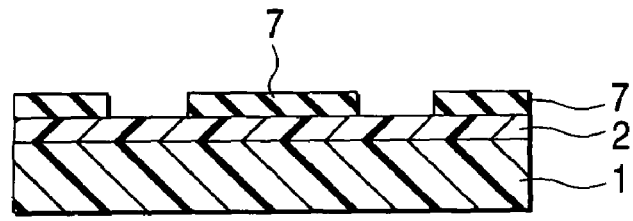
Figure 2:
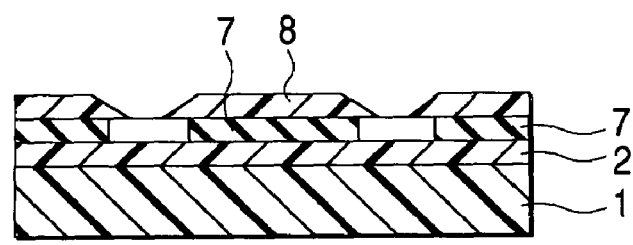
Figure 2:
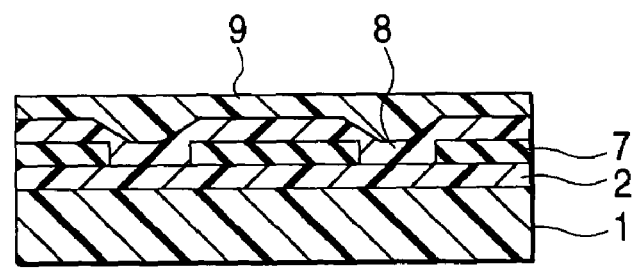
Figure 2:
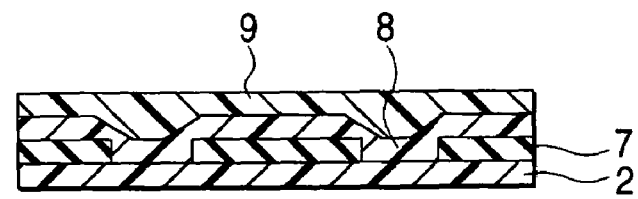
Figure 3:
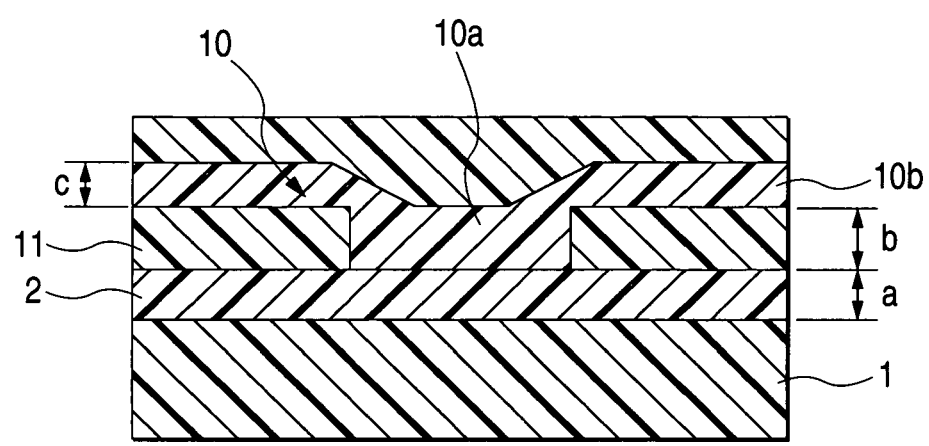

The present invention relates to a positive photosensitive composition used in the production process of semiconductor devices, for example, IC, in the production of circuit substrates for liquid crystals or thermal heads, and in other photofabrication processes. More specifically, the present invention pertains to a positive photosensitive composition suitable for use a far ultraviolet ray of not more than 250 nm as a light source for exposure.

BACKGROUND OF THE INVENTION

A chemically amplified positive resist composition is a pattern formation material in which an acid is generated in the exposed area upon irradiation of radiation, for example, a far ultraviolet ray, and solubility in a developer between the exposed area and unexposed area is differentiated by a reaction using the acid as a catalyst, whereby a pattern is formed on a substrate.

Since the composition is mainly composed of a resin having as a basic skeleton, poly(hydroxystyrene) that has a small absorption in a region of 248 nm, a good pattern with high sensitivity and high resolution is formed, when a KrF excirer laser is used as a light source for exposure. Thus, the composition is superior to a conventional resist composition using a naphthoquinonediazide/novolac resin.

When a light source having a shorter wavelength, e.g., an ArF excimer laser (193 nm) is used for exposure, on the other hand, since an aromatic group-containing compound essentially has a large absorption in a region of 193 nm, the above-described chemically amplified composition is still insufficient.

The use of poly(meth)acrylate as a polymer having a small absorption in a wavelength range of 193 nm is described in *J. Vac. Sci. Technol.*, B9, 3357(1991). The polymer has, however, a problem in that resistance to dry etching ordinarily performed in a semiconductor production process is low in comparison with conventional phenolic resins having an aromatic group.

Also, a triarylsulfonium salt acid generator and a phenacylsulfonium salt acid generator are known as acid generators for chemically amplified positive resist composition. However, these acid generators are low in sensitivity, since the triarylsulfonium salt acid generator has a large absorption at a wavelength of 193 nm and the phenacylsulfonium salt acid generator is inferior in the acid-generating property.

According to the request on the miniaturization of semiconductor chips in recent years, patterns of semiconductor reach to a fine range of from 0.13 to 0.35 μm. However, conventional resist compositions have a problem in that the resolution of pattern is poor owing to factors, for example, edge roughness of line pattern. The term "line edge roughness" used herein means unevenness of edge which results from irregular fluctuation of an edge of top portion and an edge of bottom portion in the direction vertical to the line due to the characteristics of resist, when the pattern is observed from just above.

Further, other characteristics, for example, halftone exposure aptitude are not satisfied according to conventional techniques. The term "halftone exposure aptitude" used herein means that when the exposure is performed using a halftone phase sift mask, sidelobe, which is a phenomenon wherein a hole is apt to be made due to weakening of surface in the unexposed area, does not occur or hardly occur. The halftone exposure aptitude is also referred to as sidelobe resistance.

Moreover, it is also desired to restrain development defect in conventional resist composition. For instance, resist compositions containing an acid-decomposable resin having an alicyclic hydrocarbon structure and a single basic compound are described, for example, in JP-A-10-111569 and JP-A-11-305444 (the term "JP-A" as used herein means an "unexamined published Japanese patent application"). However, there is room for improvement, for example, in the edge roughness of pattern and development defect.

SUMMARY OF THE INVENTION

Therefore, an object of the present invention is to provide a positive photosensitive composition in which edge roughness of pattern is improved and development defect is restrained.

Another object of the present invention is to provide a positive photosensitive composition that is excellent in halftone exposure aptitude (or sidelobe resistance).

Other objects of the present invention will become apparent from the following description.

The above-described objects of, the present invention are accomplished by the positive photosensitive compositions described below.

1. A positive photosensitive composition comprising (A) an acid generator that generates an acid upon irradiation of an actinic ray or radiation, (B) a resin that has a monocyclic or polycyclic alicyclic hydrocarbon structure and is decomposed by the action of an acid to increase solubility in an alkali developing solution, and (C) a basic compound, wherein the basic compound is (C-1) a mixture of at least two basic compounds having different structures, (C-2) a basic compound containing a substituted or unsubstituted aliphatic hydrocarbon group having not less than 8 carbon atoms, or (C-3) a basic compound selected from an oxygen-containing primary aliphatic amine, an oxygen-containing secondary aliphatic amine and an oxygen-containing tertiary aliphatic amine.

2. A positive photosensitive, composition comprising (A) an acid generator that generates an acid upon irradiation of an actinic ray or radiation, (B) a resin that has a monocyclic or polycyclic alicyclic hydrocarbon structure and is decomposed by the action of an acid to increase solubility in an alkali developing solution, and (C-1) a mixture of at least two basic compounds having different structures.

3. A positive photosensitive composition comprising (A) an acid generator that generates an acid upon irradiation of an actinic ray or radiation, (B) a resin that has a monocyclic or polycyclic alicyclic hydrocarbon structure and is decomposed by the action of an acid to increase solubility in an alkali developing solution, and (C-2) a basic compound containing a substituted or unsubstituted aliphatic hydrocarbon group having not less than 8 carbon atoms.

4. A positive photosensitive composition comprising (A) an acid generator that generates an acid upon irradiation of an actinic ray or radiation, (B) a resin that has a monocyclic or polycyclic alicyclic hydrocarbon structure and is decomposed by the action of an acid to increase solubility in an alkali developing solution, and (C-3) a basic compound selected from an oxygen-containing primary aliphatic amine, an oxygen-containing secondary aliphatic amine and an oxygen-containing tertiary aliphatic amine.

5. The positive photosensitive composition as described in item (4) above, wherein the positive photosensitive composition further comprises (C') a basic compound that does not contain an oxygen atom.

6. The positive photosensitive composition as described in item (1) above, wherein the positive photosensitive composition further comprises (D) a fluorine and/or silicon surface active agent.

7. The positive photosensitive composition as described In item (1) above, wherein the positive photosensitive composition further comprises (F) a dissolution inhibiting low molecular weight compound having a group capable of being decomposed by the action of an acid to increase solubility in an alkali developing solution and having a molecular weight of not more than 3,000.

8. The positive photosensitive composition as described in item (1) above, wherein the positive photosensitive composition further comprises (E) a mixed solvent composed of a solvent containing a hydroxy group and a solvent containing no hydroxy group.

DETAILED DESCRIPTION OF THE INVENTION

The positive photosensitive composition according to the present invention will be described in more detail below.

<<(A) Acid Generator>>

The photosensitive composition of the present invention includes an acid generator (or a photo-acid generator) that generates an acid upon irradiation of an actinic ray or radiation of component (A).

Such a photo-acid generator can be appropriately selected from photoinitiators for photo-cationic polymerization, photoinitiators for photo-radical polymerization, photo-achromatic agents for dyes, photo-discoloring agents, known compounds generating an acid upon irradiation of an actinic ray or radiation used for a microresist, and mixtures thereof.

Examples of such photo-acid generators include an onium salt, for example, a diazonium salt, an ammonium salt, a phosphonium salt, an iodonium salt, a sulfonium salt, a selenonium salt or an arsonium salt, an organic halogeno compound, an organo-metal/organic halide, a photo-acid generator having an o-nitrobenzyl type protective group, a compound generating a sulfonic acid upon photolysis, which is represented by an iminosulfonate, and a disulfone compound.

Also, polymer compounds in which a group or compound generating an acid upon irradiation of an actinic ray or radiation is introduced into the main chain or aide Chain thereof, for example, compounds as described, for example, in U.S. Pat. No. 3,849,137, West German Patent 3,914,407, JP-A-63-26653, JP-A-55-164824, JP-A-62-69263, JP-A-63-146038, JP-A-63-163452, JP-A-62-153853 and JP-A-63-146029 may be used.

Further, compounds generating an acid with light as described, for example, in U.S. Pat. No. 3,779,778 and European Patent 126,712 may be used.

Of the compounds decomposing upon irradiation of an actinic ray or radiation to generate an acid, those, which can be particularly effectively used, are described below.

(1) Iodonium salt represented by formula (PAG1) shown below or sulfonium salt represented by formula (PAG2) shown below:

(PAG1)

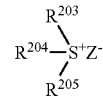
(PAG2)

In formulae (PAG1) and (PAG2), $Ar^1$ and $Ar^2$, which may be the same or different, each independently represent a substituted or unsubstituted aryl group. Preferred examples of the substituent include an alkyl group, a haloalkyl group, a cycloalkyl group, an aryl group, an alkoxy group, a nitro group, a carboxy group, an alkoxycarbonyl group, a hydroxy group, a mercapto group and a halogen atom.

$R^{203}$, $R^{204}$ and $R^{205}$, which may be the same or different, each independently represents a substituted or unsubstituted alkyl group or a substituted or unsubstituted aryl group, preferably an aryl group having from 6 to 14 carbon atoms, an alkyl group having from 1 to 8 carbon atoms, or a substituted derivative thereof. Preferred examples of the substituent include, for the aryl group, an alkoxy group having from 1 to 8 carbon atoms, an alkyl group having from 1 to 8 carbon atoms, a nitro group, a carboxy group, a hydroxy group and a halogen atom, and for the alkyl group, an alkoxy group having from 1 to 8 carbon atoms, a carboxy group and an alkoxycarbonyl group.

$Z^-$ represents a counter anion. Examples of the counter anion include $BF_4^-$, $AsF_6^-$, $PF_6^-$, $SbF_6^-$, $SiF_6^{2-}$, $ClO_4^-$, a perfluoroalkane sulfonic acid anion, e.g., $CF_3SO_3^-$, pentafluorobenzene subtonic acid anion, a condensed polynucleic aromatic sulfonic anion, e.g., naphthalene-1-sulfonic acid anion, an anthraquinone sulfonic acid anion and a dye containing a sulfonic group, however, the present invention should not be construed as being limited thereto.

Two of $R^{203}$, $R^{204}$ and $R^{205}$ or $Ar^1$ and $Ar^2$ may be combined with each other through a single bond or a substituent.

Specific examples of such compounds are set forth below, but the present invention should not be construed as being limited thereto.

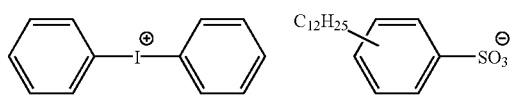
(PAG1-1)

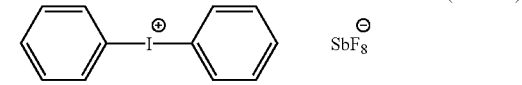
(PAG1-2)

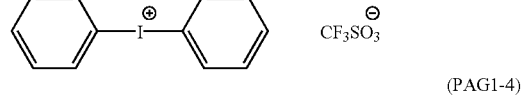
(PAG1-3)

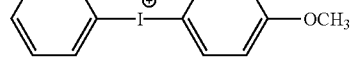
(PAG1-4)

-continued
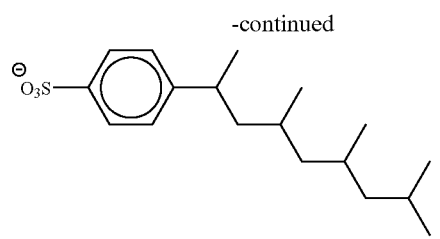
(PAG1-5)
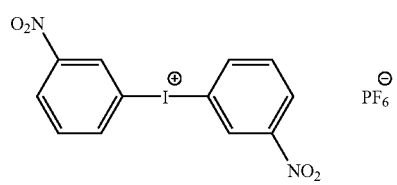
(PAG1-6)
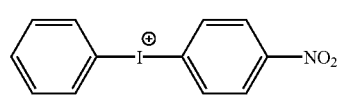
(PAG1-7)
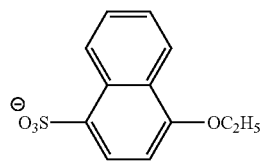
(PAG1-8)
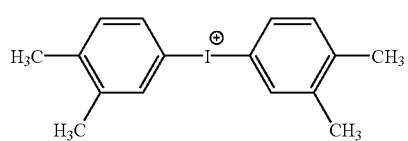
(PAG1-9)
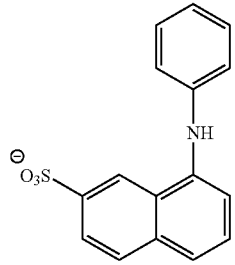
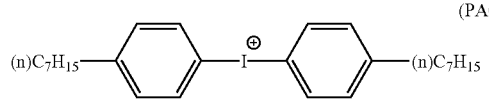
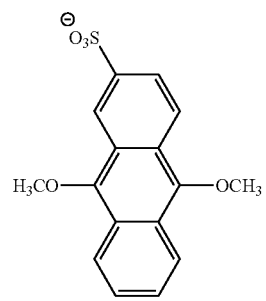
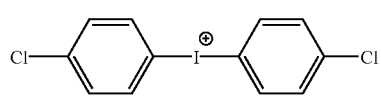
-continued
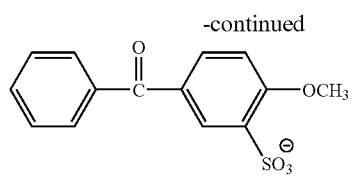
(PAG1-10)
 
(PAG1-11)
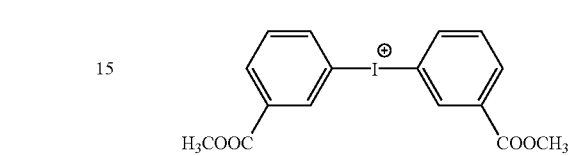 
(PAG1-12)
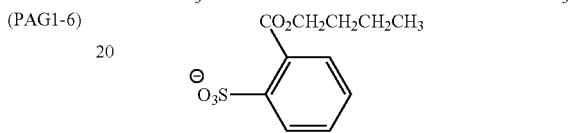 
(PAG1-13)
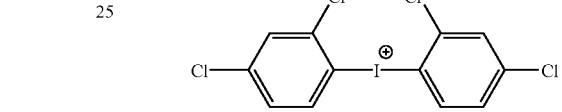
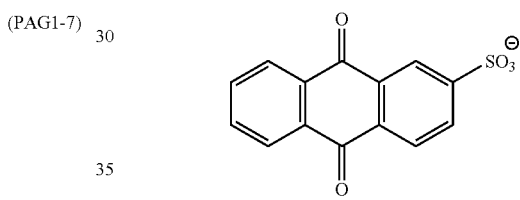 
(PAG1-14)
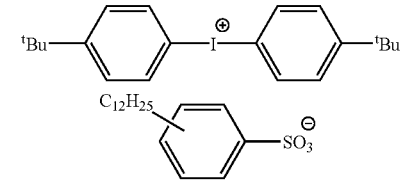 
(PAG1-15)
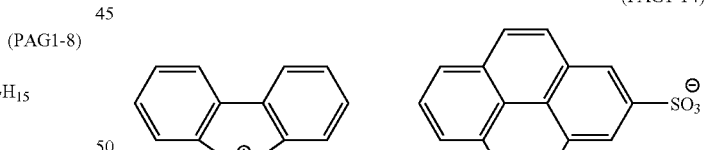
(PAG1-16)
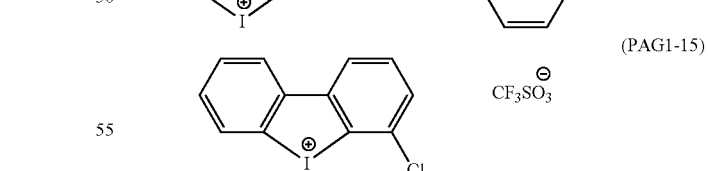
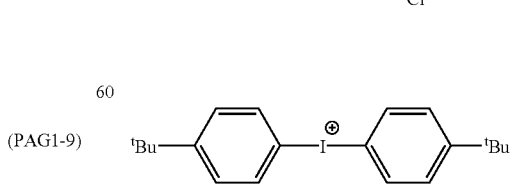 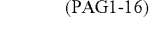
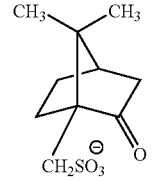

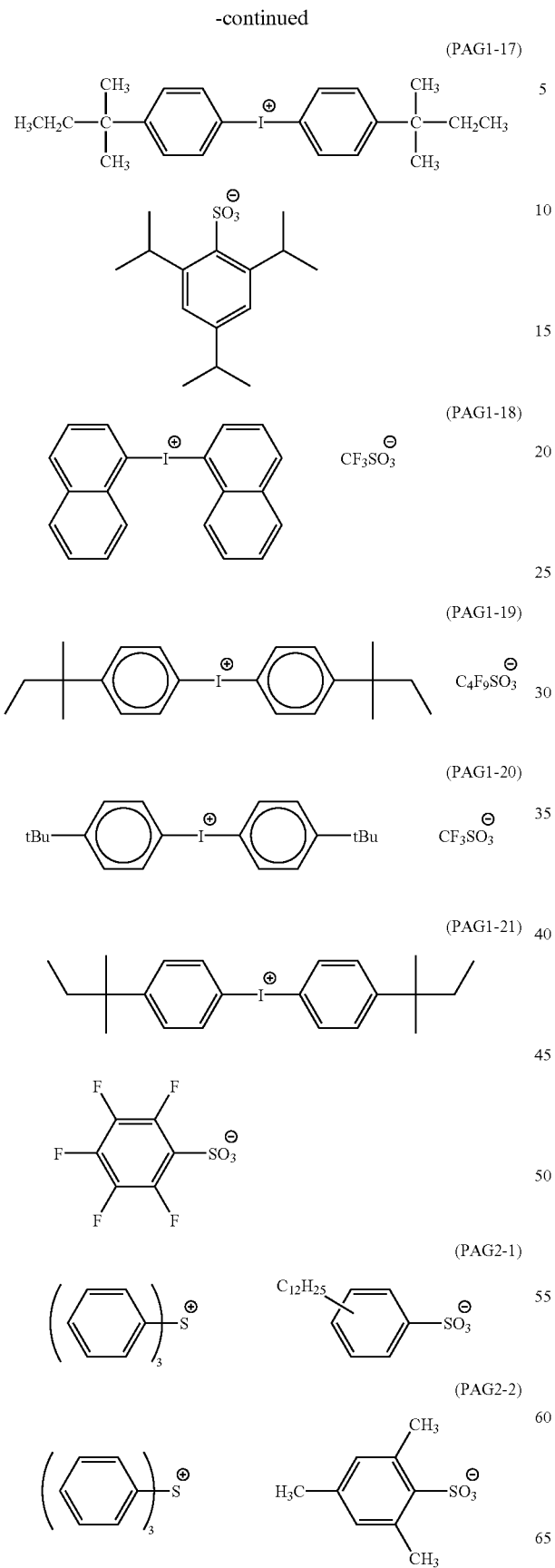
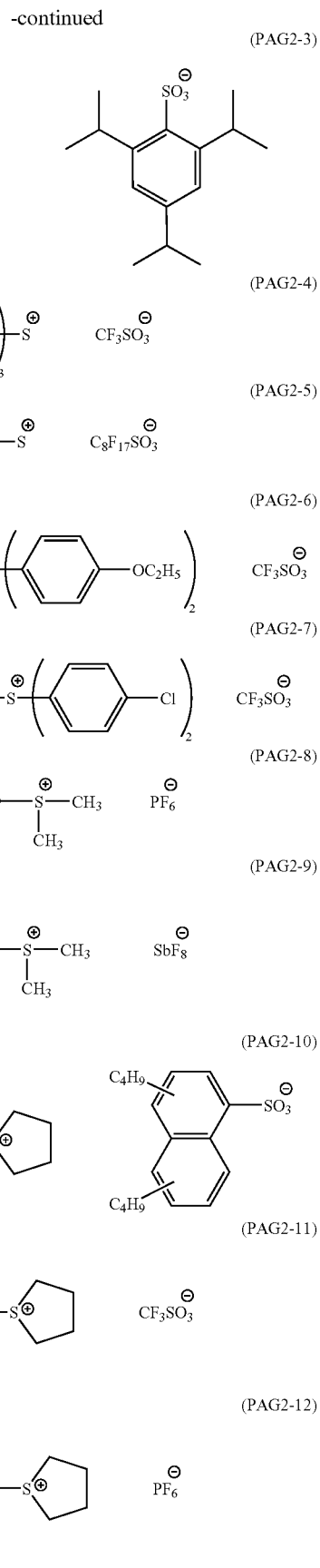

(PAG2-13)
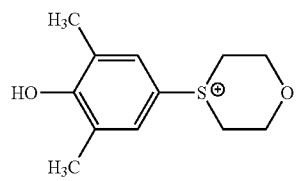 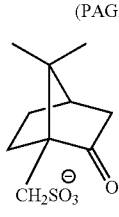
(PAG2-14)
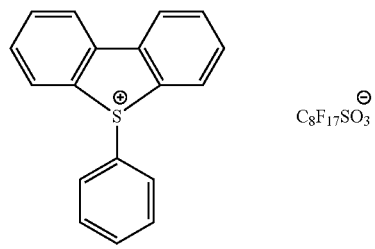 C₈F₁₇SO₃⁻
(PAG2-15)
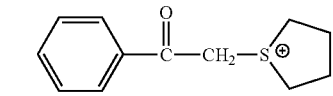 PF₆⁻
(PAG2-16)
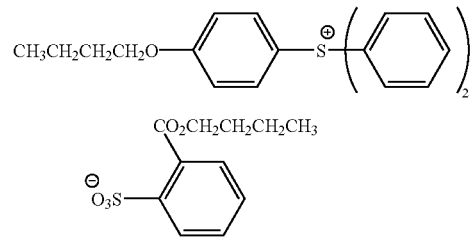
(PAG2-17)
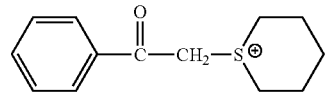 PF₆⁻
(PAG2-18)
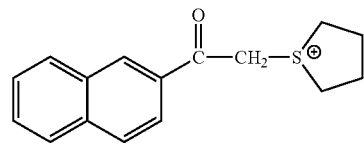 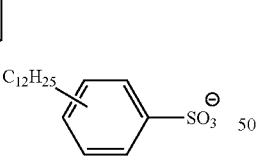
(PAG2-19)
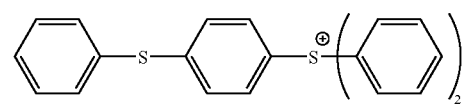 C₈H₁₇SO₃⁻
(PAG2-20)
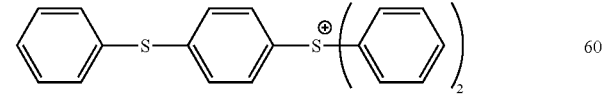
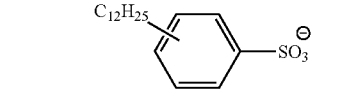
(PAG2-21)
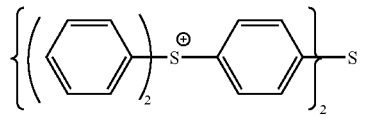 2CF₃SO₃⁻
(PAG2-22)
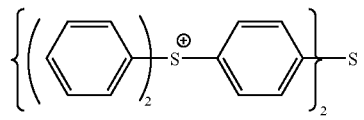
2 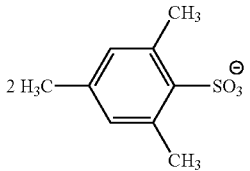
(PAG2-23)
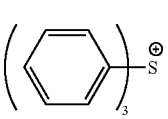 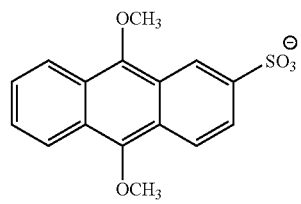
(PAG2-24)
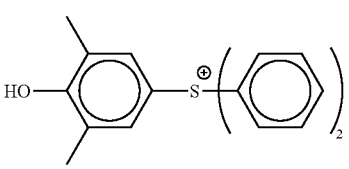 CF₃SO⁻
(PAG2-25)
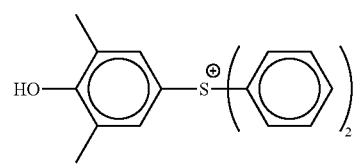 C₄F₉SO⁻
(PAG2-26)
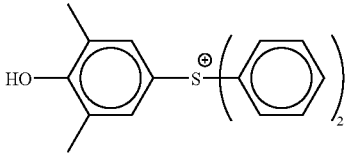
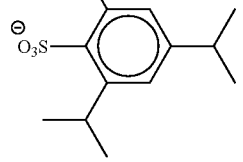
(PAG2-27)
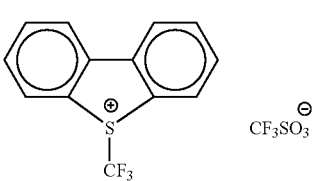 CF₃SO₃⁻

-continued

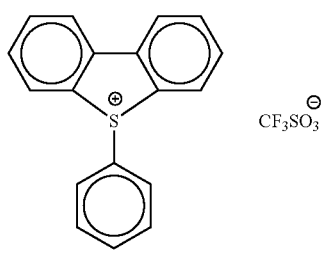
(PAG2-28)

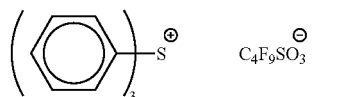
(PAG2-29)
(PAG2-30)
(PAG2-31)
(PAG2-32)
(PAG2-33)
(PAG2-34)
(PAG2-35)

The onium salts represented by formulae (PAG1) and (PAG2) are known and can be synthesized by methods described, for example, in U.S. Pat. Nos. 2,807,648 and 4,247,473 and JP-A-53-101331, (2) Disulfone derivative represented by formula (PAG3) shown below or iminosulfonate derivative represented by formula (PAG4) shown below:

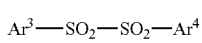
(PAG3)

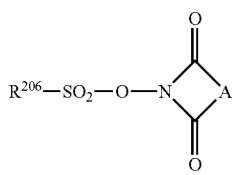
(PAG4)

In formulae (PAG3) and (PAG4), $Ar^3$ and $Ar^4$, which may be the same or different, each independently represent a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Specific examples of such compounds are set forth below, but the present invention should not be construed as being limited thereto.

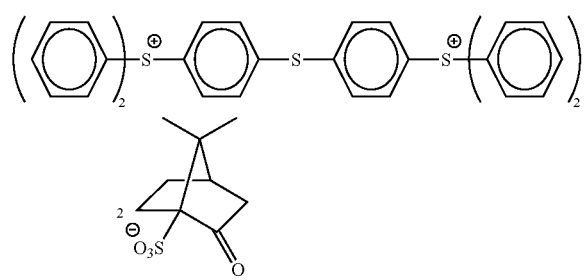
(PAG3-1)
(PAG3-2)
(PAG3-3)
(PAG3-4)
(PAG3-5)

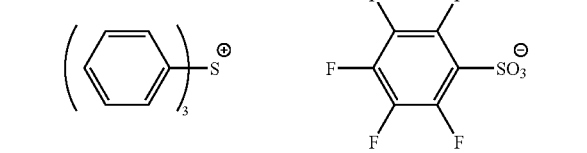

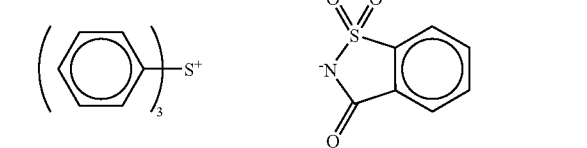
(PAG3-6)

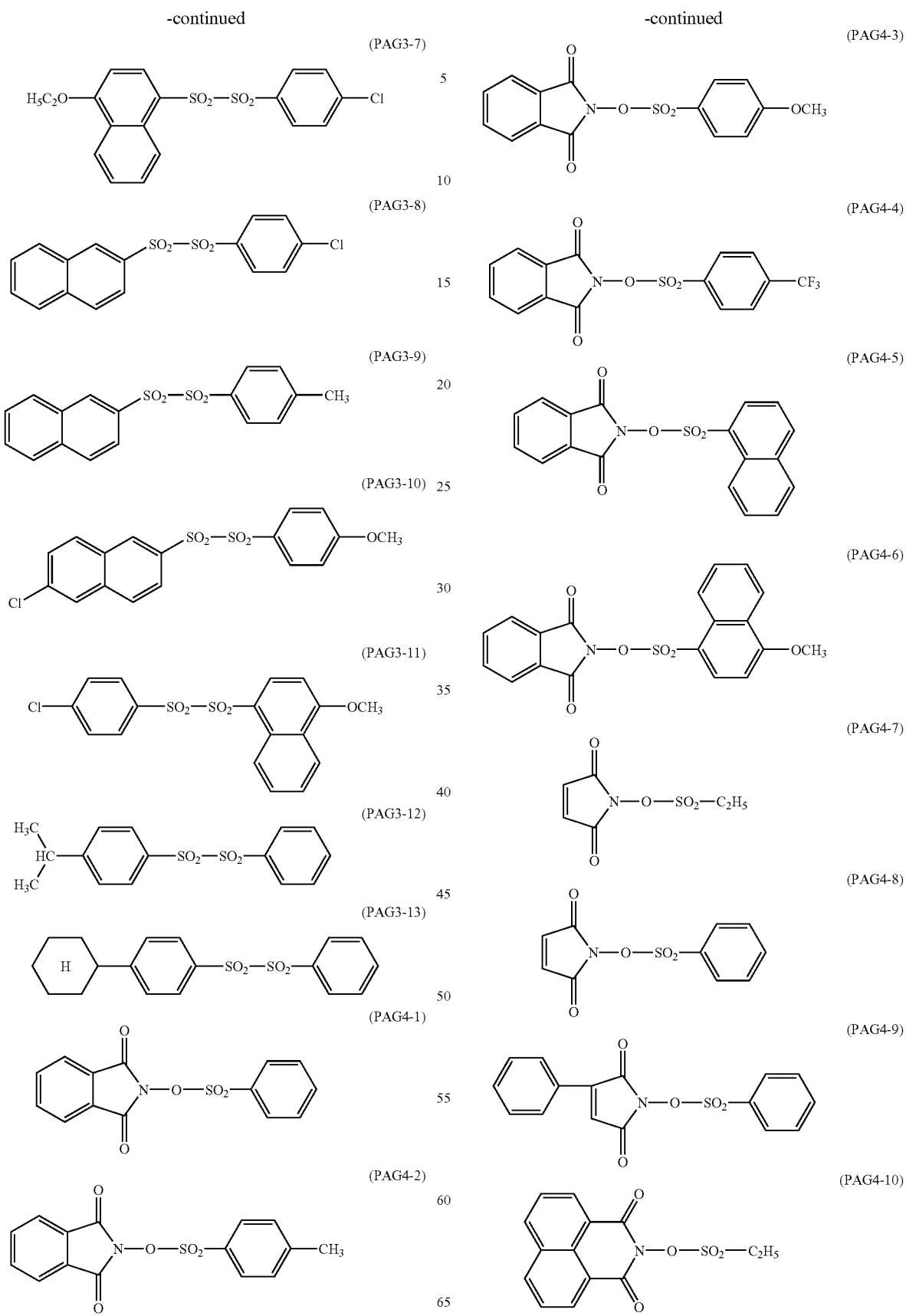

-continued

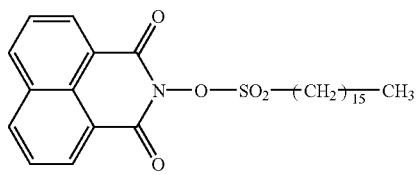
(PAG4-11)

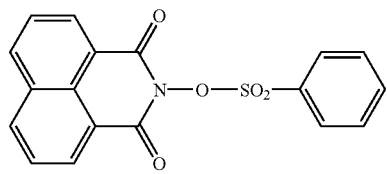
(PAG4-12)

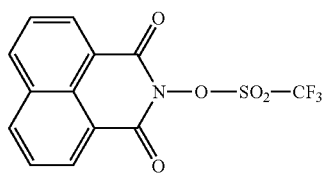
(PAG4-13)

(3) Diazodisulfone derivative represented by formula (PAG5) shown below:

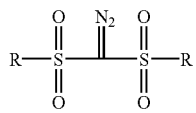
(PAG5)

In formula (PAC5), R represents a straight chain, branched or cyclic alkyl group or a substituted or unsubstituted aryl group.

Specific examples of such compounds are set forth below, but the present invention should not be construed as being limited thereto.

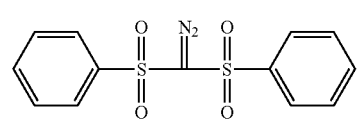
(PAG5-1)

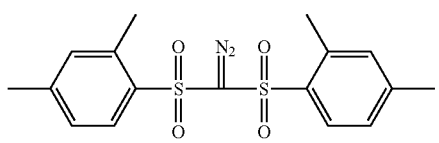
(PAG5-2)

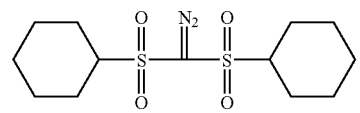
(PAG5-3)

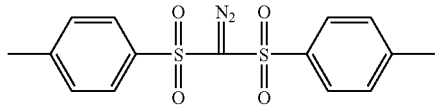
(PAG5-4)

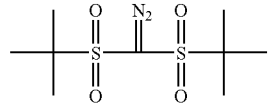
(PAG5-5)

In addition to the compounds described above, a phenacylsulfonium derivative represented by formula (I) shown below is also effectively used as the acid generator of component (A) according to the present invention.

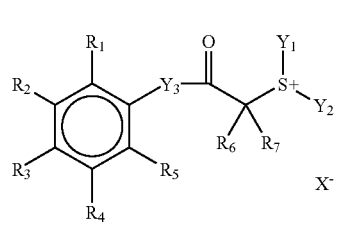
(I)

In formula (I), $R_1$ to $R_5$, which may be the same or different, each represent a hydrogen atom, an alkyl group, an alkoxy group, a nitro group, a halogen atom, an alkoxycarbqnyl group or an aryl group, or at least two of $R_1$ to $R_5$ may be combined with each other to form a ring structure, $R_6$ and $R_7$, which may be the same or different, each represent a hydrogen atom, an alkyl group, a cyano group or an aryl group, $Y_1$ and $Y_2$, which may be the same or different, each represent an alkyl group, an aryl group, an aralkyl group or an aromatic group containing a hetero atom, or $Y_1$ and $Y_2$ may be combined with each other to form a ring, $Y_3$ represents a single bond or a divalent connecting group, $X^-$ represents a non-nucleophilic anion, provided that at least one of $R_1$ to $R_5$ and at least one of $Y_1$ and $Y_2$ are combined with each other to form a ring or at least one of $R_1$ to $R_5$ and at least one of $R_6$ and $R_7$ are combined with each other to form a ring.

Any of $R_1$ to $R_7$ and $Y_1$ to $Y_2$ is bonded through a connecting group to form a compound having two or more structures represented by formula (I).

The alkyl group represented by any one of $R_1$ to $R_7$ is a substituted or unsubstituted alkyl group, and preferably an alkyl group having from 1 to 5 carbon atoms. Examples of the unsubstituted alkyl group include methyl, ethyl, propyl, n-butyl, sec-butyl and tert-butyl groups.

The alkoxy group represented by any one of $R_1$ to $R_5$ or the alkoxy group in the alkoxycarbonyl group represented by any one of $R_1$ to $R_5$ is a substituted or unsubstituted alkoxy group, and preferably an alkoxy group having from 1 to 5 carbon atoms. Examples of the unsubstituted alkoxy group include methoxy, ethoxy, propoxy and butoxy groups The aryl group represented by any one of $R_1$ to $R_7$, $Y_1$ and $Y_2$ is a substituted or unsubstituted aryl group, and preferably an aryl group having from 6 to 14 carbon atoms. Examples of the unsubstituted aryl group include phenyl, tolyl and naphthyl groups.

The halogen atom represented by any one of $R_1$ to $R_3$ includes, for example, fluorine, chlorine, bromine and iodine atoms.

The alkyl group represented by $Y_1$ or $Y_2$ is a substituted or unsubstituted alkyl group, and preferably an alkyl group having from 1 to 30 carbon atoms. Examples of the unsubstituted alkyl group include a straight chain or branched alkyl group, e.g., methyl, ethyl, propyl, n-butyl, sec-butyl or tert-butyl group and a cyclic alkyl group, e.g., cyclopropyl, cyclopentyl, cyclohexyl, adamantly, norbornyl or bornyl group.

The aralkyl group represented by $Y_1$ or $Y_2$ is a substituted or unsubstituted aralkyl group, and preferably an aralkyl group having from 7 to 12 carbon atoms. Examples of the unsubstituted aralkyl group include benzyl, phenethyl and cumyl groups.

The aromatic group containing a hetero atom represented by $Y_1$ or $Y_2$ is an aromatic group, for example, an aryl group having from 6 to 14 carbon atoms, containing a hetero atom, for example, a nitrogen atom, an oxygen atom or a sulfur atom, and includes a substituted or unsubstituted aromatic group containing a hetero atom. Examples of the unsubstituted aromatic group containing a hetero atom include a heterocyclic aromatic hydrocarbon group, e.g., furyl, thienyl, pyrrolyl, pyridyl or indolyl group.

$Y_1$ and $Y_2$ may be combined with each to form a ring other together with $S^+$ in formula (I).

In such a case, the group formed by connecting $Y_1$ and $Y_2$ is an alkylene group having from 4 to 10 carbon atoms, preferably butylene, pentylene or hexylene group, and particularly preferably butylene or pentylene group.

The ring formed by connecting $Y_1$ and $Y_2$ together with $S^+$ in formula (I) may contain a hetero atom.

The alkyl group, alkoxy group, alkoxycarbonyl group, aryl group and aralkyl group may be substituted, for example, with a nitro group, a halogen atom, a carboxy group, a hydroxy group, an amino group, a cyano group or an alkoxy group (preferably an alkoxy group having from 1 to 5 carbon atoms), respectively. The aryl group and aralkyl group may further be substituted with an alkyl group (preferably an alkyl group having from 1 to 5 carbon atoms).

The substituent for the alkyl group is preferably a halogen atom.

$Y_3$ represents a single bond or a divalent connecting group. The divalent connecting group is preferably an alkylene group which may be substituted, an alkenylene group which may be substituted, —O—, —S—, —CO—, —CONR— (wherein R represents a hydrogen atom, an alkyl group or an acyl group) or a connecting group formed by combination of two or more of these groups.

The non-nucleophilic anion represented by $X^-$ includes, for example, a sulfonic acid anion and a carboxylic acid anion.

The non-nucleophilic anion means an anion having an extremely low ability for causing a nucleophilic reaction and an anion capable of controlling decomposition with the lapse of time by an intramolecular nucleophilic reaction. By means of the non-nucleophilic anion, preservation stability of the photosensitive composition is improved.

Examples of the sulfonic acid anion include an alkylsulfonic acid anion, an arylsulfonic acid anion and camphorsulfonic acid anion.

Examples of the carboxylic acid anion include an alkylcarboxylic acid anion, an arylcarboxylic acid anion and an aralkylcarboxylic acid anion.

The alkyl group in the alkylsulfonic acid anion is preferably an alkyl group having from 1 to 30 carbon atoms, for example, methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantly, norbornyl or bornyl group.

The aryl group in the arylsulfonic acid anion is preferably an aryl group having from 6 to 14 carbon atoms, for example, phenyl, tolyl or naphthyl group.

The alkyl group and aryl group in the alkylaulfonic acid anion and arylsulfonic acid anion may have a substituent.

Examples of the substituent include a halogen atom, an alkyl group, an alkoxy group and an alkylthio group.

The halogen atom includes, for example, chlorine, bromine, fluorine or iodine atoms.

The alkyl group (preferably an alkyl group having from 1 to 15 carbon atoms) includes, for example, methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl groups.

The alkoxy group (preferably an alkoxy group having from 1 to 5 carbon atoms) includes, for example, methoxy, ethoxy, propoxy and butoxy groups.

The alkylthio group (preferably an alkylthio group having from 1 to 15 carbon atoms) includes, for example, methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecylthio, hexadecylthio, heptadecylthio, octadecylthio, nonadecylthio and eicosylthio groups.

The alkyl group, alkoxy group and alkylthio group may further be substituted with a halogen atom (preferably a fluorine atom).

The alkyl group in the alkylcarboxylic acid anion is same as that in the alkylsulfonic acid anion.

The aryl group in the arylcarboxylic acid anion is same as that in the arylsulfonic acid anion.

The aralkyl group in the aralkylcarboxylic acid anion is preferably an aralkyl group having from 7 to 12 carbon atoms, for example, benzyl, phenetyl, naphthylmethyl or naththylethyl group.

The alkyl group, aryl group and aralkyl group in the alkylcarboxylic acid anion, arylcarboxylic acid anion and aralkylcarboxylic anion may have a substituent. Examples of the substituent include those described for the arylsulfonic acid anion, for example, a halogen atom, an alkyl group, an alkoxy group or an alkylthio group.

Other examples of the non-nucleophilic anion include phosphorus fluoride, boron fluoride and antimony fluoride.

In the compound represented by formula (I), at least one of $R_1$ to $R_5$ and at least one of $Y_1$ and $Y_2$ are combined with each other to form a ring or at least one of $R_1$ to $R_5$ and at least one of $R_6$ and $R_7$ are combined with each other to form a ring.

By the formation of ring in the compound represented by formula (I), the steric configuration of, compound is fixed and the photolysis efficiency of the compound increases.

Further, any of $R_1$ to $R_7$ and $Y_1$ to $Y_2$ is bonded through a connecting group to form a compound having two or more structures represented by formula (I).

Of the compounds represented by formula (I), those represented by formulae (IA) and (IB) described above are preferred.

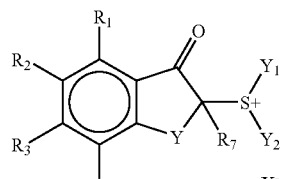
(IA)

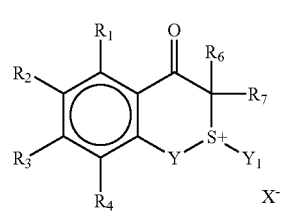
(IB)

In formula (IA), $R_1$ to $R_4$, $R_7$, $Y_1$, $Y_2$ and $X^-$ have the same meanings as defined in formula (I) respectively, and Y represents a single bond or a divalent connecting group.

In formula (IB), $R_1$ to $R_4$, $R_6$, $R_7$, $Y_1$, and $X^-$ have the same meanings as defined in formula (I) respectively, and Y represents a single bond or a divalent connecting group.

Y represents a single bond or a divalent connecting group. The divalent connecting group is preferably an alkylene group which may be substituted, an alkenylene group which may be substituted, —O—, —S—, —CO—, —CONR— (wherein R represents a hydrogen atom, an alkyl group or an acyl group) or a Connecting group formed by combination of two or more of these groups.

In formula (IA), Y preferably represents an alkylene group, an alkylene group containing an oxygen atom or an alkylene group containing a sulfur atom, for example, an ethylene group, a propylene group, —CH$_2$—O— or —CH$_2$—S—, and most preferably represents a connecting group for forming a 6-membered ring, for example, an ethylene group, —CH$_{13}$—O— or —CH$_2$—S—. By the formation of 6-membered ring in the compound, an angle between the carbonyl plane and the C—S$^+$ sigma bond comes up to perpendicularity, and due to the orbital interaction the photolysis efficiency of the compound increases.

The compound represented by formula (IA) can be obtained by a method of reacting a corresponding α-halo cyclic ketone with a sulfide compound or a method of converting a corresponding cyclic ketone to a silyl enol ether and reacting the latter with sulfoxide. The compound represented by formula (IB) can be obtained by a method of reacting an aryl alkyl sulfide with an α- or β-halogenated halide.

Specific examples of the compound represented by formula (I) are set forth below, but the present invention should not be construed as being limited thereto.

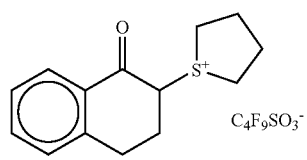
(IA-1)

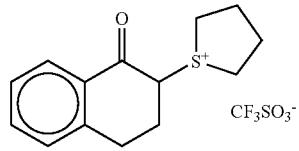
(IA-2)

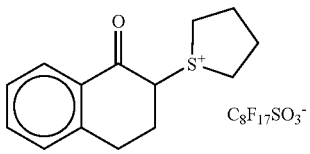
(IA-3)

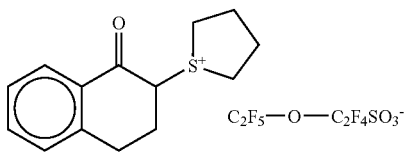
(IA-4)

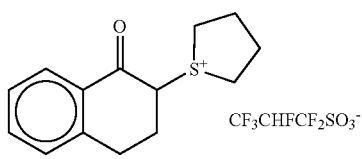
(IA-5)

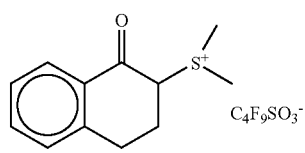
(IA-6)

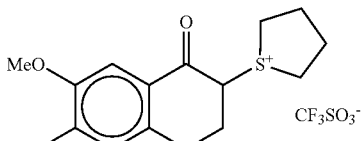
(IA-7)

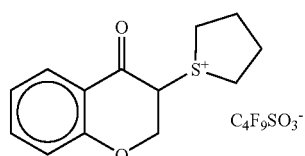
(IA-8)

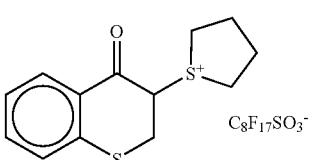
(IA-9)

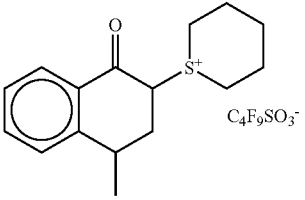
(IA-10)

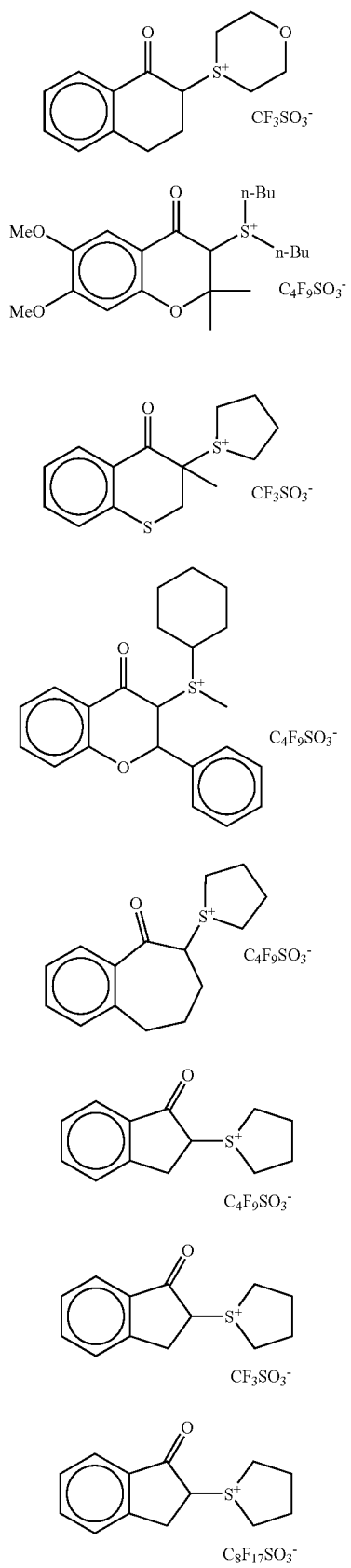
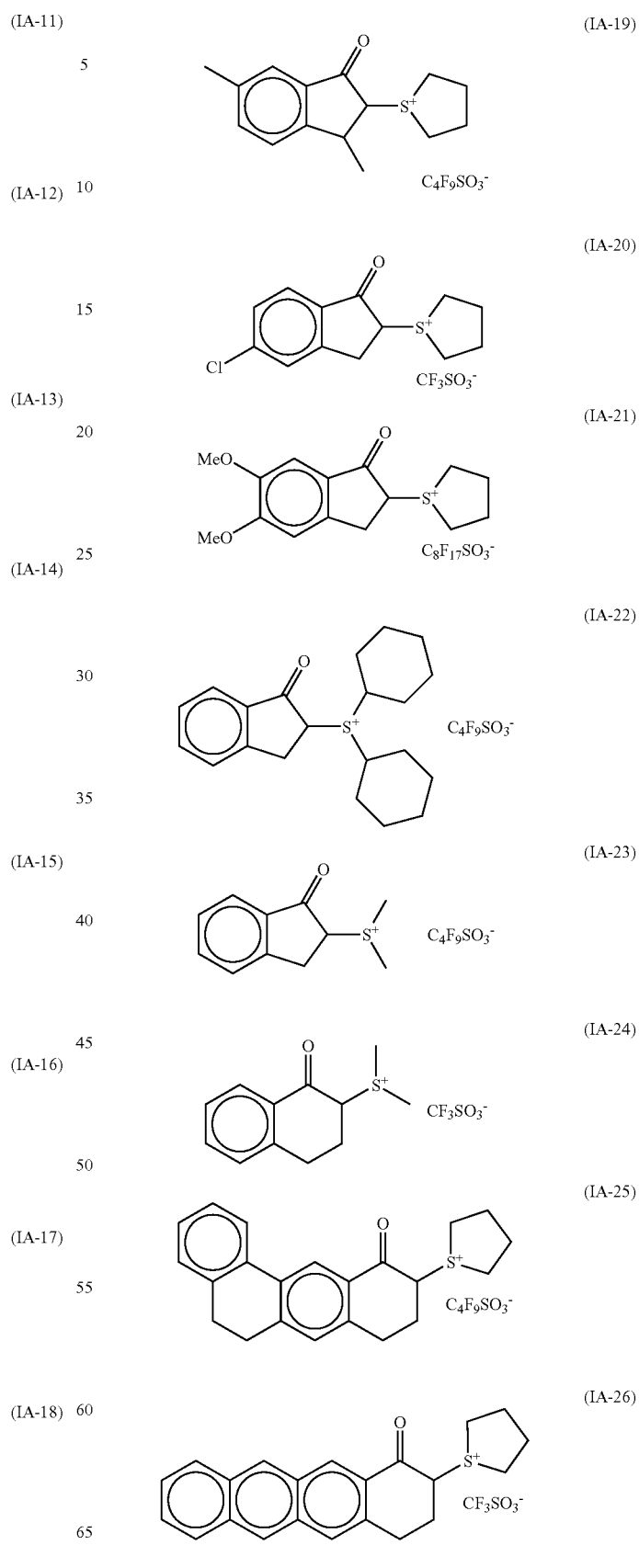

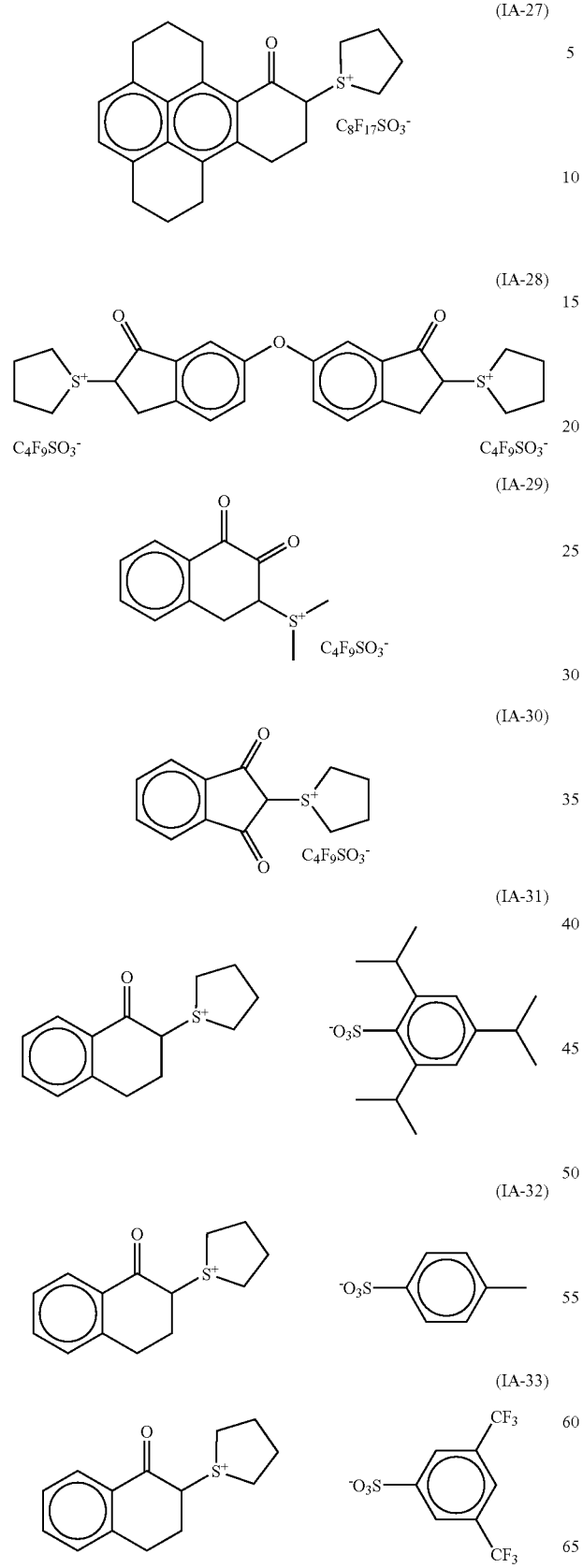

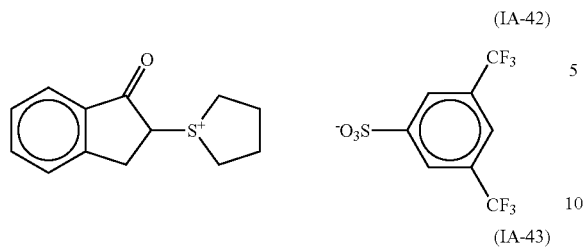
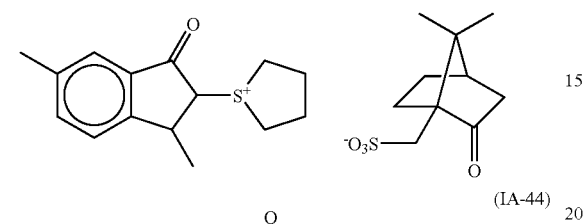
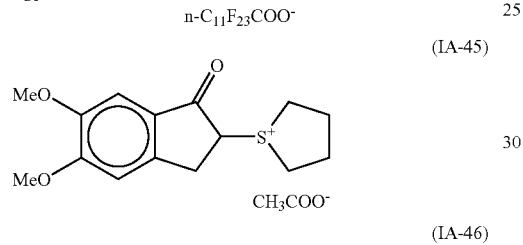
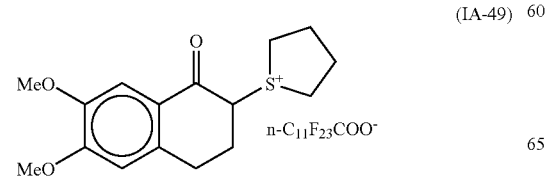
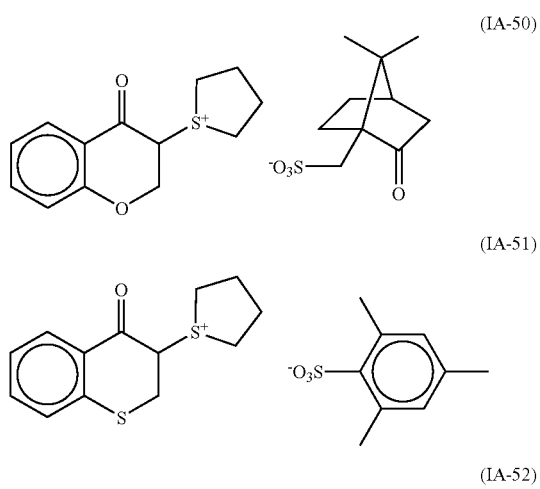

-continued
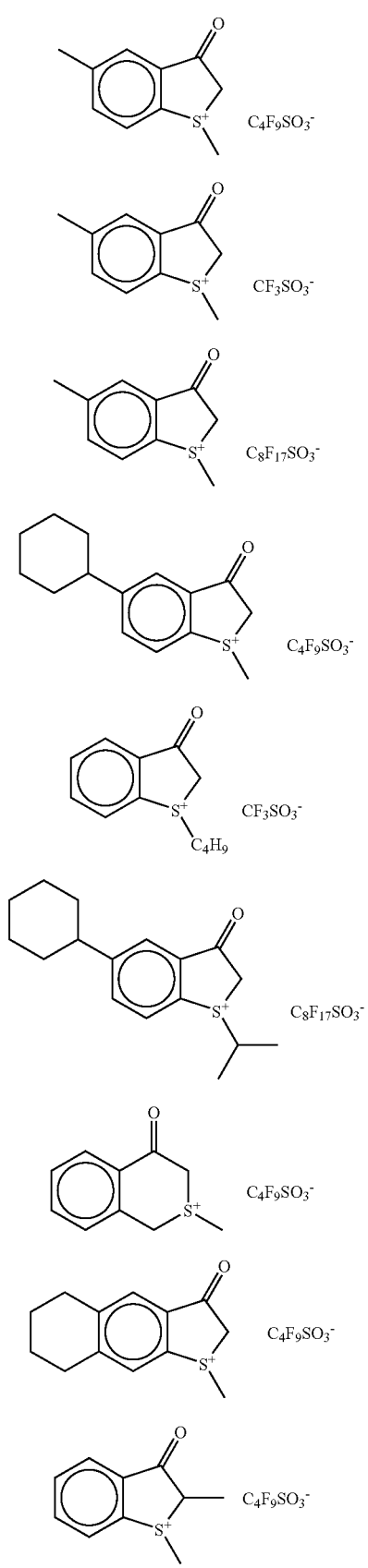
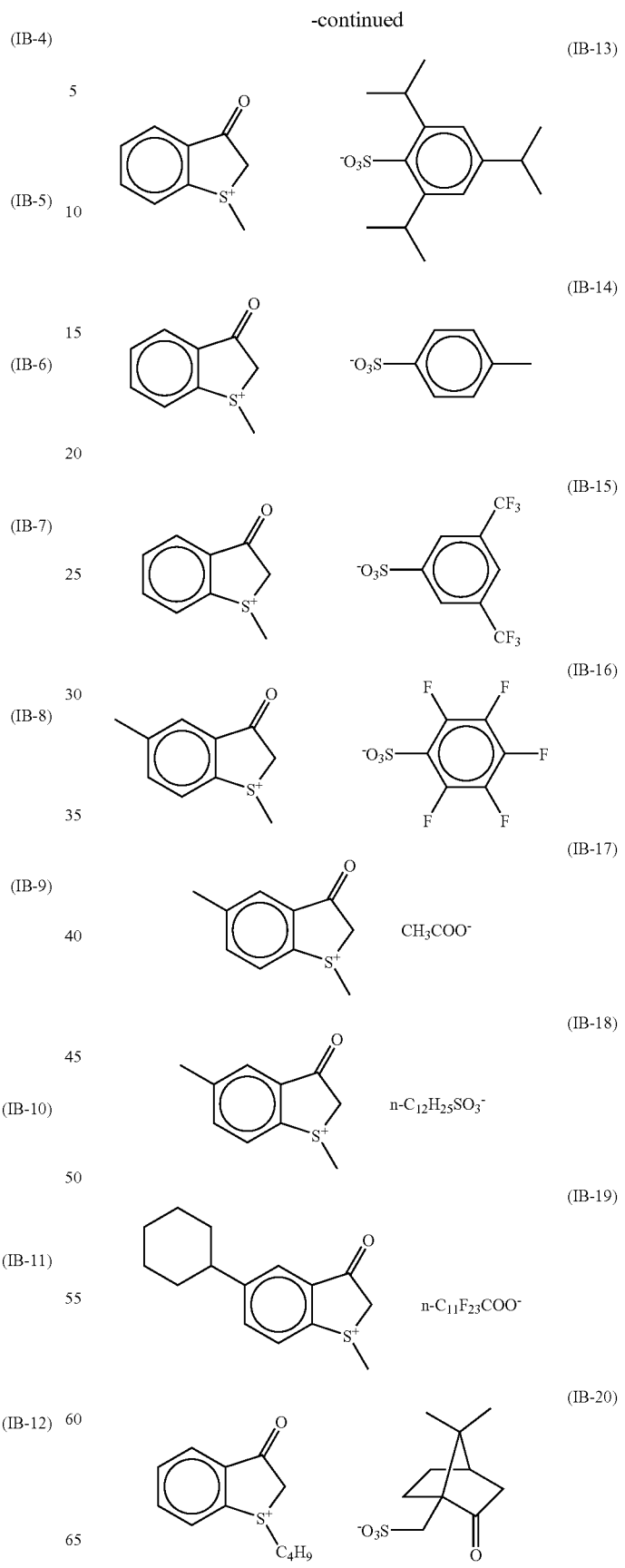

-continued (IB-21) 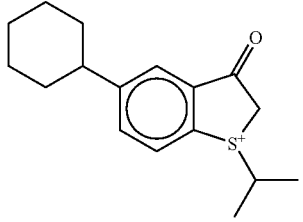 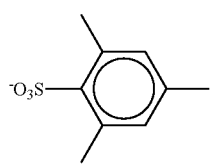

(IB-22) 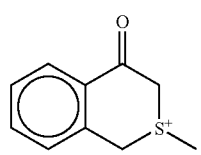 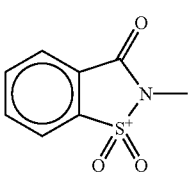 (IB-23)

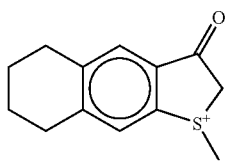 CH₃(CH₂)₇COO⁻

-continued (IB-24) 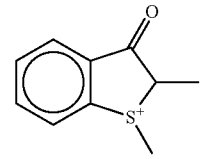 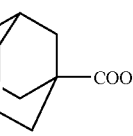

Of specific examples of the acid photo-generator represented by formula (I) described above, Compounds (IA-1) to (IA-30) and (IB-1) to (IB-12) are more preferred.

The compounds represented by formula (I) may be used individually or in combination of two or more thereof.

The content of the compound of component (A) is preferably from 0.1 to 20% by weight, more preferably from 0.5 to 10% by weight, and still more preferably from 1 to 7% by weight, based on the solid content of the positive photosensitive composition of the present invention.

Of the compounds decomposing upon irradiation of an actinic ray or radiation to generate an acid of component (A) for use in the present invention, those particularly preferred are set forth below.

(z1) 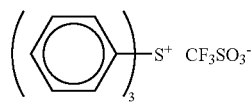

(z2) 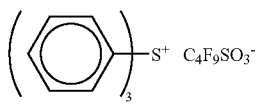

(z3) 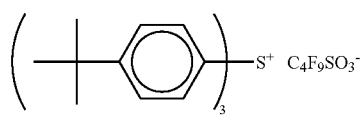

(z4) 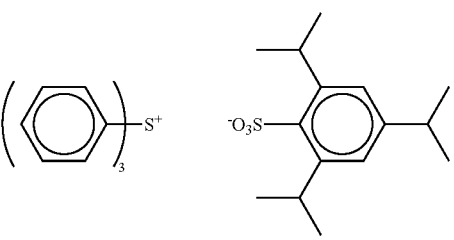

(z5) 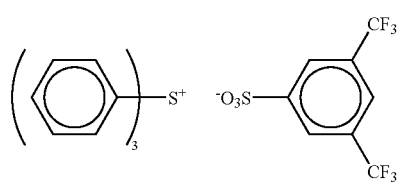

(z6) 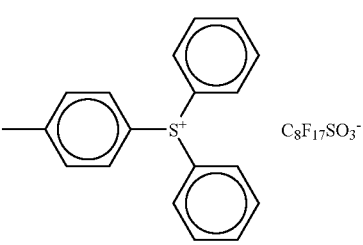

(z7) 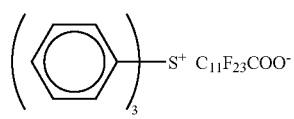

(z8) 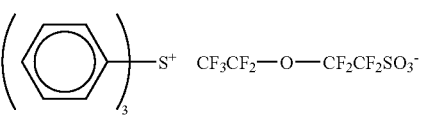

-continued
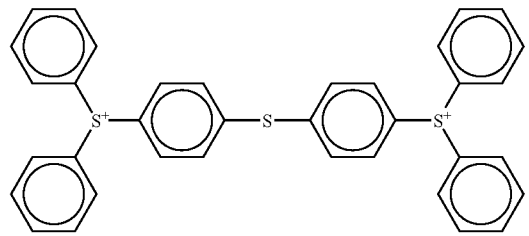 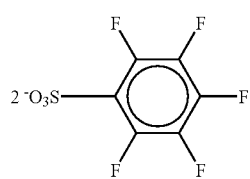
(z9)
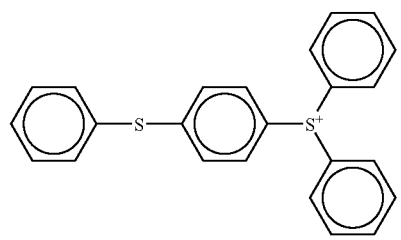 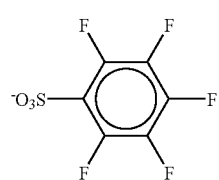
(z10)
(z11) (z12)
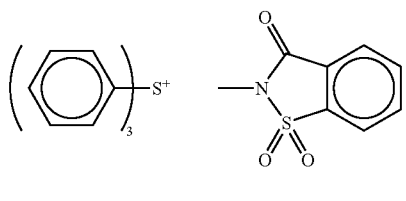 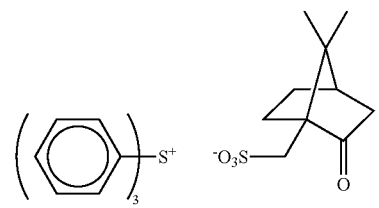
(z13) (z14)
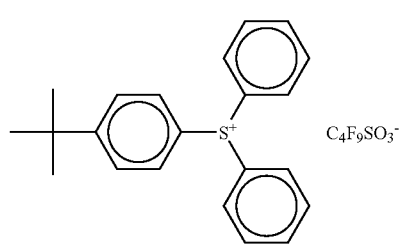 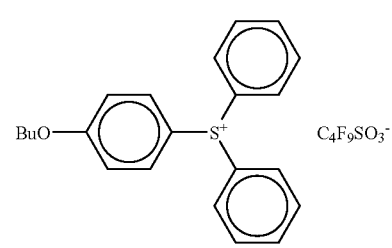
(z15) (z16)
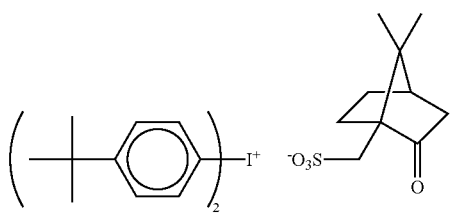 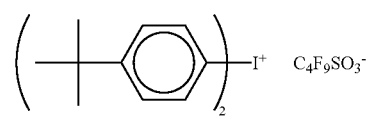
(z17) (z18)
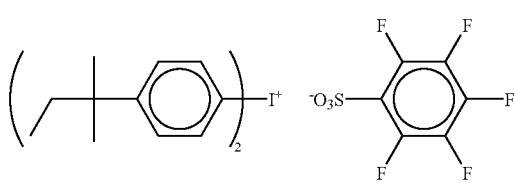 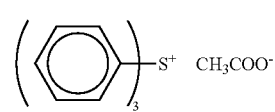
(z19) (z20)
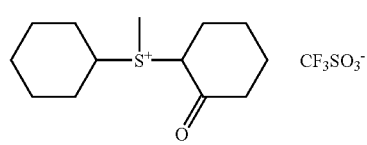 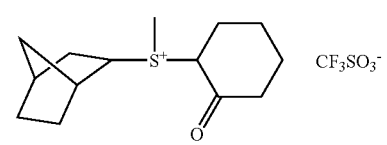

-continued
(z21) 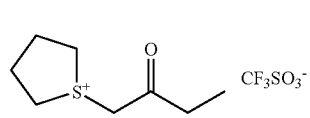
(z22) 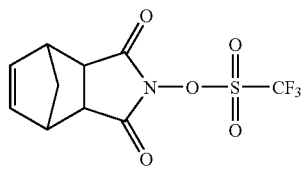
(z23) 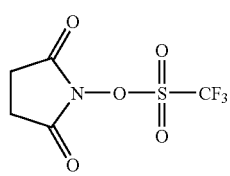
(z24) 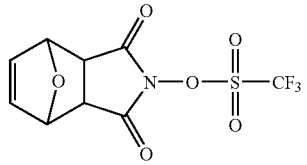
(z25) 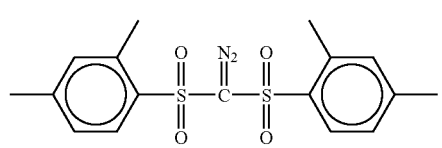
(z26) 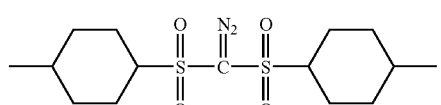
(z27) 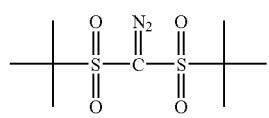
(z28) 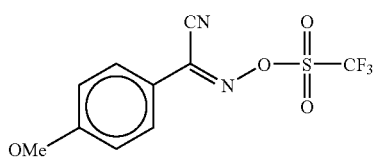
(z29) 
(z30) 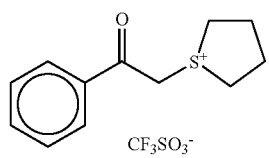
(z31) 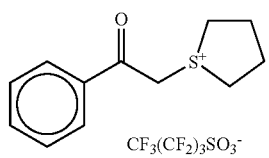
(z32) 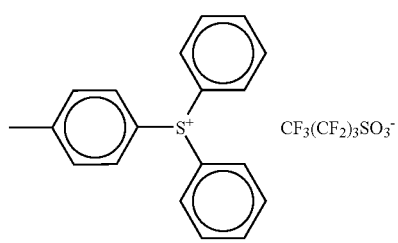
(z33) 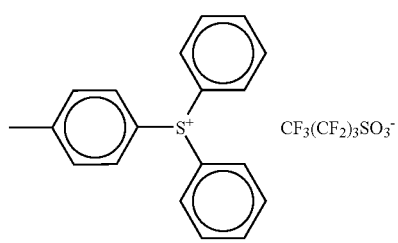
(z34) 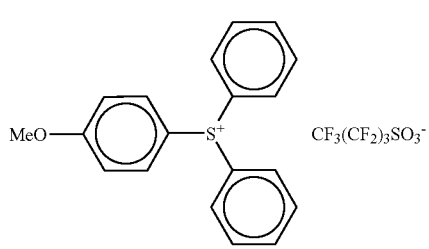
(z35) 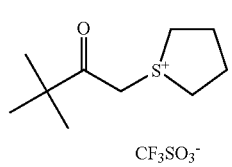

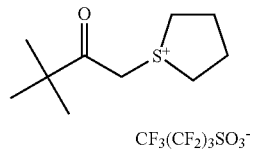
(z36)

CF$_3$(CF$_2$)$_3$SO$_3^-$

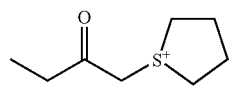
(z38)

CF$_3$(CF$_2$)$_3$SO$_3^-$

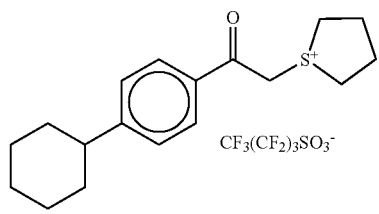

CF$_3$(CF$_2$)$_3$SO$_3^-$

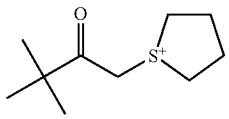
-continued
(z37)

CF$_3$(CF$_2$)$_7$SO$_3^-$

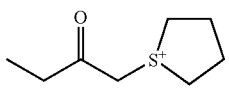
(z39)

CF$_3$(CF$_2$)$_7$SO$_3^-$ (z40)

<<(B) Resin Increasing Solubility in an Alkali Developing Solution by the Action of an Acid (Hereinafter, also Referred to as an "Acid-decomposable Resin")>>

Any resin that has a monocyclic or polycyclic alicyclic hydrocarbon structure and is decomposed by the action of an acid to increase solubility in an alkali developing solution can be used as the acid-decomposable resin of component (B). Preferred examples of the resin of component (B) include resins containing at least one repeating unit selected from a repeating unit having a partial structure including an alicyclic hydrocarbon represented by formula (pI), (pII), (pIII), (pIV), (pV) or (pVI) described below and a repeating unit represented by formula (II-AB) described below,

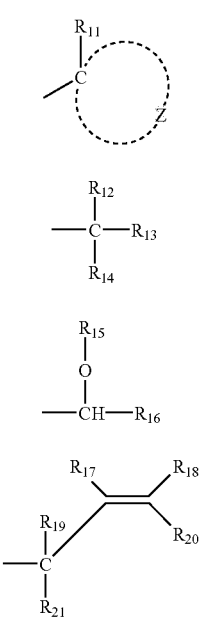

(pI)

(pII)

(pIII)

(pIV)

-continued

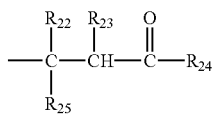
(pV)

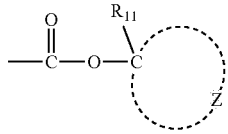
(pVI)

In the above formulae, $R_{11}$ represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

$R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group.

$R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group.

$R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group, provided that at least one of $R_{22}$ to $R_{25}$ represents an alicyclic hydrocarbon group. Alternatively, $R_{23}$ and $R_{24}$ may be combined with each other to form a ring.

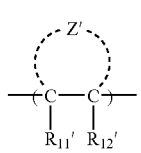
(II-AB)

In formula (II-AB), $R_{11}'$ and $R_{12}'$, which may be the same or different, each independently represent a hydrogen atom, a cyano group, a halogen atom or an alkyl group which may have a substituent.

Z' represents an atomic group necessary for forming an alicyclic structure, which may be substituted, together with the connected two carbon atoms (C—C).

Of the repeating units represented by formula (II-AB), those represented by formulae (II-A) and (II-B) shown below are more preferred.

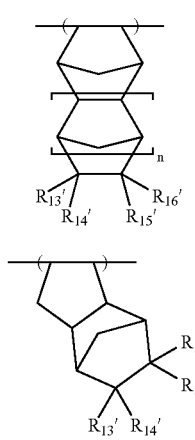
(II-A)

(II-B)

In formulae (II-A) and (II-B), $R_{13}'$ to $R_{16}'$, which may be the same or different, each independently represents a hydrogen atom, a halogen atom, a cyano group, —COCH, —COOR$_5$, a group capable of decomposing by the action of acid, —C (=O)—X-A'-R$_{17}'$, an alkyl group which may have a substituent or a cyclic hydrocarbon group which may have a substituent.

$R_5$ represents an alkyl group which may have a substituent, a cyclic hydrocarbon group which may have a substituent or a group represented by Y.

X represents an oxygen atom, a sulfur atom, —NH—, —NHSO$_2$— or —NHSO$_2$NH—.

A' represents a single bond or a divalent linkage group.

Alternatively, at least two of $R_{13}'$ to $R_{16}'$ may be combined with each other to form a ring. n represents 0 or 1.

$R_{17}'$ represents —COOH, —COOR$_5$, —CN, a hydroxy group, an alkoxy group which may have a substituent, —CO—NH—R$_6$, —CO—NH—SO$_2$—R$_6$ or a group represented by Y. $R_6$ represents an alkyl group which may have a substituent or a cyclic hydrocarbon group which may have a substituent, The group represented by Y has the following structure:

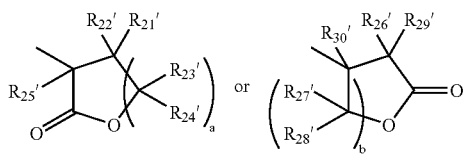

wherein $R_{21}''$ to $R_{30}'$, which may be the same or different, each independently represents a hydrogen atom or an alkyl group which may have a substituent, and a and b each represent 1 or 2.

In formulae (pI) to (pVI), the alkyl group for $R_{12}$ to $R_{25}$ includes a straight chain or branched alkyl group having from 1 to 9 carbon atoms, which may be substituted. Examples of the alkyl group include methyl, ethyl, n-propyl, isopropyl, n-butyl, isobutyl, sec-butyl and tert-butyl groups.

Examples of the substituent for the alkyl group include an alkoxy group having from 1 to 4 carbon atoms, a halogen atom (e.g., fluorine, chlorine, bromine or iodine atom), an acyl group, an acyloxy group, a cyano group, a hydroxy group, a carboxy group, an alkoxycarbonyl group and a nitro group.

The alicyclic hydrocarbon group in $R_{11}$ to $R_{25}$ or the alicyclic hydrocarbon group formed by Z and the carbon atoms may be a monocyclic group or a polycyclic group, and includes specifically a group having not less than 5 carbon atoms and including, for example, a monocycle, bicyclo, tricyclo or tetracyclo structure. The number of carbon atoms included is preferably from 6 to 30, and more preferably from 7 to 25. The alicyclic hydrocarbon group may have a substituent.

Examples of the structure of alicyclic portion in the alicyclic hydrocarbon group are set forth below.

(1)

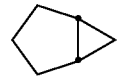
(2)

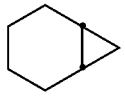
(3)

(4)

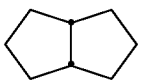
(5)

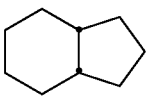
(6)

-continued
(7)
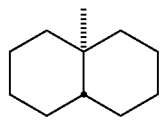
(8)
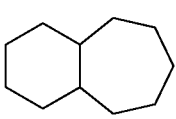
(9)
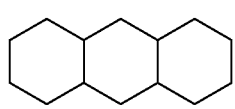
(10)
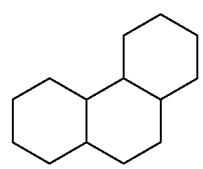
(11)
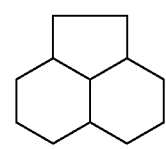
(12)
(13)
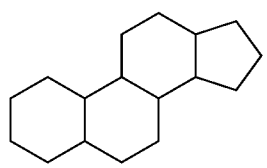
(14)
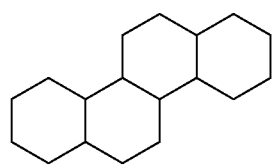
(15)
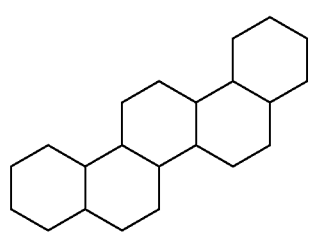
(16)
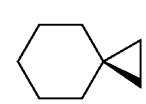
(17)
-continued
(18)
(19)
(20)
(21)
(22)
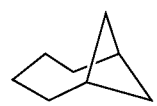
(23)
(24)
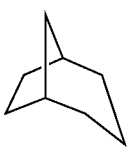
(25)
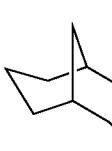
(26)
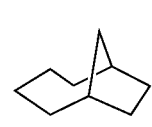
(27)
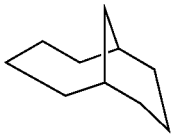
(28)
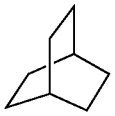
(29)
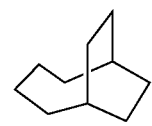

-continued

(30) 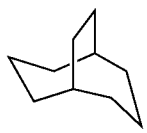

(31) 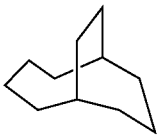

(32) 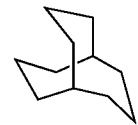

(33) 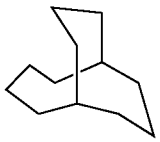

(34) 

(35) 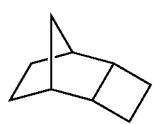

(36) 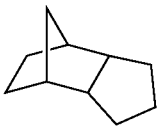

(37) 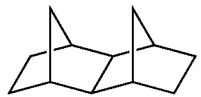

(38) 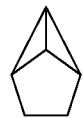

(39) 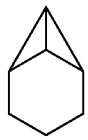

(40) 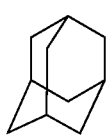

-continued

(41) 

(42) 

(43) 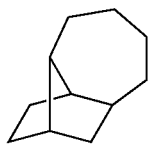

(44) 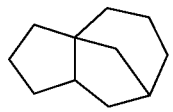

(45) 

(46) 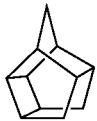

(47) 

(48) 

(49) 

(50) 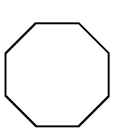

Preferred examples of the alicyclic portion for use in the present invention include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Of these groups, an adamantyl group, a decalin residue, a norbornyl group, a cedrol group, a cyclohexyl group, a cycloheptyl group, a cyclooctyl group, a cyclodecanyl group and a cyolododecanyl group are more preferred.

Examples of the substituent for the alicyclic hydrocarbon group include an alkyl group, a substituted alkyl group, a halogen atom, a hydroxy group, an alkoxy group, a carboxy group and an alkoxycarbonyl group. The alkyl group is preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group.

The structure represented by any one of formulae (pI) to (pVI) in the resin can be used for protecting an alkali-soluble group. The alkali-soluble group includes various groups known in the field of art.

Specific examples of the alkali-soluble group include a carboxylic acid group, a sulfonic acid group, a phenol group and a thiol group, and a carboxylic acid group and a sulfonic acid group are preferably used.

The alkali-soluble group protected by the structure represented by anyone of formulae (pI) to (pVI) in the resin preferably includes groups represented by the following formulae (pVII) to (pXI):

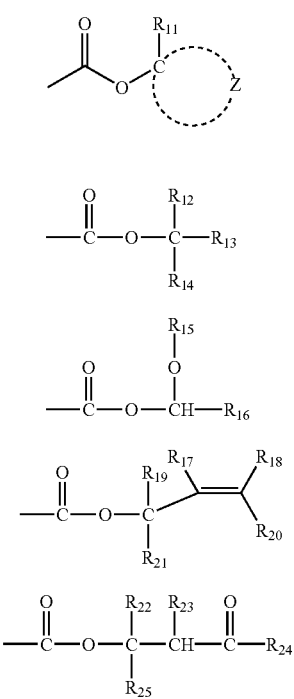

In the above formulae, $R_1$, to $R_{25}$ and Z has the same meanings as defined above, respectively.

A repeating unit having the alkali-soluble group protected by the structure represented by any one of formulae (pI) to (pVI) in the resin is preferably represented by the following formula (pA):

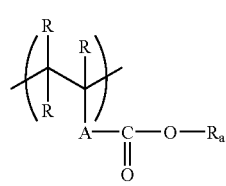

In the formula, R's, which may be the same or different, each represent a hydrogen atom, a halogen atom or a straight chain or branched alkyl group having from 1 to 9 carbon atoms, which may be substituted.

A represents a single bond, an alkylene group, a substituted alkylene group, an ether group, a thioether group, a carbonyl group, an ester group, an amido group, a sulfonamido group, a urethane group, a urea group or a combination of two or more thereof.

$R_a$ represents any one of the groups represented by formulae (pI) to (pVI).

Specific examples of the monomer corresponding to the repeating unit represented by formula (pA) are set forth below, but the present invention should not be construed as being limited thereto.

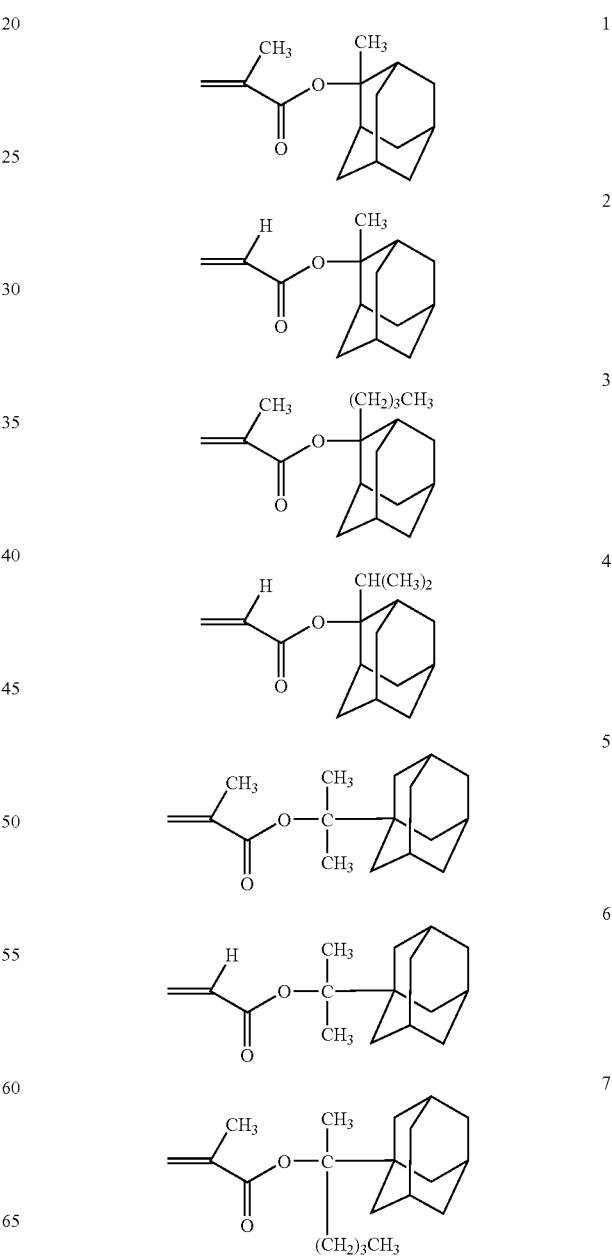

-continued
8
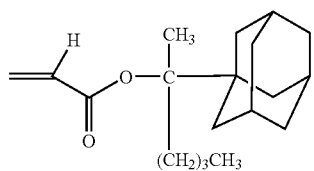
9
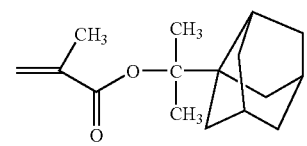
10
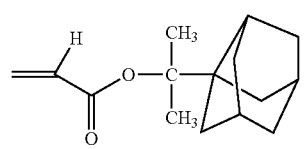
11
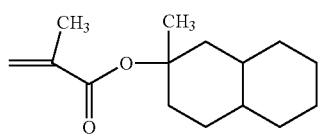
12
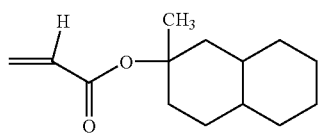
13
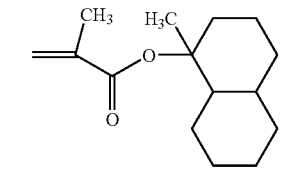
14
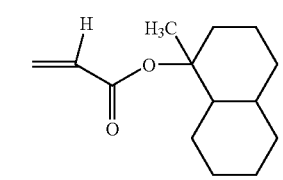
15
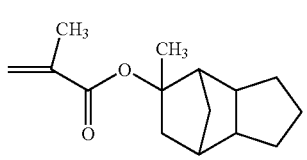
16
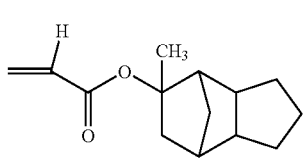
17
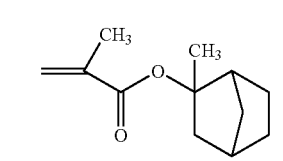
-continued
18
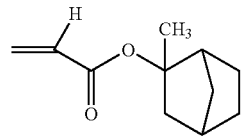
19
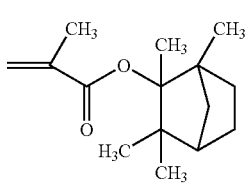
20
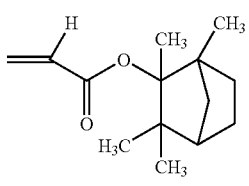
21
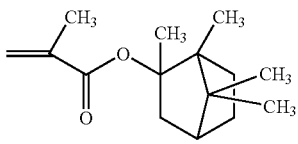
22
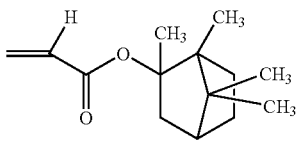
23
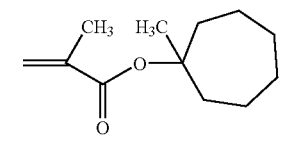
24
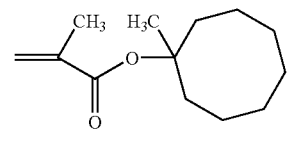
25
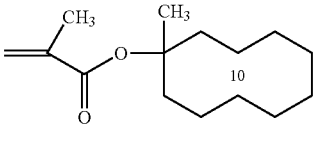
26
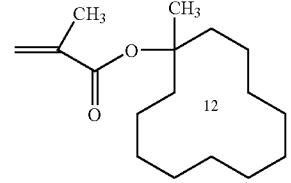

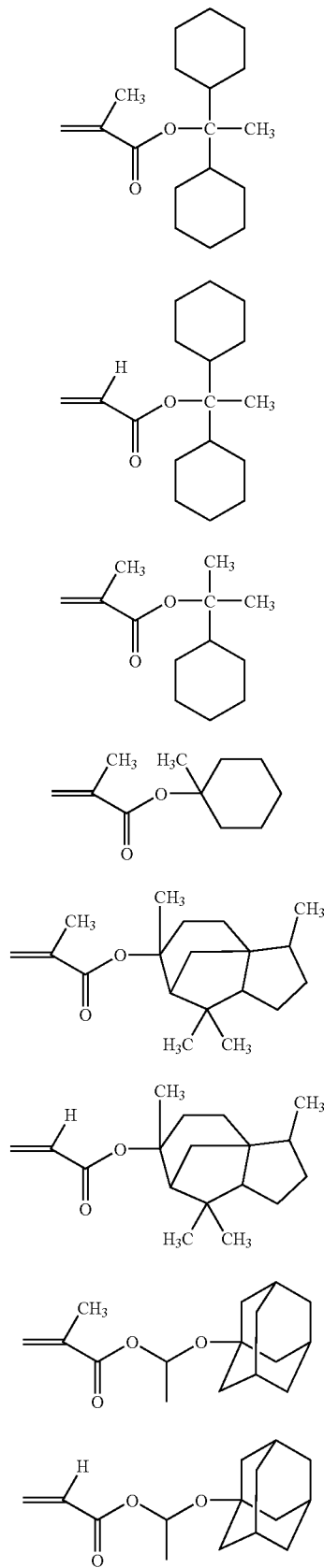
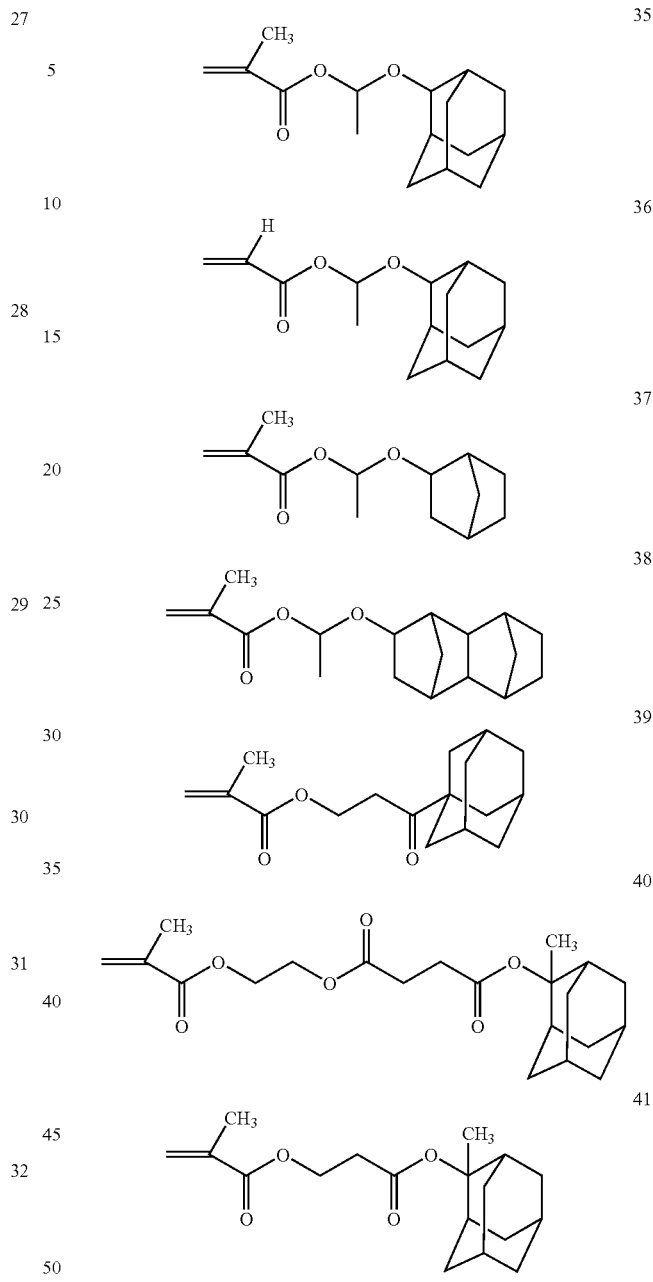

In formula (II-AB), $R_{11}'$, and $R_{12}'$, which may be the same or different, each independently represent a hydrogen atom, a cyano group, a halogen atom or an alkyl group which may have a substituent.

Z' represents an atomic group necessary for forming an alicyclic structure, which may be substituted, together with the connected two carbon atoms (C—C).

The halogen atom for $R_{11}'$ or $R_{12}'$ includes, for example, chlorine, bromine, fluorine and iodine atoms.

The alkyl group for each of $R_{11}'$, $R_{12}'$ and $R_{21}'$ to $R_{30}'$ includes preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl and tert-butyl groups.

Examples of the substituent for the alkyl group include a hydroxy group, a halogen atom, a carboxy group, an alkoxy group, an acyl group, a cyano group and an acyloxy group. The halogen atom includes chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl or acetyl group. The acyloxy group includes, for example, an acetoxy group.

The atomic group necessary for forming an alicyclic structure represented by Z' is an atomic group necessary for forming a repeating unit of alicyclic hydrocarbon moiety, which may be substituted In particular, an atomic group necessary for forming a bridged alicyclic structure, by which a repeating unit of the bridged alicyclic hydrocarbon is completed, is preferred.

The skeleton of the bridged alicyclic ho formed includes those described below.

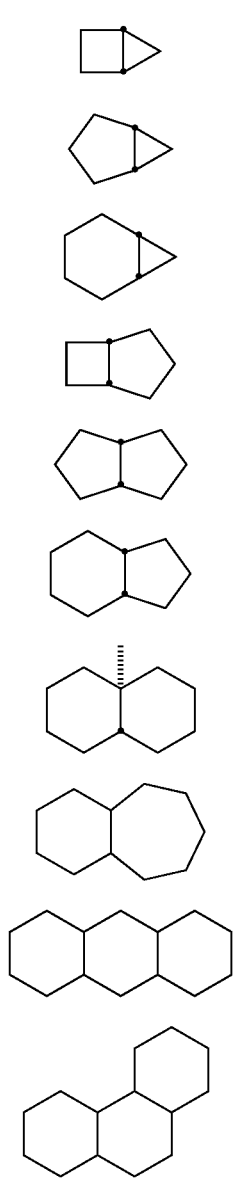

-continued

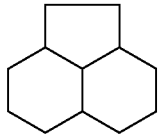

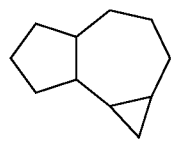

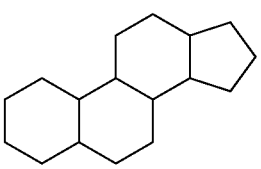

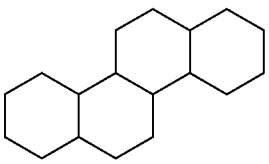

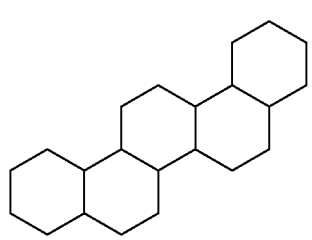

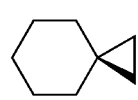

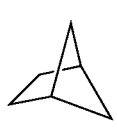

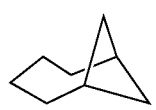 (22)
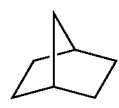 (23)
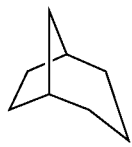 (24)
 (25)
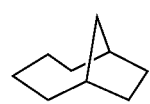 (26)
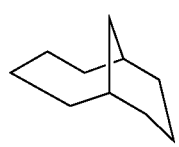 (27)
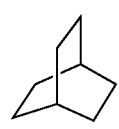 (28)
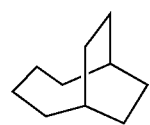 (29)
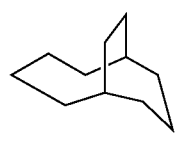 (30)
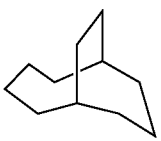 (31)
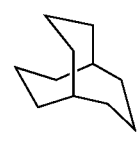 (32)
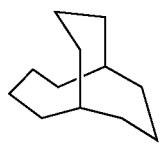 (33)
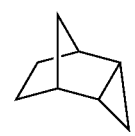 (34)
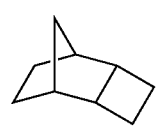 (35)
 (36)
 (37)
 (38)
 (39)
 (40)
 (41)
 (42)
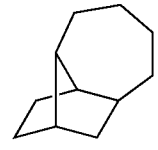 (43)

-continued

(44)
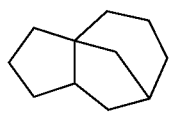

(45)

(46)

(47)
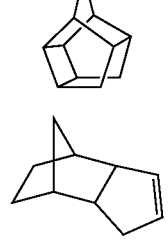

Of the skeletons of the bridged alicyclic hydrocarbon described above, (5), (6), (7), (9), (10), (13), (14), (15), (23), (28), (36), (37), (42) and (47) are preferred.

The skeleton of the alicyclic hydrocarbon may have a substituent. Examples of the substituent include the atoms and groups represented by $R_{13}'$ to $R_{16}'$ in formula (II-A) or (II-B).

Of the repeating units containing the bridged alicyclic hydrocarbon, those represented by formulae (II-A) and (II-B) described above are more preferred.

In formulae (II-A) and (II-B), $R_{13}'$ to $R_{16}'$, which may be the same or different, each independently represents a hydrogen atom, a halogen atom, a cyano group, —COOH, —COR$_5$, a group capable of decomposing by the action of acid, —C(=O)—X-A'-R$_{17}'$ an alkyl group which may have a substituent or a cyclic hydrocarbon group which may have a substituent.

$R_5$ represents an alkyl group which may have a substituent, a cyclic hydrocarbon group which may have a substituent or a group represented by Y.

X represents an oxygen atom, a sulfur atom, —NH—, —NHSO$_2$— or —NHSO$_2$NH—.

A' represents a single bond or a divalent linkage group.

Alternatively, at least two of $R_{13}'$ to $R_{16}'$ may be combined with each other to form a ring. n represents 0 or 1.

$R_{17}'$ represents —COOH, —COOR$_5$, —CN, a hydroxy group, an alkoxy group which may have a substituent, —CO—NH—R$_6$, —CO—NH—SO$_2$—R$_6$ or a group represented by Y. $R_6$ represents an alkyl group which may have a substituent or a cyclic hydrocarbon group which may have a substituent.

In the group represented by Y, $R_{21}'$ to $R_{30}'$, which may be the same or different, each independently represents a hydrogen atom or an alkyl group which may have a substituent, and a and b each represent 1 or 2.

In the resin according to the present invention, an acid-decomposable group may be incorporated into the above described —C(=O)—X-A'-R$_{17}'$ or as a substituent for Z' in formula (II-AB), The acid-decomposable group includes a group represented by the following formula:

—C(=O)—X$_1$—R$_0$

In the formula, $R_0$ represents a tertiary alkyl group, for example, tert-butyl or tert-amyl group, an isobornyl group, an 1-alkoxyethyl group, for example, 1-ethoxyethyl, 1-butoxyethyl, 1-isobutoxyethyl or 1-cyclohexyloxyethyl group, an alkoxymethyl group, for example, 1-metoxymethyl or 1-ethoxymethyl group, a 3-oxoalkyl group, a tetrahydropyranyl group, a tetrahydrofuryl group, a trialkylsilyl ester group, a 3-oxocyclohexyl ester group, a 2-methyl-2-adamantyl group or a mevalonic lactone residue, and $X_1$ has the same meaning as X defined above.

The halogen atom for each of $R_{13}'$ or $R_{16}'$ includes, for example, chlorine, bromine, fluorine and iodine atoms.

The alkyl group for each of $R_5$, $R_6$ and $R_{13}'$ to $R_{16}'$ includes preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl and tert-butyl groups.

The cyclic hydrocarbon group for each of $R_5$, $R_6$ and $R_{13}'$ to $R_{16}'$ includes a cyclic alkyl group and a bridged hydrocarbon moiety, for example, cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl or tetracyclododecanyl group.

The ring formed by combining at least two of $R_{13}'$ to $R_{16}'$ includes a ring having from 5 to 12 carbon atoms, for example, cyclopentene, cyclohexene, cycloheptane or cyclooctane ring.

The alkoxy group for $R_{17}'$ includes an alkoxy group having from 1 to 4 carbon atoms, for example, methoxy, ethoxy, propoxy or butoxy group.

Examples of the substituent for the alkyl group, cyclic hydrocarbon group or alkoxy group described above include a hydroxy group, a halogen atom, a carboxy group, an alkoxy group, an acyl group, a cyano group, an acyloxy group, an alkyl group and a cyclic hydrocarbon group. The halogen atom includes, for example, chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl and acetyl groups. The acyloxy group includes, for example, an acetoxy group.

The alkyl group and cyclic hydrocarbon group include those described above.

The divalent linkage group for A' includes a single bond, an alkylene group, a substituted alkylene group, an ether group, a thioether group, a carbonyl group, an ester group, an amido group, a sulfonamido group, a urethane group, a urea group and a combination of two or more thereof.

Examples of the alkylene group or substituted alkylene group for A' include a group represented by the following formula:

—{C(R$_a$)(R$_b$)}$_r$—

In the formula, $R_a$ and $R_b$, which may be the same or different, each represent a hydrogen atom, an alkyl group, a substituted alkyl group, a halogen atom, a hydroxy group or an alkoxy group, and r represents an integer of from 1 to 10.

The alkyl group includes preferably a lower alkyl group, for example, methyl, ethyl, propyl, isopropyl or butyl group, and more preferably methyl, ethyl, propyl or isopropyl group Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group, The halogen atom includes, for example, chlorine, bromine, fluorine and iodine atoms.

In the resin of component (B) according to the present invention, the acid-decomposable group may be incorporated into at least one repeating unit selected from of the repeating unit having a partial structure including an alicyclic hydrocarbon represented by formula (pI), (pII), (pIII), (pIV), (pV) or (pVI), the repeating unit represented by formula (II-AB), and a repeating unit of a copolymerization component described hereinafter.

Various atoms and groups represented by $R_{13}'$ to $R_{16}'$ in formula (II-A) or (II-B) constitute substituents for the atomic group necessary for forming an alicyclic structure or a bridged alicyclic structure represented by Z' in formula (II-AB).

Specific examples of the repeating unit represented by formula (II-A) or (II-B) are set forth below as [II-1] to [II-175], but the present invention should not be construed as being limited thereto.

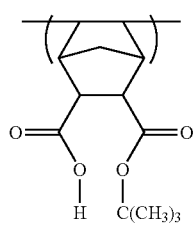
[II-1]

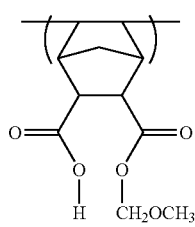
[II-2]

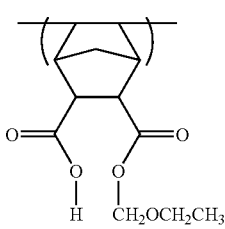
[II-3]

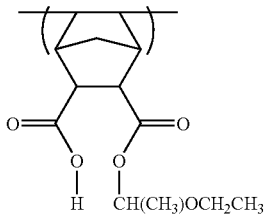
[II-4]

-continued

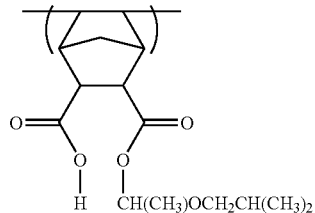
[II-5]

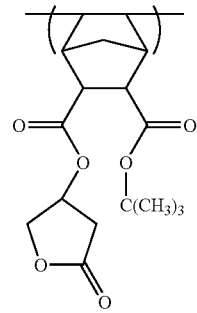
[II-6]

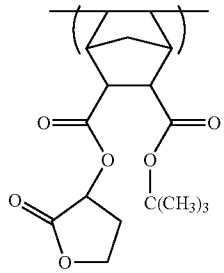
[II-7]

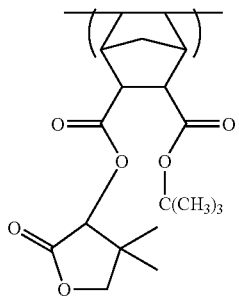
[II-8]

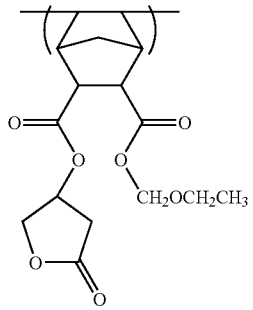
[II-9]

[II-10] 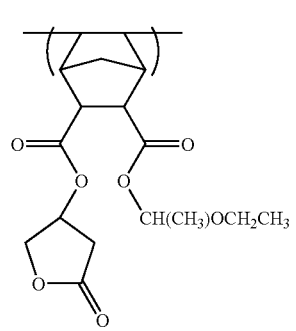
[II-11] 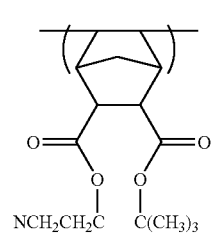
[II-12] 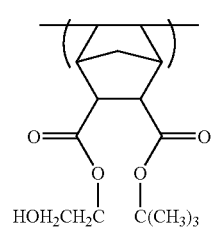
[II-13] 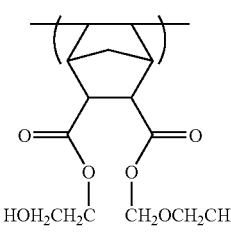
[II-14] 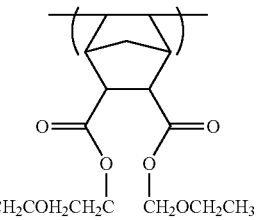
[II-15] 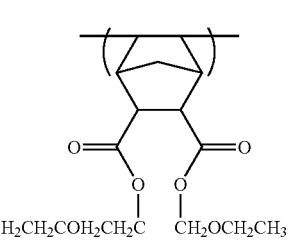
[II-16] 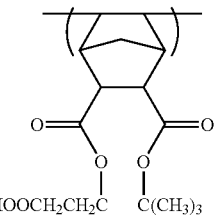
[II-17] 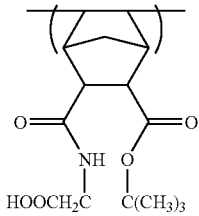
[II-18] 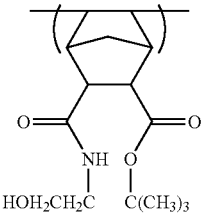
[II-19] 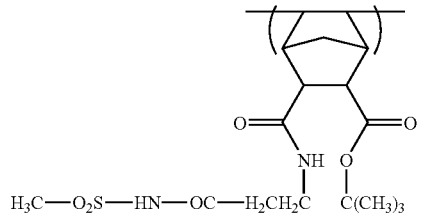
[II-20] 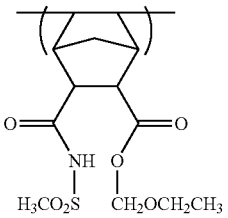
[II-21] 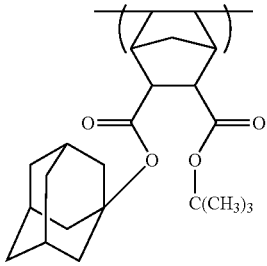

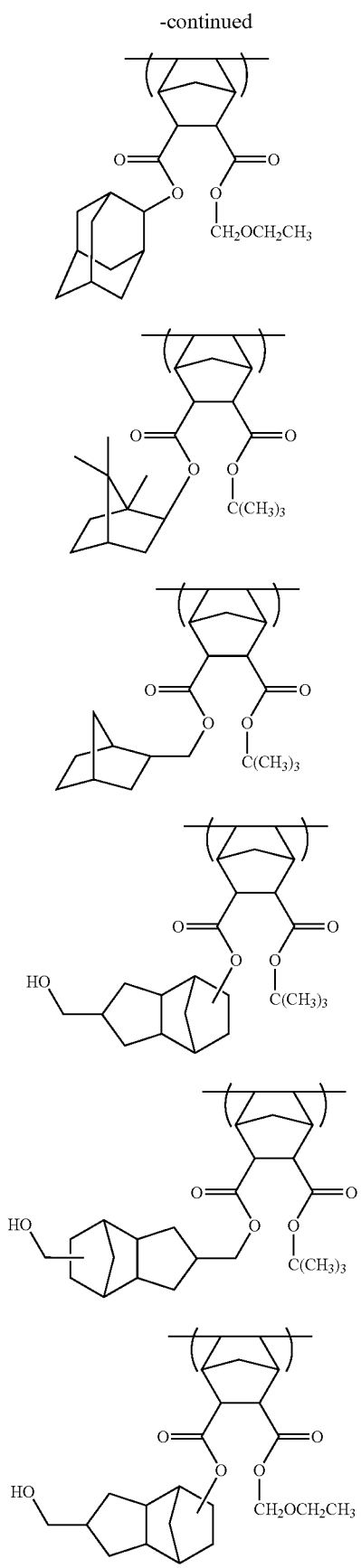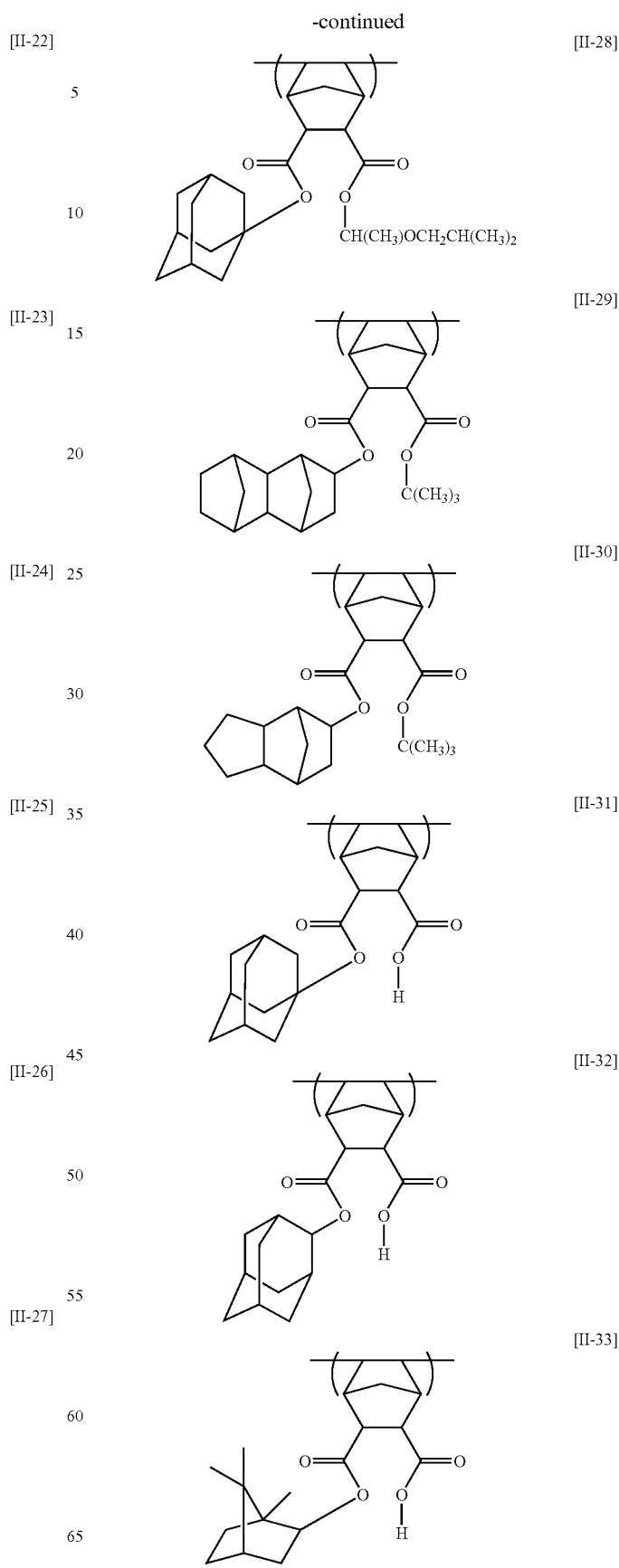

[II-34]
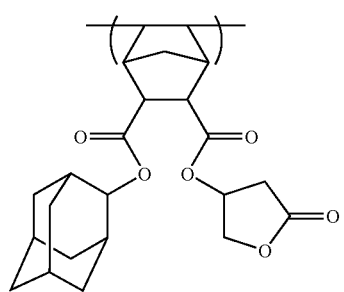
[II-35]
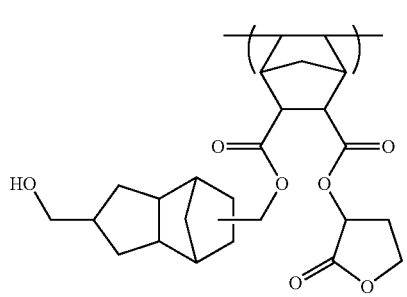
[II-36]
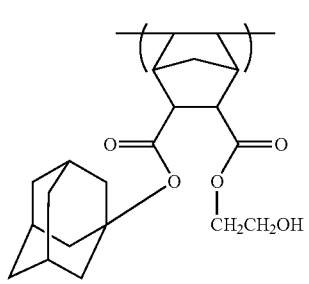
[II-37]
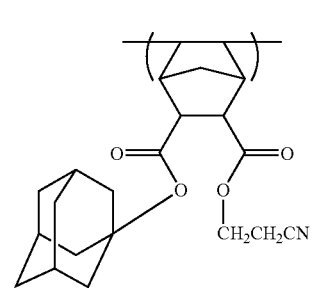
[II-38]
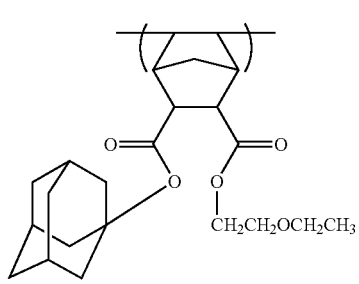
[II-39]
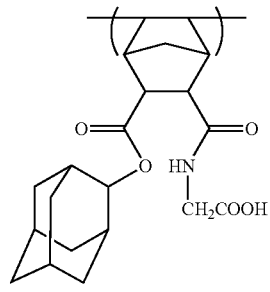
[II-40]
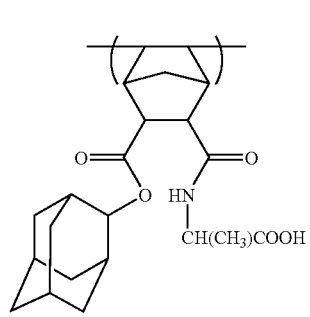
[II-41]
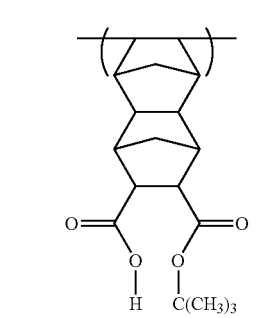
[II-42]
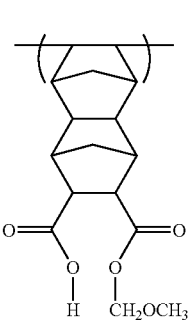
[II-43]
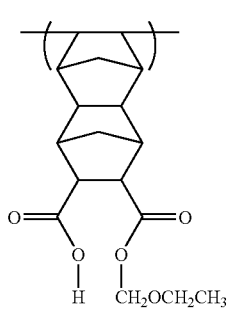

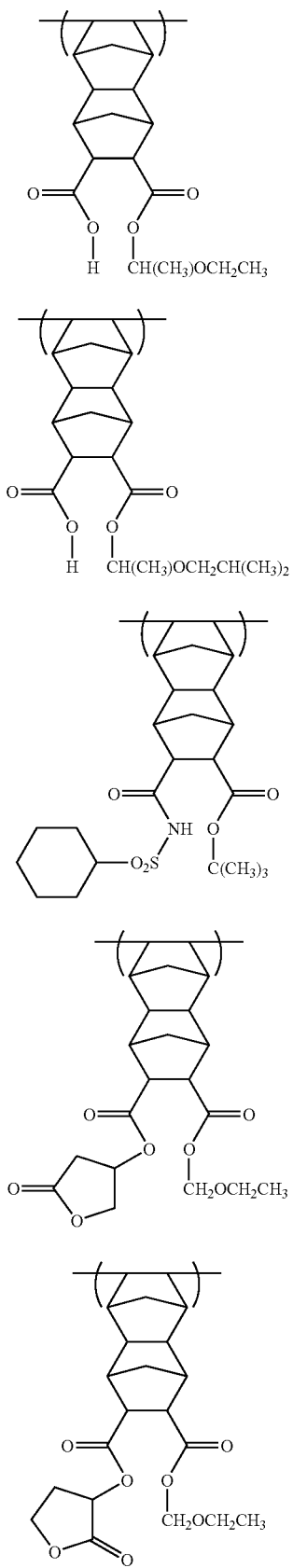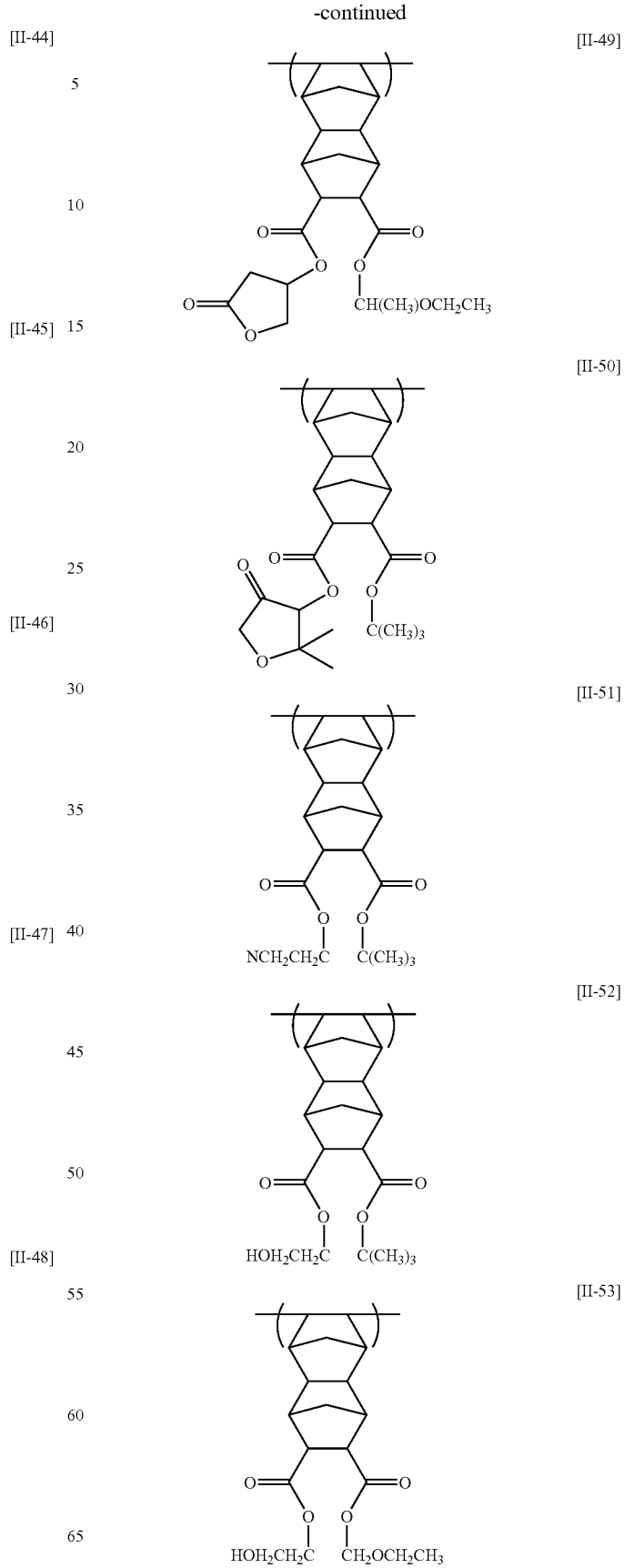

-continued
[II-54]
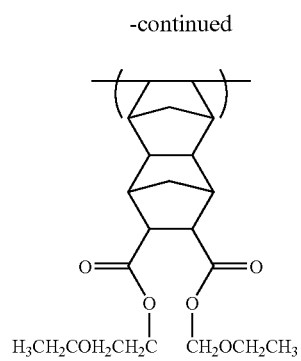
[II-55]
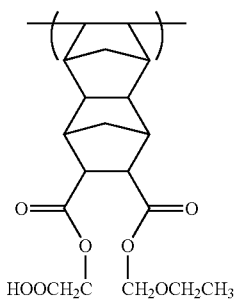
[II-56]
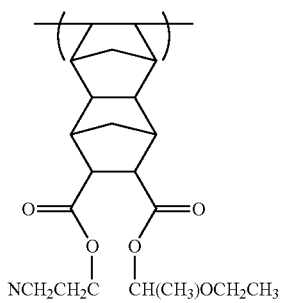
[II-57]
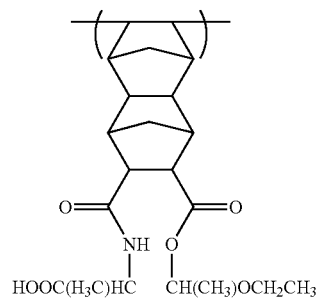
[II-58]
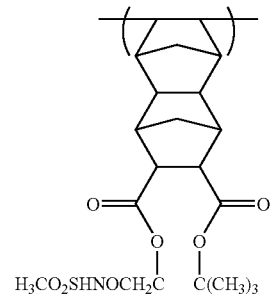
-continued
[II-59]
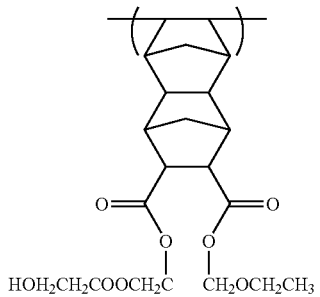
[II-60]
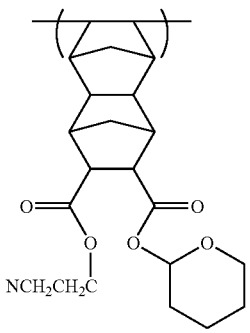
[II-61]
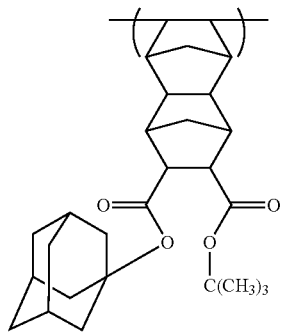
[II-62]
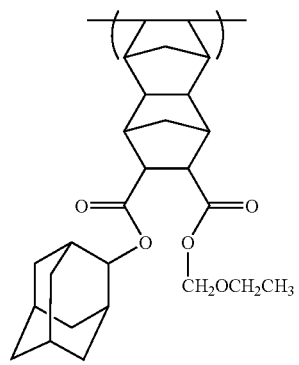

-continued
[II-63]
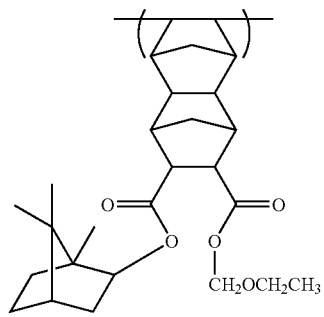
[II-64]
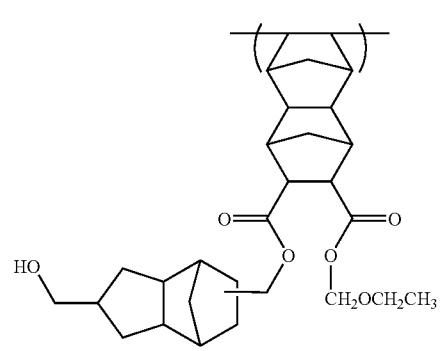
[II-65]
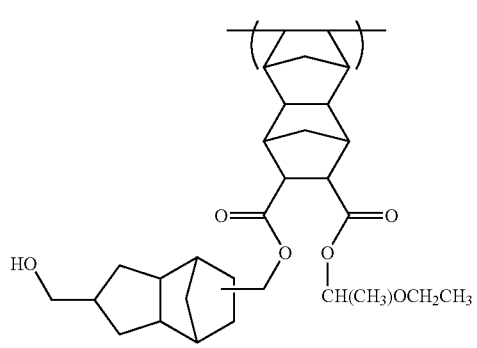
[II-66]
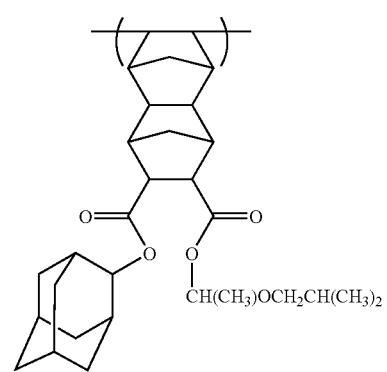
-continued
[II-67]
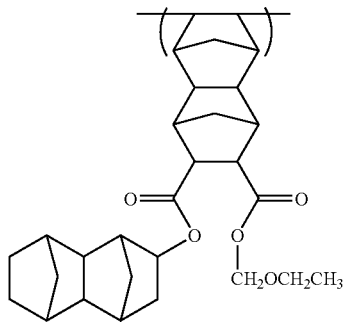
[II-68]
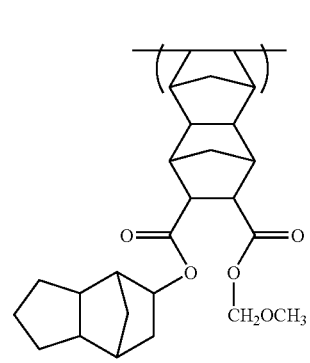
[II-69]
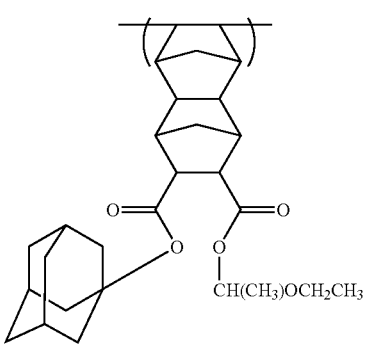
[II-70]
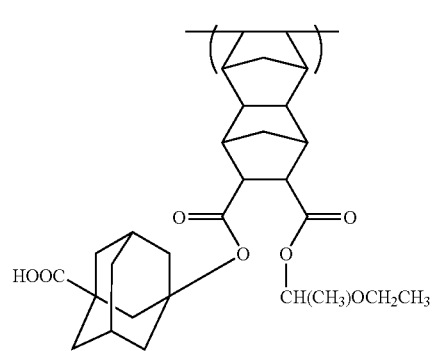

[II-71] 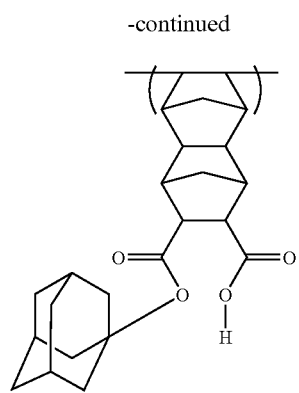
[II-75] 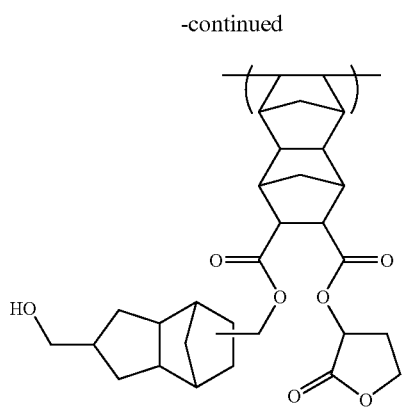
[II-72] 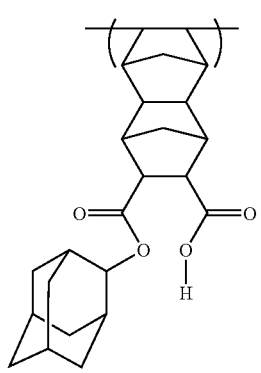
[II-76] 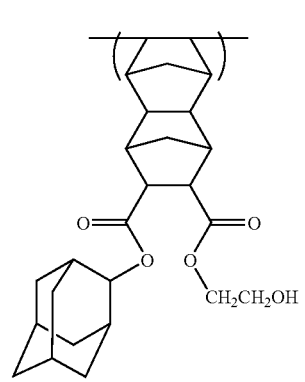
[II-73] 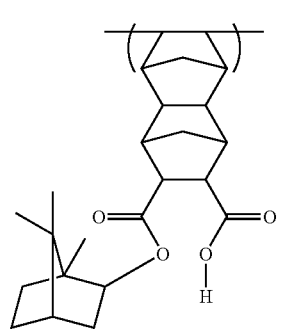
[II-77] 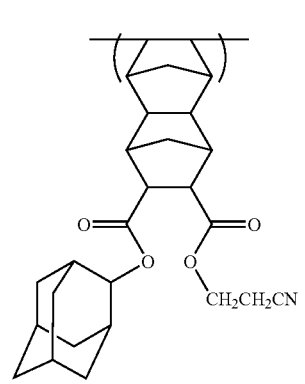
[II-74] 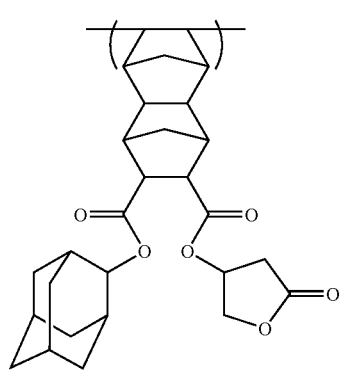
[II-78] 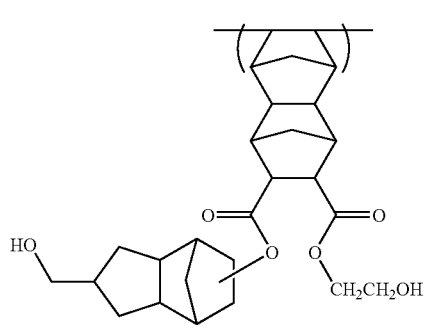

-continued
[II-79]
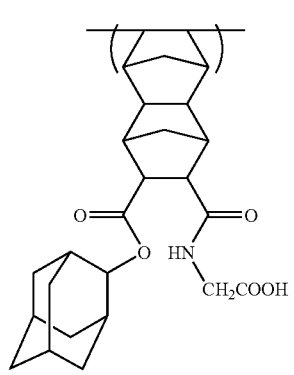
[II-80]
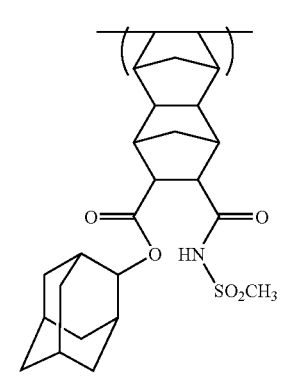
[II-81]
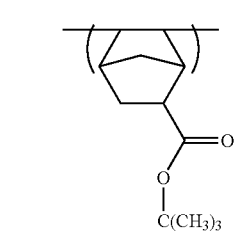
[II-82]
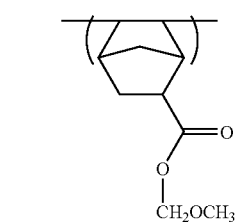
[II-83]
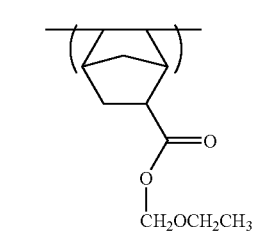
[II-84]
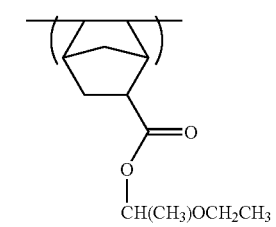
-continued
[II-85]
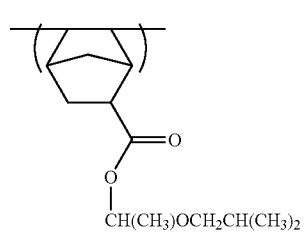
[II-86]
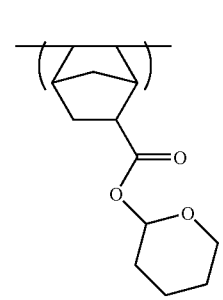
[II-87]
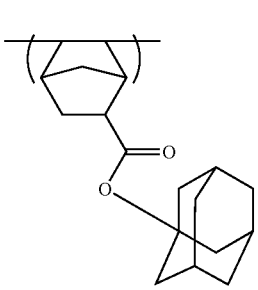
[II-88]
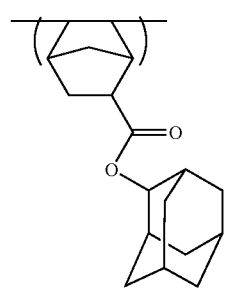
[II-89]
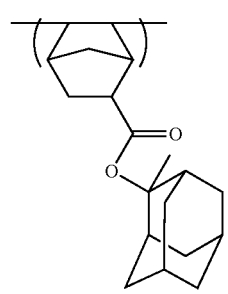

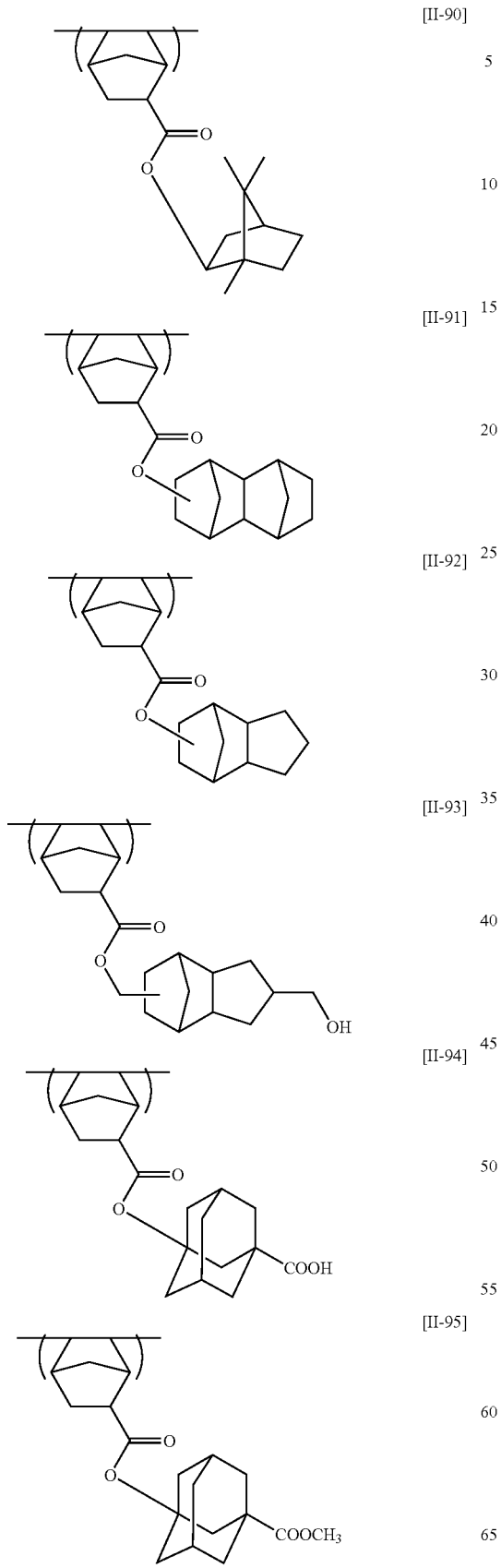
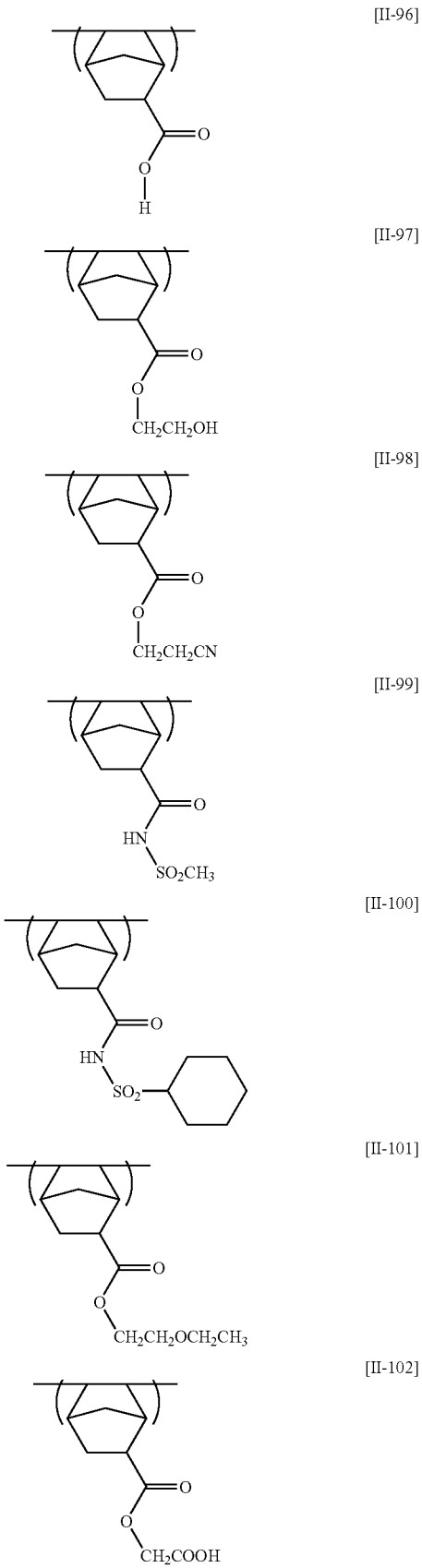

-continued
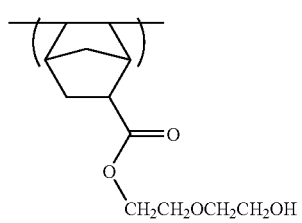
[II-103]
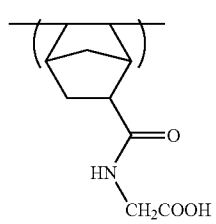
[II-104]
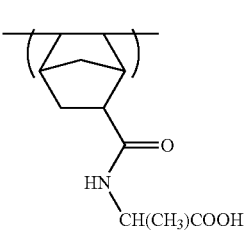
[II-105]
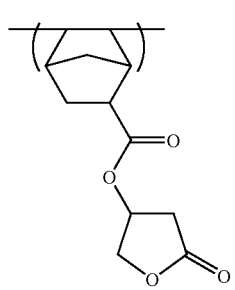
[II-106]
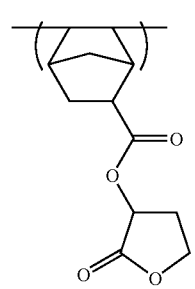
[II-107]
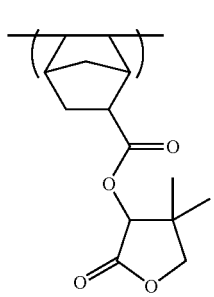
[II-108]
-continued
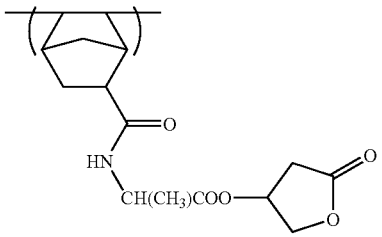
[II-109]
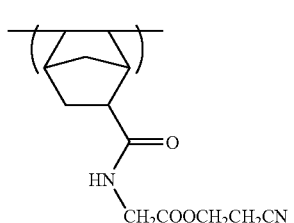
[II-110]
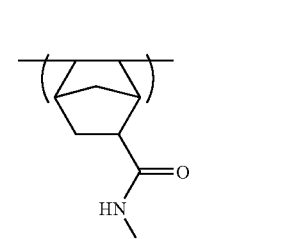
[II-111]
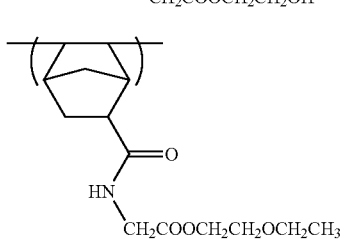
[II-112]
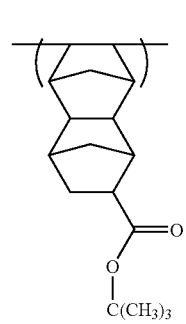
[II-113]
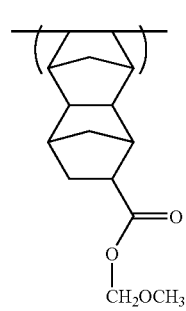
[II-114]

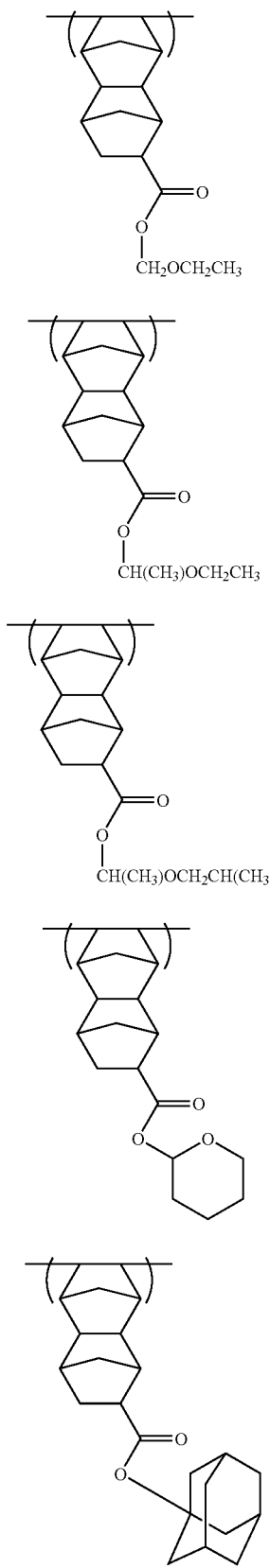
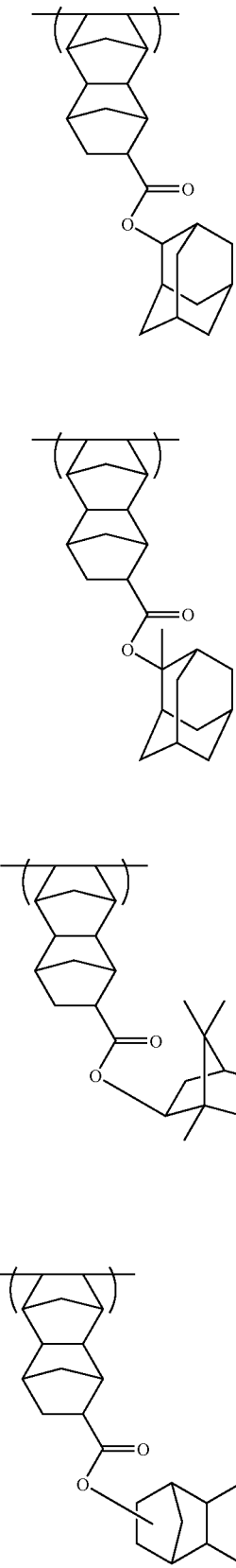

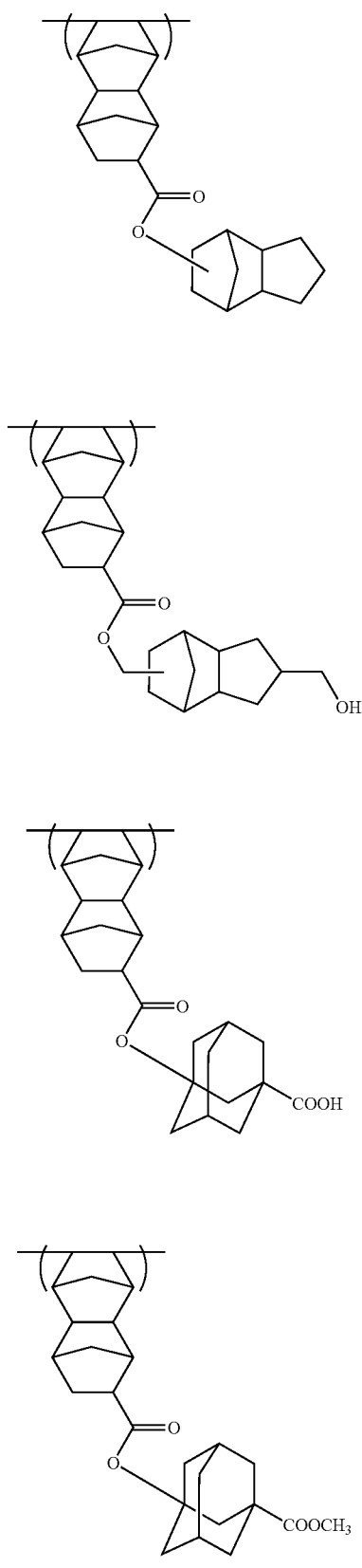
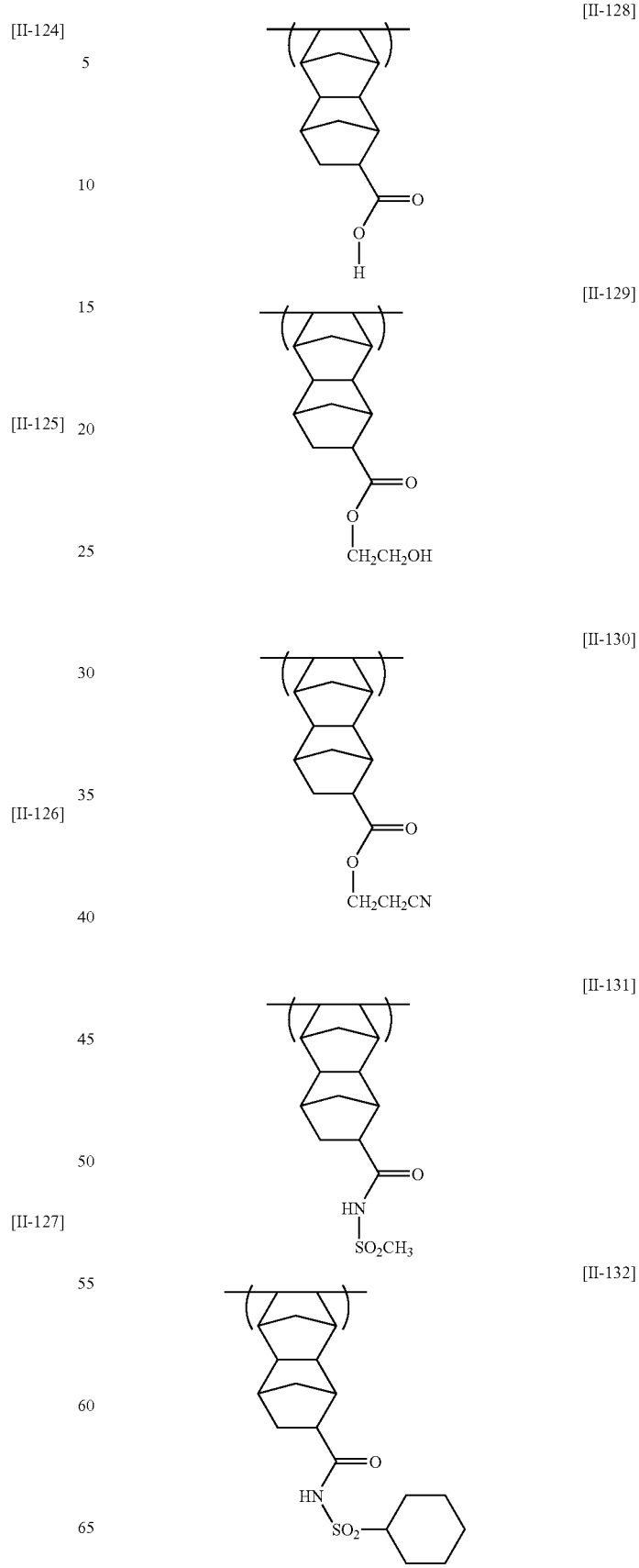

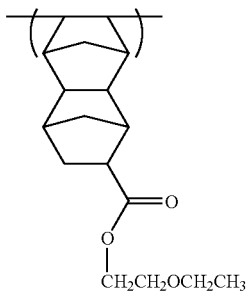
[II-133]
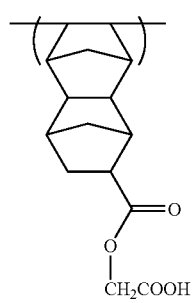
[II-134]
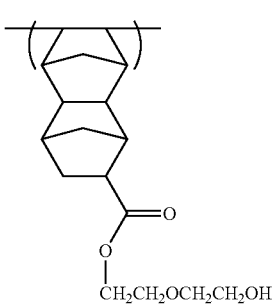
[II-135]
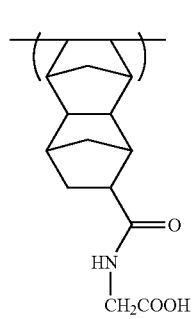
[II-136]
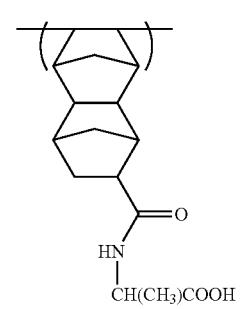
[II-137]
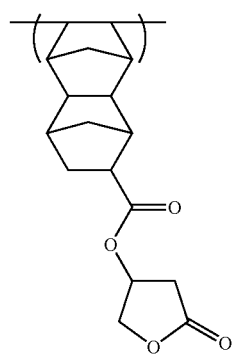
[II-138]
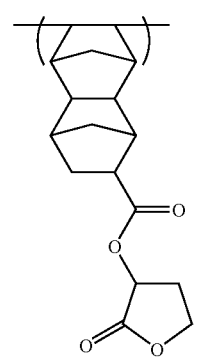
[II-139]
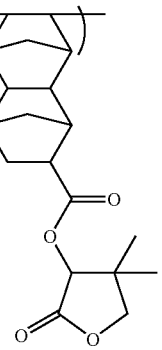
[II-140]
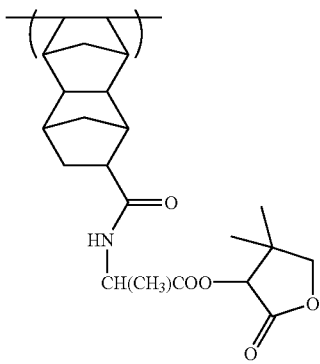
[II-141]

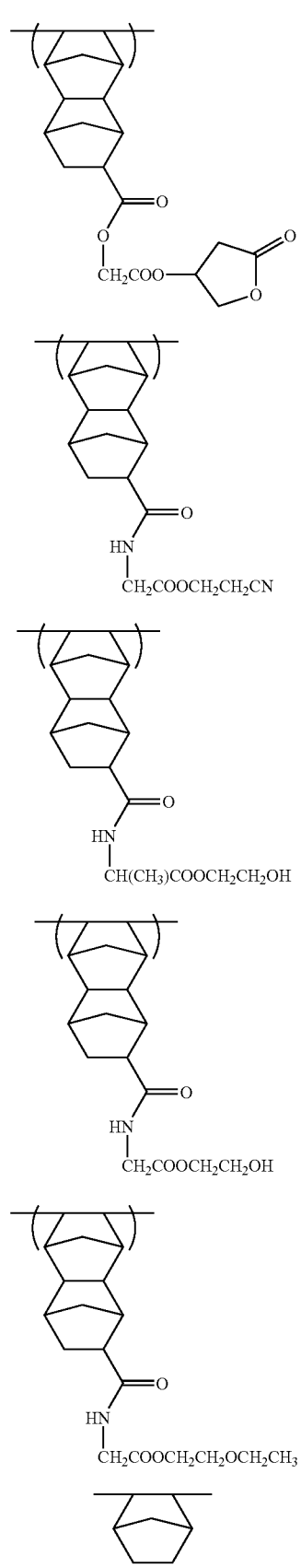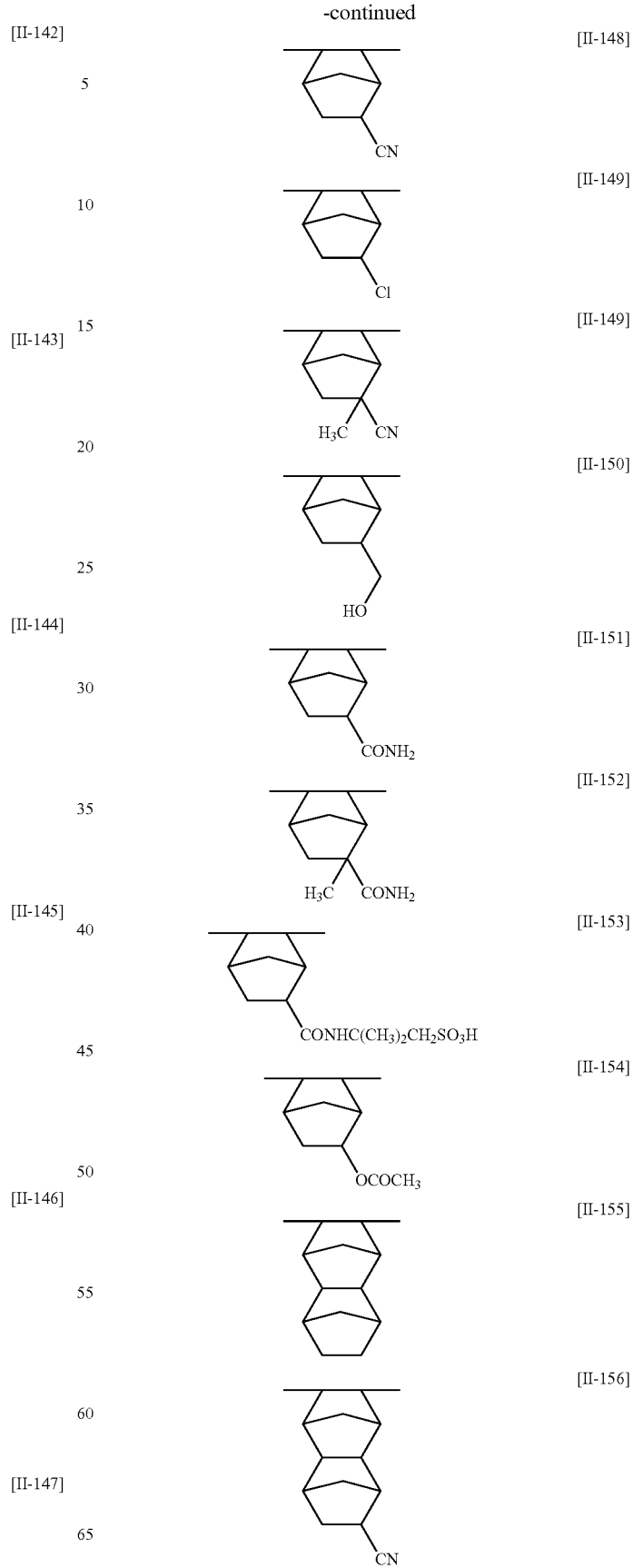

[II-157], [II-158], [II-159], [II-160], [II-161], [II-162], [II-163], [II-164], [II-165], [II-166], [II-167], [II-168], [II-169], [II-170], [II-171], [II-172]

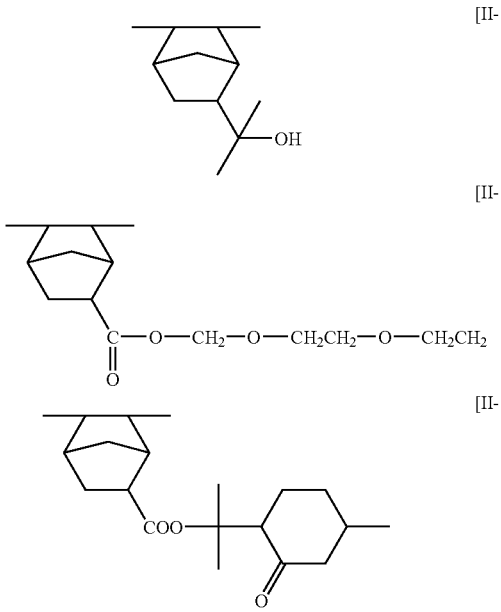

[II-173]

[II-174]

[II-175]

The acid-decomposable resin of component (B) according to the present invention may further contain a repeating unit having a lactone structure represented by the following formula (IV);

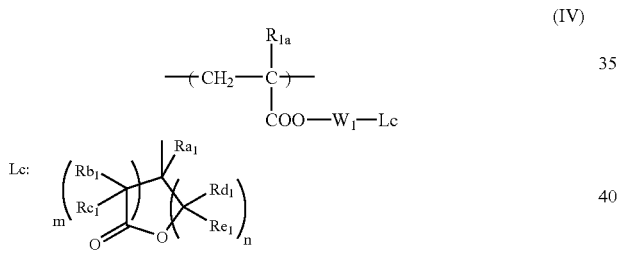

(IV)

In formula (IV), $R_{1a}$ represents a hydrogen atom or a methyl group.

$W_1$ represents a single bond, an alkylene group, an ether group, a thioether group, a carbonyl group, an eater group or a combination of two or more of thereof.

$R_{a1}$, $R_{b1}$, $R_{c1}$, $R_{d1}$ and $R_{e1}$, which may be the same or different, each independently represent a hydrogen atom or an alkyl group having from 1 to 4 carbon atoms m and n, which may be the same or different, each independently represent an integer of from 0 to 3, provided that the sum total of m and n is from 2 to 6.

The alkyl group having from 1 to 4 carbon atoms represented by $R_{a1}$, $R_{b1}$, $R_{c1}$, $R_{d1}$ or $R_{e1}$ includes, for example, methyl, ethyl, propyl, isopropyl, n-butyl, isobutyl, sec-butyl and tert-butyl groups.

The alkylene group represented by $W_1$ in formula (IV) includes a group represented by the following formula:

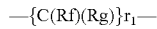
—{C(Rf)(Rg)}$r_1$—

In the above formula, Rf and Rg, which may be the same or different, each represent a hydrogen atom, an alkyl group, a substituted alkyl group, a halogen atom, a hydroxy group or an alkoxy group, and $r_1$ represents an integer of from 1 to 10.

The alkyl group is preferably a lower alkyl group, for example, methyl, ethyl, propyl, isopropyl or butyl group, more preferably methyl, ethyl, propyl or isopropyl group. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

Examples of further substituent for the alkyl group include a carboxy group, an acyloxy group, a cyano group, an alkyl group, a substituted alkyl group, a halogen atom, a hydroxy group, an alkoxy group, a substituted alkoxy group, an acetylamido group, an alkoxycarbonyl group and an acyl group.

The alkyl group includes a lower alkyl group, for example, methyl, ethyl, propyl, isopropyl, butyl, cyclopropyl, cyclobutyl or cyclopentyl group. A substituent for the substituted alkyl group includes, for example, a hydroxy group, a halogen atom and an alkoxy group. A substituent for the substituted alkoxy group includes, for example, an alkoxy group. The alkoxy group includes an alkoxy group having from 1 to 4 carbon atoms, for example, methoxy, ethoxy, propoxy or butoxy group. The acyloxy group includes, for example, an acetoxy group. The halogen atom includes, for example, chlorine, bromine, fluorine and iodine atoms.

Specific examples of the repeating unit represented by formula (IV) are set forth below, but the present invention should not be construed as being limited thereto.

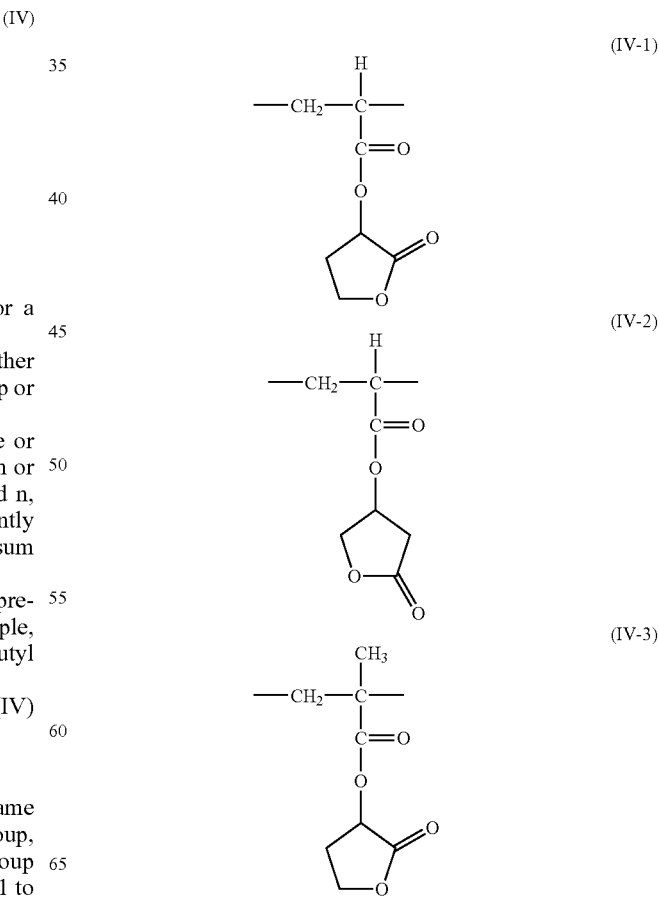

-continued
(IV-4)
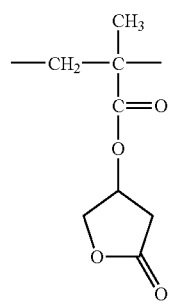
(IV-5)
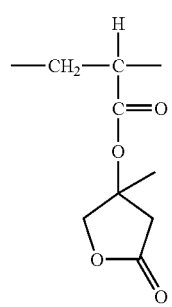
(IV-6)
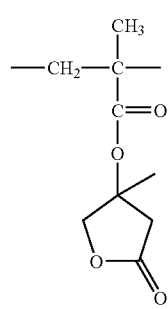
(IV-7)
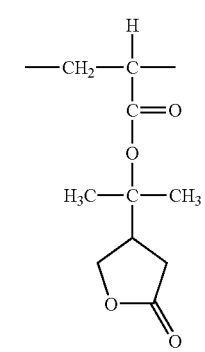
(IV-8)
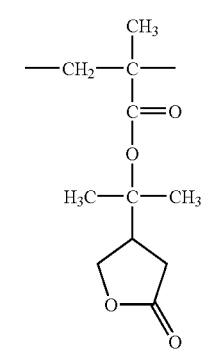
-continued
(IV-9)
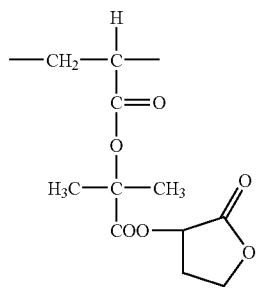
(IV-10)
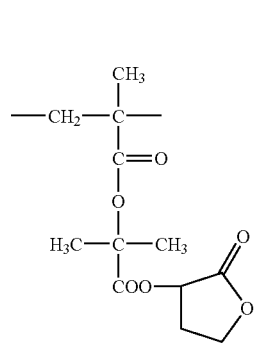
(IV-11)
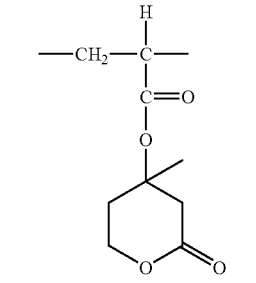
(IV-12)
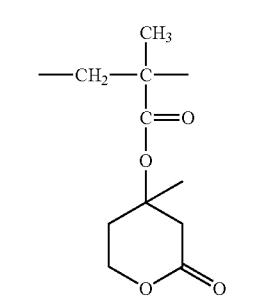
(IV-13)
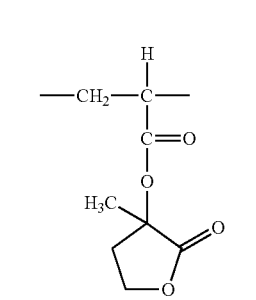

(IV-14)
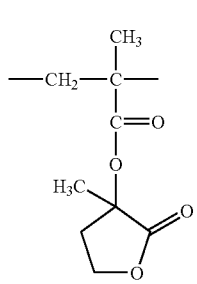
(IV-15)
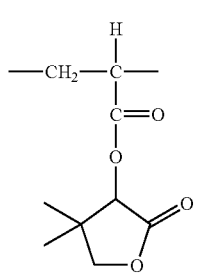
(IV-16)
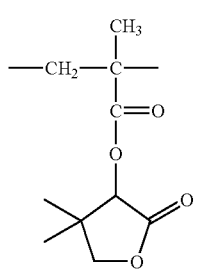
(IV-17)
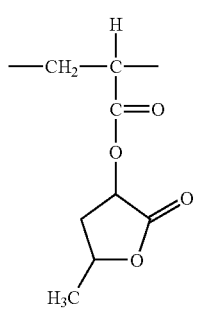
(IV-18)
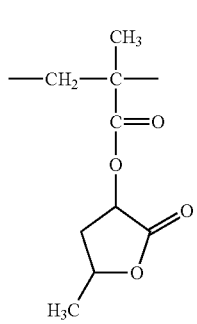
(IV-19)
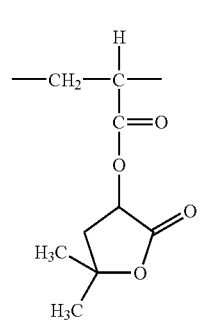
(IV-20)
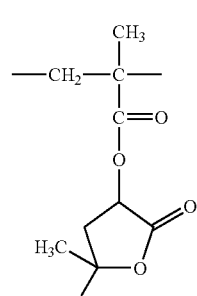
(IV-21)
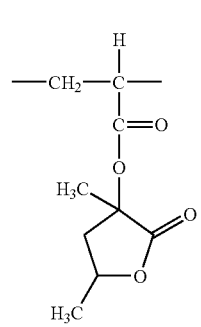
(IV-22)
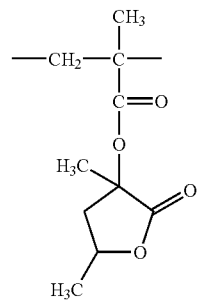
(IV-23)
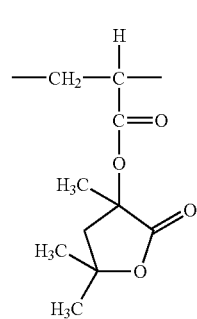

(IV-24)
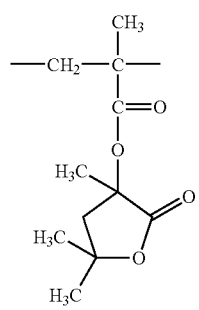
(IV-25)
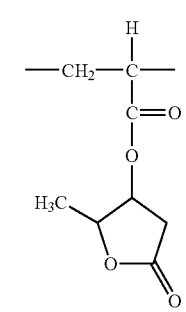
(IV-26)
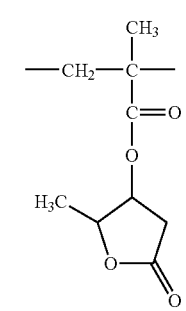
(IV-27)
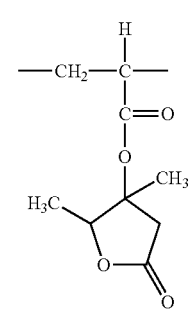
(IV-28)
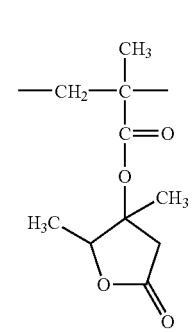
(IV-29)
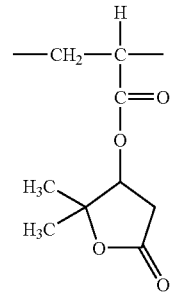
(IV-30)
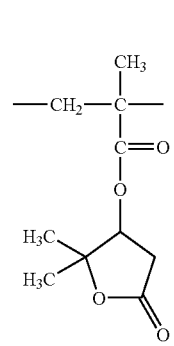
(IV-31)
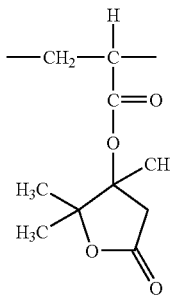
(IV-32)
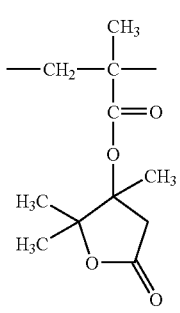
(IV-33)
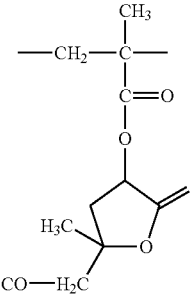

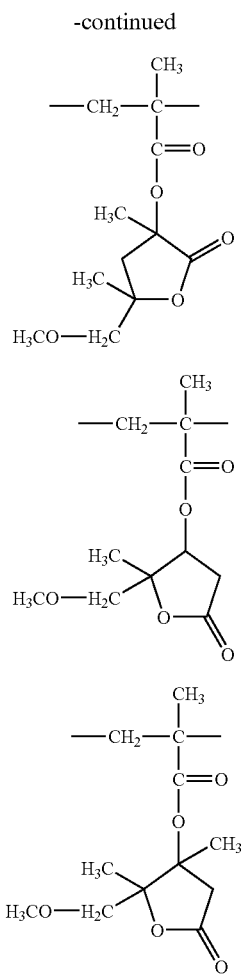

Of the specific examples of the repeating unit represented by formula (IV), (IV-17) to (IV-36) are preferred in view of more improved exposure margin.

Further, the repeating units represented by formula (IV) wherein an acrylate structure is included are preferred from a standpoint of good edge roughness.

The resin of component (B) according to the present invention may further contain a repeating unit having a group represented by any one of the following formulae (V-1) to (V-4):

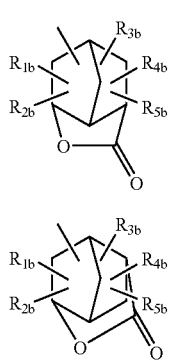

In formulae (V-1) to (V-4), $R_{1b}$, $R_{2b}$, $R_{3b}$, $R_{4b}$ and $R_{5b}$, which may be the same or different, each independently represent a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring.

The alkyl group represented by any one of $R_{1b}$, $R_{2b}$, $R_{3b}$, $R_{4b}$ and $R_{5b}$ in formulae (V-1) to (V-4) includes a straight chain or branched alkyl group which may be substituted. The straight chain or branched alkyl group includes preferably a straight chain or branched alkyl group having from 1 to 12 carbon atoms, more preferably a straight chain or branched alkyl group having from 1 to 10 carbon atoms, and still more preferably methyl, ethyl, propyl, isopropyl, n-butyl, isobutyl, sec-butyl, tert-butyl, pentyl, hexyl, heptyl, octyl, nonyl and decyl groups.

The cycloalkyl group represented by any one of $R_{1b}$, $R_{2b}$, $R_{3b}$, $R_{4b}$ and $R_{5b}$ in formulae (V-1) to (V-4) includes preferably a cycloalkyl group having from 3 to 8 carbon atoms, for example, cyclopropyl, cyclopentyl, cyclohexyl, cycloheptyl or cyclooctyl group.

The alkenyl group represented by any one of $R_{1b}$, $R_{2b}$, $R_{3b}$, $R_{4b}$ and $R_{5b}$ in formulae (V-1) to (V-4) includes preferably an alkenyl group having from 2 to 6 carbon atoms, for example, vinyl, propenyl, butenyl or hexenyl group.

The ring formed by combining two of $R_{1b}$, $R_{2b}$, $R_{3b}$, $R_{4b}$ and $R_{5b}$ in any one of formulae (V-1) to (V-4) includes preferably a 3-membered to 8-membered ring, for example, cyclopropane, cyclobutane, cyclopentane, cyclohexane or cyclooctane ring.

The group represented by $R_{1b}$, $R_{2b}$, $R_{3b}$, $R_{4b}$ and $R_{5b}$ in formulae (V-1) to (V-4) can be bonded to any one of the carbon atoms constituting the cyclic structure.

Preferred examples of the substituent for the alkyl group, cycloalkyl group and alkenyl group described above include an alkoxy group having from 1 to 4 carbon atoms, a halogen atom (e.g., fluorine, chlorine, bromine or iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of repeating unit having the group represented by any one of formulae (V-1) to (V-4) include a repeating unit represented by formula (II-A) or (II-B) described above wherein one of $R_{13}'$ to $R_{16}'$ has the group represented by any one of formulae (V-1) to (V-4), for example, $R_5$ of —COOR$_5$ is the group represented by any one of formulae (V-1) to (V-4), and a repeating unit represented by formula (AI) shown below.

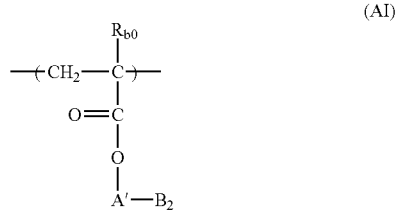
(AI)

In formula (AI), $R_{b0}$ represents a hydrogen atom, a halogen atom, a substituted or unsubstituted alkyl group having from 1 to 4 carbon atoms, Preferred examples of the substituent for the alkyl group represented by $R_{b0}$ include the preferred examples of substituent for the alkyl group represented by $R_{1b}$ in any one of formulae (V-1) to (V-4) described above.

The halogen atom represented by $R_{b0}$ includes fluorine, chlorine, bromine and iodine atoms. $R_{b0}$ is preferably a hydrogen atom.

A' in formula (AI) represents a single bond, an ether group, an ester group, a carbonyl group, an alkylene group or a divalent group formed by combining these groups.

$B_2$ in formula (AI) represents the group represented by any one of formulae (V-1) to (V-4).

Examples of the divalent group formed by combination of the groups represented by A' includes groups represented by the following formulae:

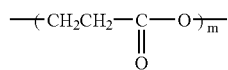

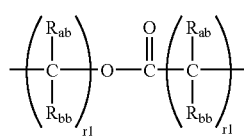

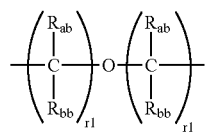

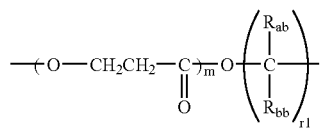

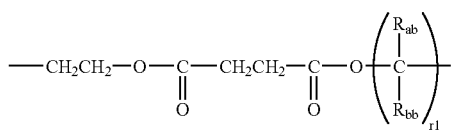

In the above-described formulae, $R_{ab}$ and $R_{bb}$, which may be the same or different, each represent a hydrogen atom, an alkyl group, a substituted alkyl group, a halogen atom, a hydroxy group or an alkoxy group.

The alkyl group represented by any one of $R_{ab}$ and $R_{bb}$ is preferably a lower alkyl group, for example, methyl, ethyl, propyl, isopropyl or butyl group, and more preferably methyl, ethyl, propyl or isopropyl group. A substituent for the substituted alkyl group includes a hydroxy group, a halogen atom and an alkoxy group having from 1 to 4 carbon atoms.

The alkoxy group includes an alkoxy group having from 1 to 4 carbon atoms, for example, methoxy, ethoxy, propoxy or butoxy group. The halogen atom includes, for example, chlorine, bromine, fluorine and iodine atoms. r1 represents an integer of from 1 to 10, and preferably from 1 to 4. m represents an integer of from 1 to 3, and preferably 1 or 2.

Specific examples of the repeating unit represented by formula (AI) are set forth below, but the present invention should not be construed as being limited thereto.

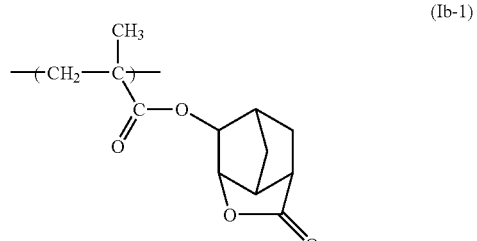
(Ib-1)

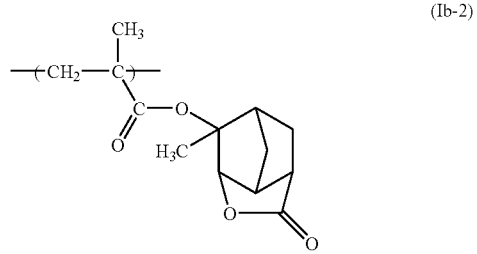
(Ib-2)

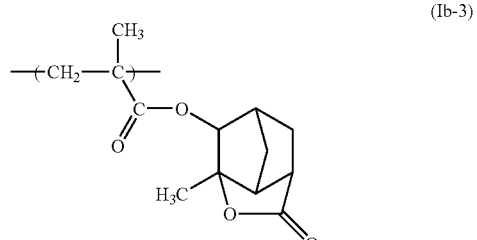
(Ib-3)

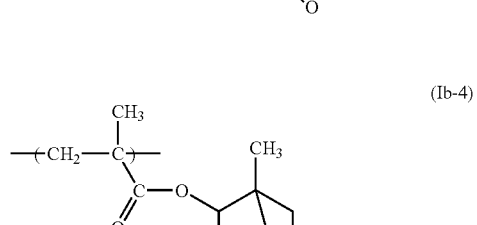
(Ib-4)

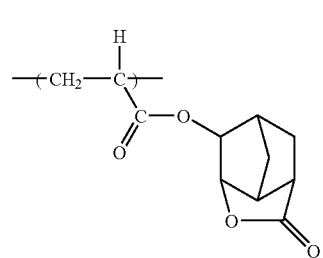 (Ib-5)
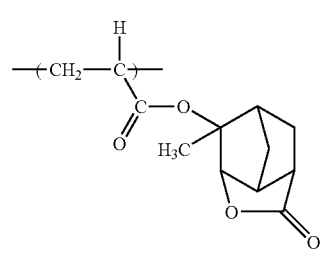 (Ib-6)
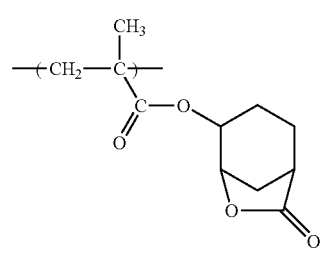 (Ib-7)
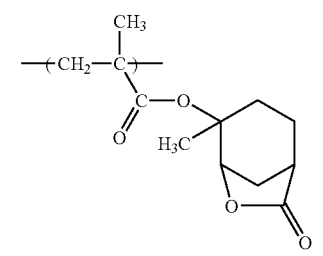 (Ib-8)
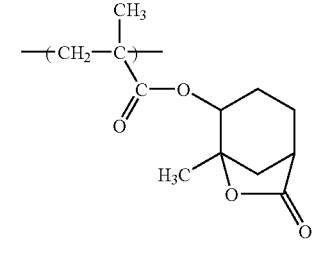 (Ib-9)
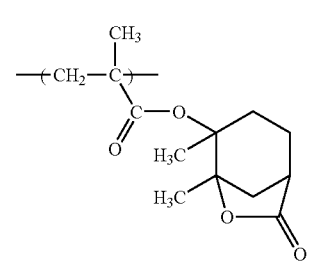 (Ib-10)
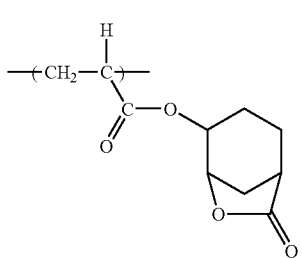 (Ib-11)
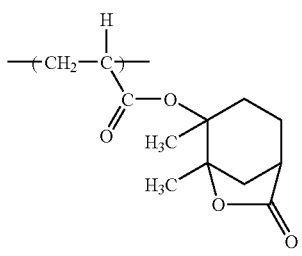 (Ib-12)
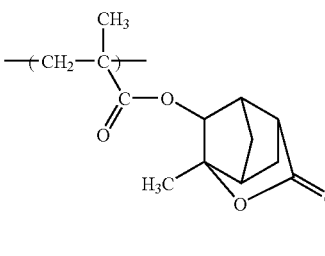 (Ib-13)
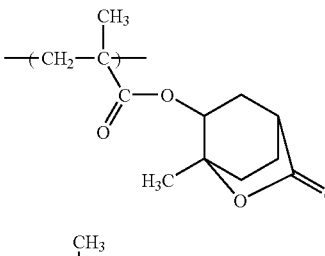 (Ib-14)
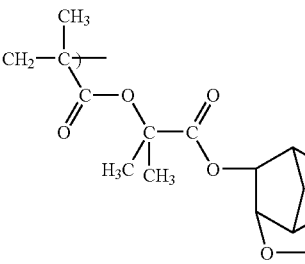 (Ib-15)
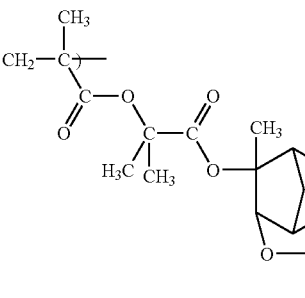 (Ib-16)

-continued
(Ib-17)
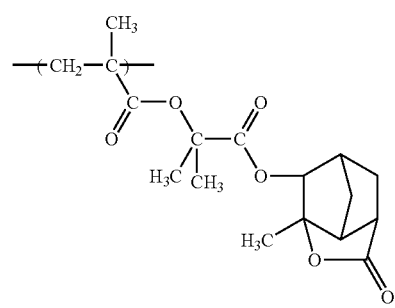
(Ib-18)
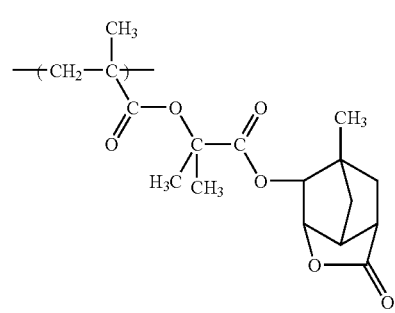
(Ib-19)
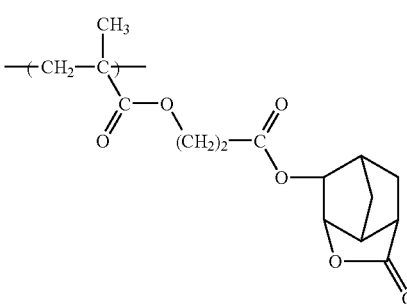
(Ib-20)
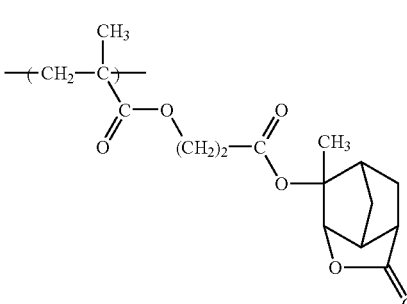
(Ib-21)
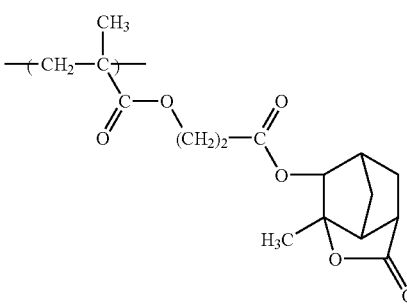
-continued
(Ib-22)
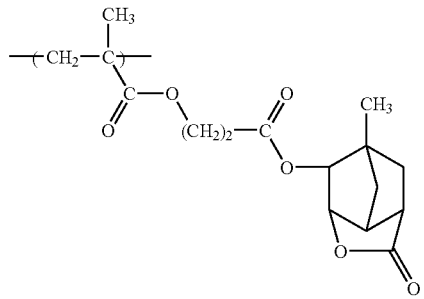
(Ib-23)
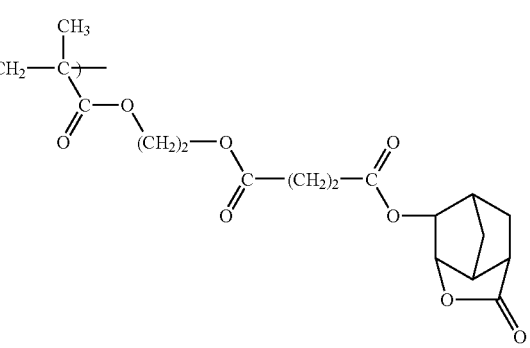
(Ib-24)
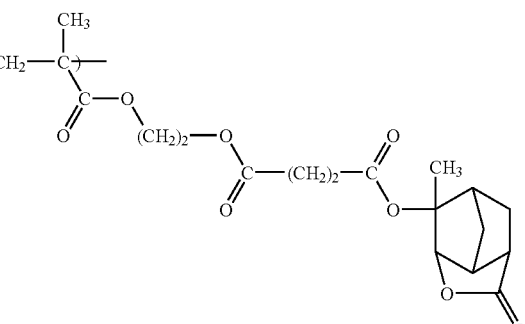
(Ib-25)
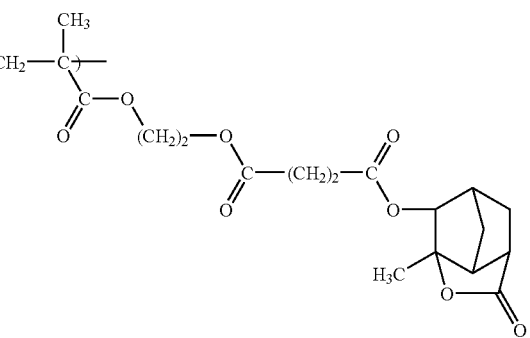

-continued
(Ib-26)
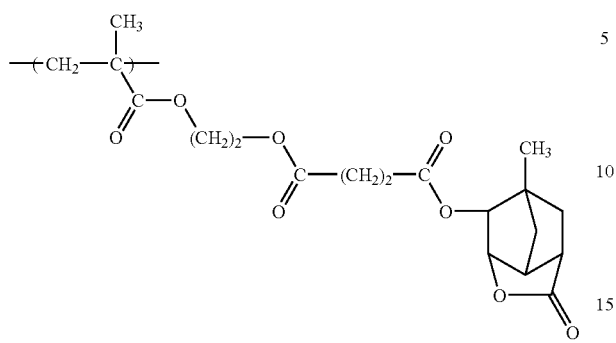
(Ib-27)
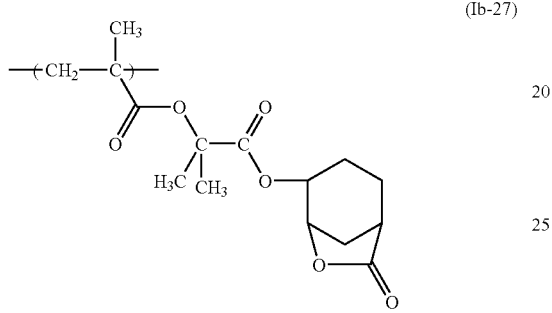
(Ib-28)
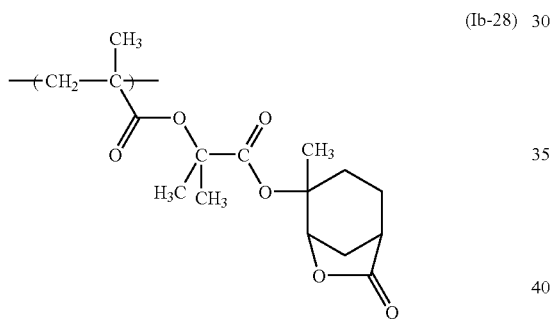
(Ib-29)
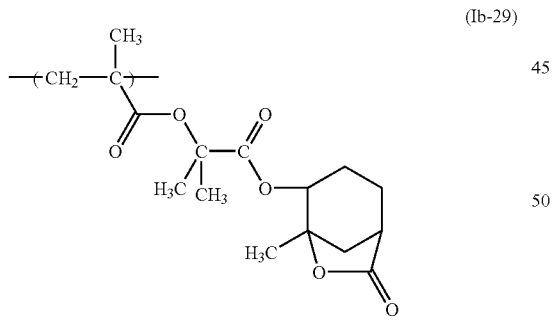
(Ib-30)
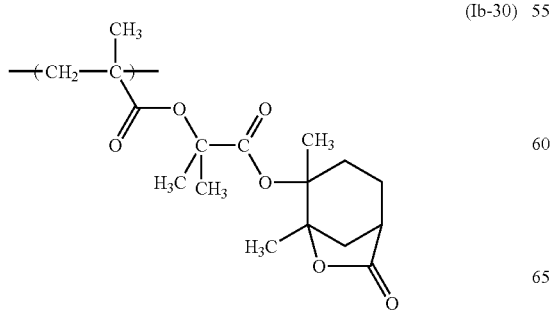
-continued
(Ib-31)
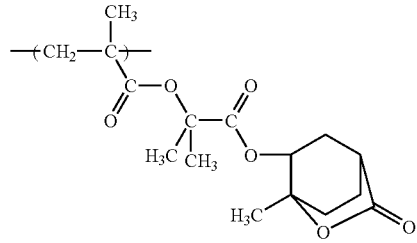
(Ib-32)
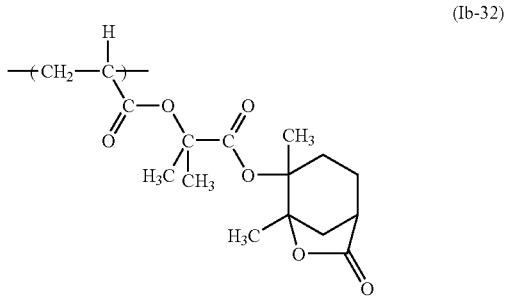
(Ib-33)
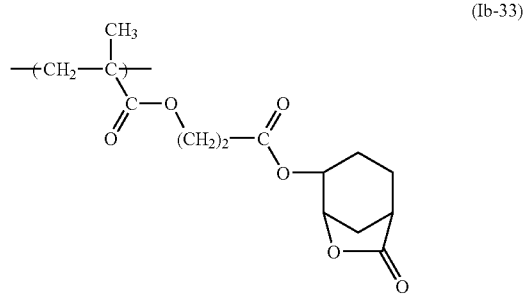
(Ib-34)
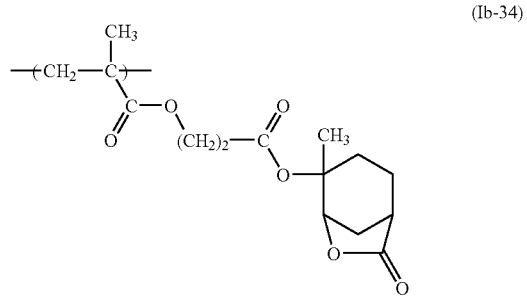
(Ib-35)
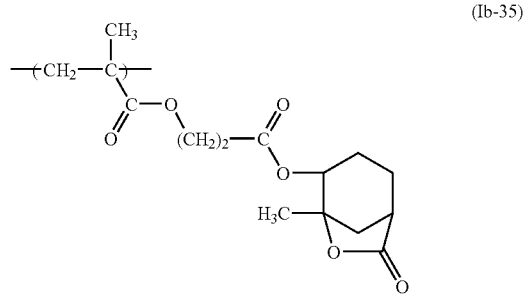

-continued
(Ib-36)
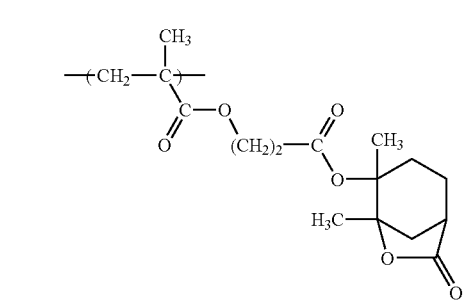
(Ib-37)
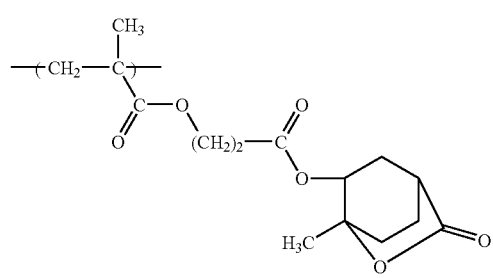
(Ib-38)
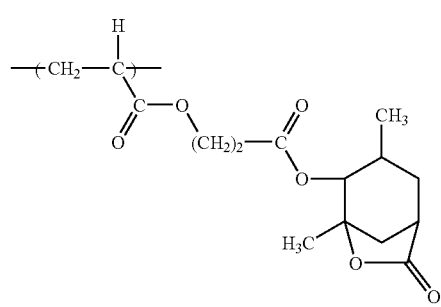
(Ib-39)
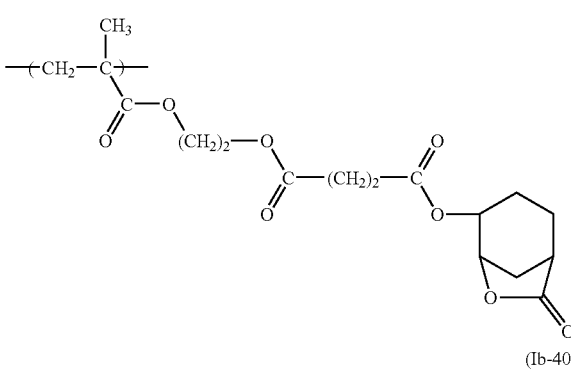
(Ib-40)
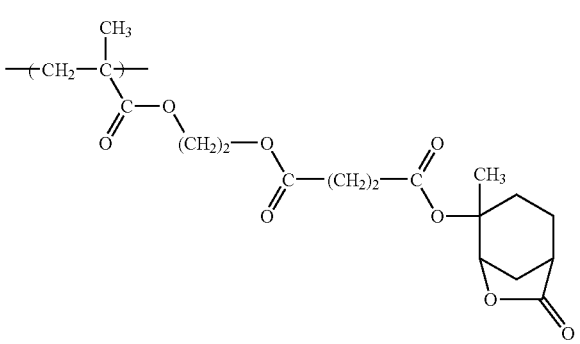
(Ib-41)
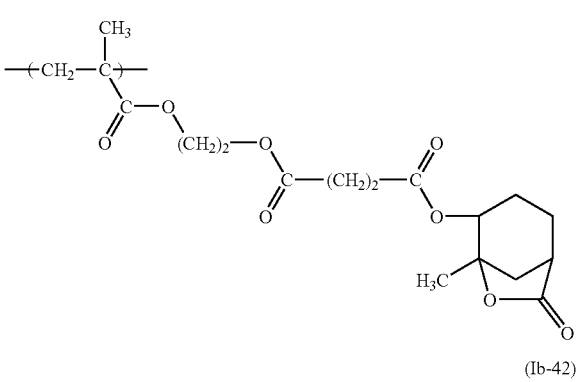
(Ib-42)
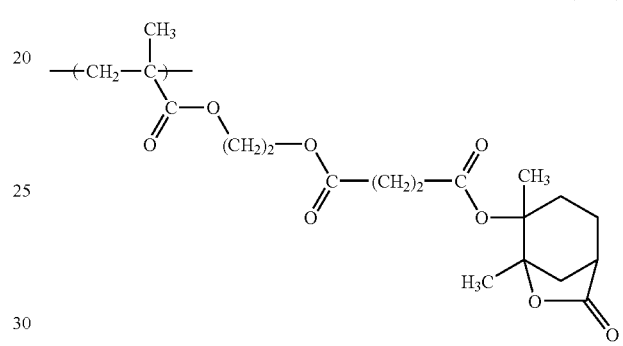
(Ib-43)
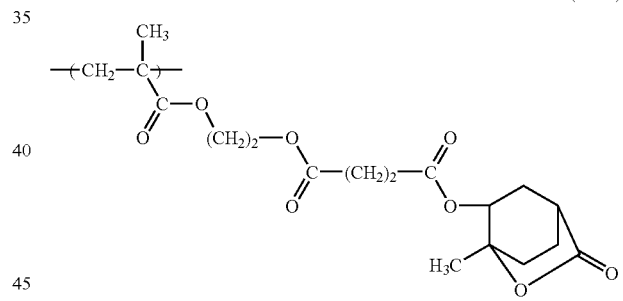
(Ib-44)
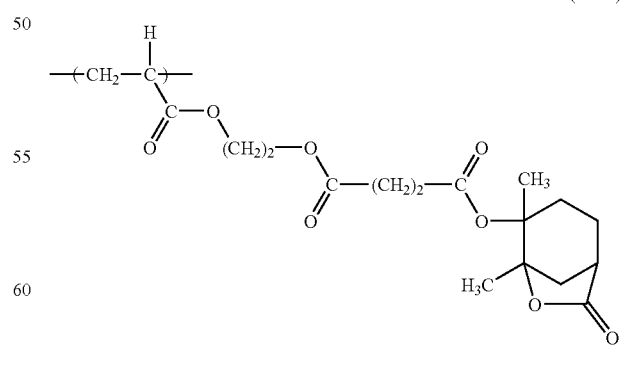
The acid-decomposable resin of component (B) according to the present invention may further contain a repeating unit represented by the following formula (VI):

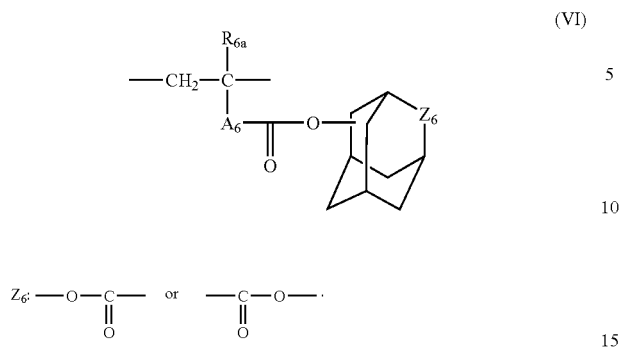

(VI)

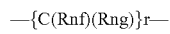

In formula (VI), $A_6$ represents a single bond, an alkylene group, a cycloalkylene group, an ether group, a thioether group, a carbonyl group, an ester group or a combination of two or more thereof.

$R_{6a}$ represents a hydrogen atom, an alkyl group having from 1 to 4 carbon atoms, a cyano group or a halogen atom.

The alkylene group for $A_6$ in formula (VI) includes a group represented by the following formula:

—{C(Rnf)(Rng)}r—

In the above formula, Rnf and Rng, which may be the same or different, each represent a hydrogen atom, an alkyl group, a substituted alkyl group, a halogen atom, a hydroxy group or an alkoxy group, and r represents an integer of from 1 to 10.

The alkyl group is preferably a lower alkyl group, for example, methyl, ethyl, propyl, isopropyl or butyl group, and more preferably methyl, ethyl, propyl or isopropyl group. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

The cycloalkylene group represented by $A_6$ in formula (VI) includes a cycloalkylene group having from 3 to 10 carbon atoms, for example, cyclopentylene, cyclohexylene or cyclooctylene group.

In formula (VI), the bridged alicyclic group including $Z_6$ may have one or more substituents. Examples of the substituent include a halogen atom, an alkoxy group (preferably an alkoxy group having from 1 to 4 carbon atoms), an alkoxycarbonyl group (preferably an alkoxycarbonyl group having from 1 to 5 carbon atoms), an acyl group (for example, formyl or benzyl group), an acyloxy group (for example, propylcarbonyloxy or benzoyloxy group), an alkyl group (preferably an alkyl group having from 1 to 4 carbon atoms), a carboxy group, a hydroxy group and an alkylsulfonylsulfamoyl group (for example, —CONHSO$_2$CH$_3$). The alkyl group as the substituent may further be substituted with a hydroxy group, a halogen atom or an alkoxy group (preferably an alkoxy group having from 1 to 4 carbon atoms).

The oxygen atom of the ester group connected to $A_6$ in formula (VI) can be bonded to any one of the carbon atoms constituting the bridged alicyclic structure containing $Z_6$.

Specific examples of the repeating unit represented by formula (VI) are set forth below, but the present invention should not be construed as being limited thereto.

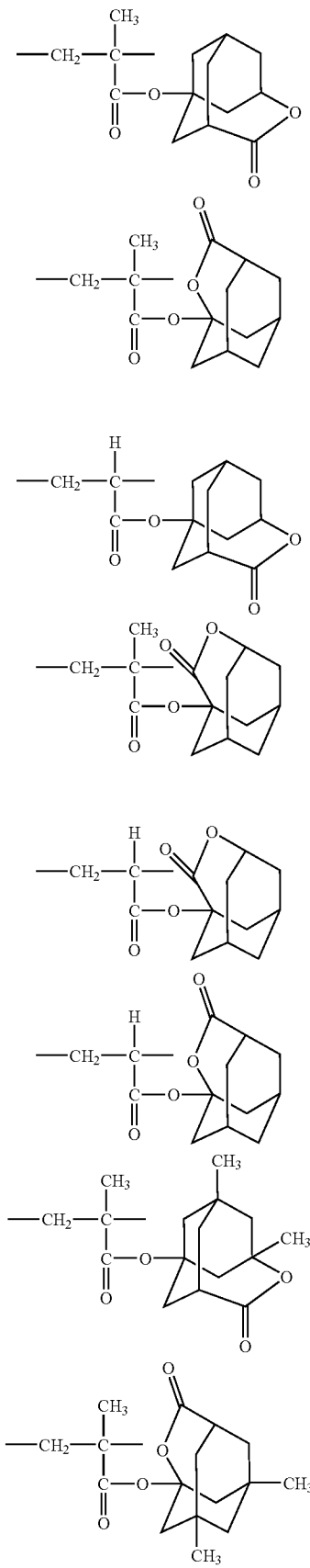

-continued

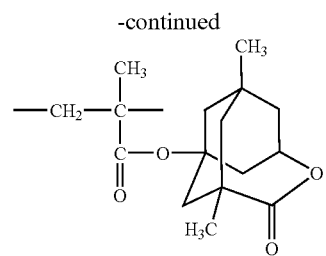

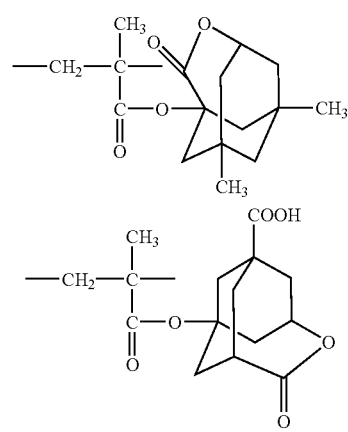

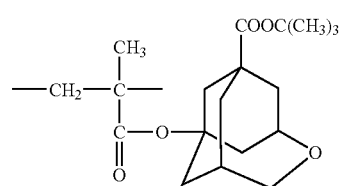

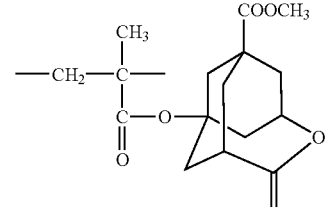

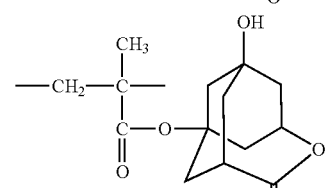

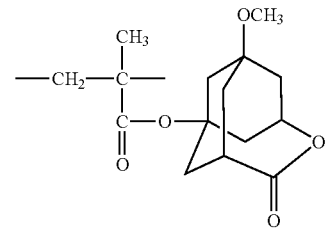

-continued

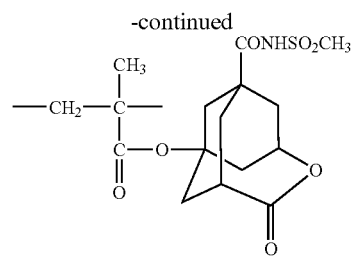

The resin of component (B) according to the present invention may further contain a repeating unit having a group represented by the following formula (VII):

(VII)

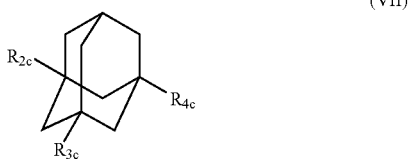

In formula (VII), $R_{2c}$, $R_{3c}$ and $R_{4c}$, which may be the same or different, each represent a hydrogen atom or a hydroxy group, provided that at least one of $R_{2c}$, $R_{3c}$ and $R_{4c}$ represents a hydroxy group.

The group represented by formula (VII) is preferably a dihydroxy body or a monohydroxy body, and more preferably a dihydroxy body.

Examples of the repeating unit having the group represented by formulae (VII) include a repeating unit represented by formula (II-A) or (II-B) described above wherein one of $R_{13}'$ to $R_{16}'$ has the group represented by formula (VII), for example, $R_5$ of —COOR$_5$ is the group represented by formula (VII), and a repeating unit represented by formula the following formula (AII):

(AII)

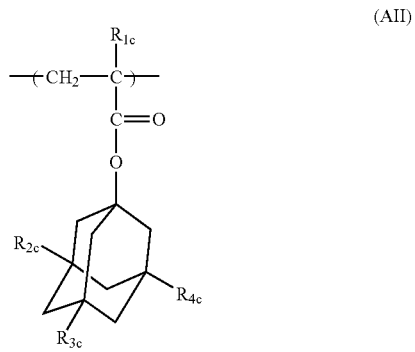

In formula (AII), $R_{10}$ represents a hydrogen atom or a methyl group, and $R_{2c}$, $R^{3c}$ and $R_{4c}$, which may be the same or different, each independently represents a hydrogen atom or a hydroxy group, provided that at least one of $R_{2c}$, $R_{3c}$ and $R_{4c}$ represents a hydroxy group.

Specific examples of the repeating unit represented by formula (AII) are set forth below, but the present invention should not be construed as being limited thereto.

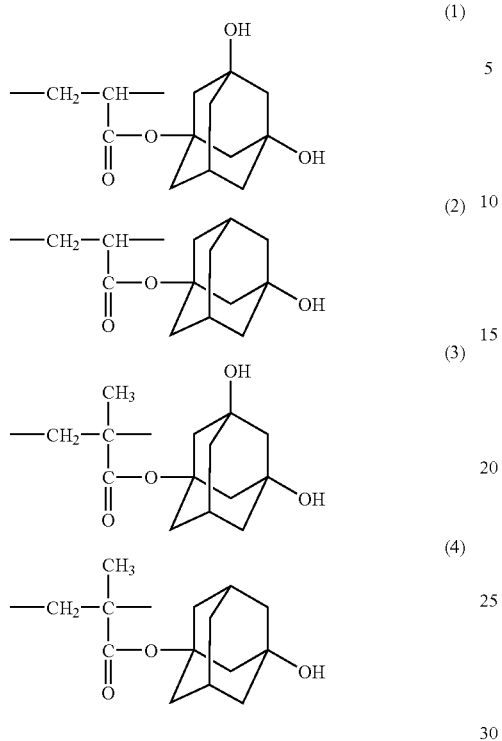

The resin of component (B) according to the present invention may further contain a repeating unit having a group represented by the following formulae (VIII):

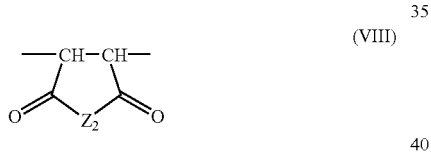

In formula (VIII), $Z_2$ represents —O— or —N($R_{41}$)—, $R_{41}$ represents a hydrogen atom, a hydroxy group, an alkyl group, a haloalkyl group or —O—$O_2$—$R_{42}$, and $R_{42}$ represents an alkyl group, a haloakyl group, a cycloalkyl group or a camphol residue.

Examples of the alkyl group represented by $R_{41}$ or $R_{42}$ include preferably a straight chain or branched alkyl group having form 1 to 10 carbon atoms, more preferably a straight chain or branched alkyl group having form 1 to 6 carbon atoms, and still more preferably methyl, ethyl, propyl, isopropyl, n-butyl, isobutyl, sec-butyl and tert-butyl groups.

Examples of the haloalkyl group represented by $R_{41}$ or $R_{42}$ include trifluoromethyl, nonafluorobutyl, pentadecafluorooctyl and trichloroiiethyl groups.

Examples of the cycloalkyl group represented by $R_{42}$ include cyclopentyl, cyclohexyl and cyclooctyl groups.

The alkyl group and haloalkyl group represented by $R_{41}$ or $R_{42}$ and the cycloalkyl group and camphol residue represented by 42 may have one or more substituents.

Examples of the substituent for the alkyl group, haloalkyl group, cycloalkyl group and camphor residue include a hydroxy group, a carboxy group, a cyano group, a halogen atom (e.g., chlorine, bromine, fluorine or iodine atom), an alkoxy group (preferably an alkoxy group having from 1 to 4 carbon atoms, e.g., methoxy, ethoxy, propoxy or butoxy group), an acyl group (preferably an acyl group having from 2 to 5 carbon atoms, e.g., formyl or acetyl group), an acyloxy group (preferably an acyloxy group having from 2 to 5 carbon atoms, e.g., acetoxy group) and an aryl group (preferably an aryl group having from 6 to 14 carbon atoms, e.g., phenyl group).

Specific examples of the repeating unit represented by formula (VIII) are set forth below as formulae (I'-1) to [I'-7], but the present invention should not be construed as being limited thereto.

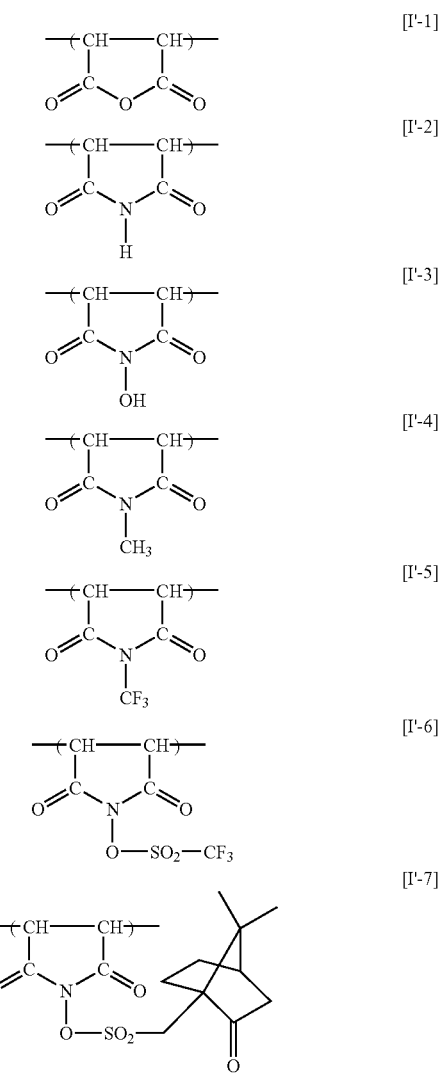

The acid-decomposable resin of component (B) according to the present invention may contain various repeating units in addition to the repeating units described above for the purposes of adjusting dry etching resistance, standard developing solution aptitude, adhesion to substrate, resist profile, and other characteristics ordinarily required for resist, for example, resolution, heat resistance and sensitivity.

Examples of such repeating units include repeating units corresponding to monomers described below, but the present invention should not be construed as being limited thereto.

The introduction of additional repeating unit makes possible the minute control of characteristics required for the acid-decomposable resin, particularly (1) solubility in a coating solvent, (2) film forming property (glass transition temperature), (3) developing property with alkali, (4) reduction in a film thickness (hydrophobicity, selection of alkali-soluble group), (5) adhesion of the unexposed area to a substrate, and (6) dry etching resistance.

Examples of such monomers include compounds having one addition-polymerizable unsaturated bond, for example, acrylates, methacrylate, acrylamides, methacrylamides, allyl compound, vinyl ethers and vinyl esters.

Specific examples of the monomer include an acrylate, for example, an alkyl acrylate (preferably an alkyl acrylate containing an alkyl group having from 1 to 10 carbon atoms), e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate or tetrahydrofurfuryl acrylate; a methacrylate, for example, an alkyl methacrylate (preferably an alkyl methacrylate containing an alkyl group having form 1 to 10 carbon atoms), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate or tetrahydrofurfuryl methacrylate; an acrylamide, for example, acrylamide, an N-alkylacrylamide (the alkyl group of which is an alkyl group having from 1 to 10 carbon atoms, e.g., methyl, ethyl, propyl, butyl, tert-butyl, heptyl, octyl, cyclohexyl or hydroxyethyl group), an N,N-dialkylacrylamide (the alkyl group of which is an alkyl group having form 1 to 10 carbon atoms, e.g., methyl, ethyl, butyl, isobutyl, ethylhexyl or cyclolhexyl group), N-hydroxyethyl-N-methylacrylamide and N-2-acetamidoethyl-N-acetylacrylamide; a methacrylamide, for example, methacrylamide, an N-alkylmethacrylamide (the alkyl group of which is an alkyl group having from 1 to 10 carbon atoms, e.g., methyl, ethyl, tert-butyl, ethylhexyl, hydroxyethyl or cyclohexyl group), an N,N-dialkylmethacrylamide (the alkyl group of which includes, e.g., ethyl, propyl and butyl groups) and N-hydroxyethyl-N-methylmethacrylamide; an allyl compound, for example, an allyl ester (e.g., allyl acetate, allyl caproate, ally caprate, allyl laurate, allyl palmitate, allyl stearate, allyl benzoate, allyl acetoacetate or ally lactate) and allyl oxyethanol; a vinyl ether, for example, an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether or tetrahydrofurfuryl vinyl ether); a vinyl ester, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate or vinyl cyclohexylcarboxylate; a dialkyl itaconate, for example, dimethyl itaconate, diethyl itaconate or dibutyl itaconate, a monoalkyl or dialkyl fumarate, for example, dibutyl fumarate; and other monomers, for example, crotonic acid, itaconic acid, maleic acid, maleimide, acrylonitrile, methacrylonitrile or maleonitrile.

In addition, any addition-polymerizable unsaturated compounds copolymerizable with monomers corresponding to the repeating units described above may be employed.

A molar ratio of each repeating unit in the acid-decomposable resin of component (B) can be appropriately determined taking the adjustment of many factors including dry etching resistance of resist, standard developing solution aptitude, adhesion to substrate, resist profile, and other, characteristics ordinarily required for resist, for example, resolution, heat resistance and sensitivity into consideration.

Preferred embodiments of the acid-decomposable resin of component (B) according to the present invention include (1) resin (side chain type) containing a repeating unit having a partial structure including an alicyclic hydrocarbon represented by formula (pI), (pII), (pIII), (pIV), (pV) or (pVI).

(2) resin (main chain type) containing a repeating unit represented by formula (II-AB). The resin of (2) includes the following resin of (3).

(3) resin (hybrid type) containing a repeating unit represented by formula (II-AB), a maleic anhydride derivative and a (meth)acrylate structure.

A content of the repeating unit having a partial structure including an alicyclic hydrocarbon represented by formula (pI), (pII), (pIII), (pIV), (pV) or (pVI) is preferably from 30 to 70% by mole, more preferably from 35 to 65% by mole, and still more preferably from 40 to 60% by mole, based on the total repeating units in the acid-decomposable resin.

A content of the repeating unit represented by formula (II-AB) is preferably from 10 to 60% by mole, more preferably from 15 to 55% by mole, and still more preferably from 20 to 50% by mole, based on the total repeating units in the acid-decomposable resin.

A content of the repeating unit corresponding to the additional copolymerization component described above can be appropriately determined depending on the desired performance of resist. In general, the content is preferably 99% by mole or less, more preferably 90% by mole or less, and still more preferably 80% by mole or less, to the sum total of the repeating unit having a partial structure including an alicyclic hydrocarbon represented by formula (pI), (pI), (pIII), (pIV), (pV) or (pVI) and the repeating unit represented by formula (II-AB)

When the photosensitive composition of the present invention is used for ArF exposure, it is preferred that the acid-decomposable resin does not contain an aromatic group in order to ensure transparency of the ArF beam.

The acid-decomposable resin for use in the present invention can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent dissolving the composition of the present invention, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while beating, if desired. The initiator is further added or separately added, if desired. After the completion of the reaction, the reaction mixture is poured into a solvent to correct the resulting powder or solid, thereby obtaining the polymer. The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

A weight average molecular weight of the resin of component (B) for use in the present invention is preferably form 1,000 to 200,000 measured by a GPC method and calculated in terms of polystyrene. It is not preferred that the weight average molecular weight of the resin is less than 1,000, since the degradation of heat resistance and dry etching resistance may occur. On the other hand, when the weight average molecular weight of the resin is more than 200,000, undesirable results, for example, the degradation of developing property and film-forming property due to severe increase in viscosity may occur.

A content of the resin of component (B) in the positive photosensitive composition of the present invention is preferably from 40 to 99.99% by weight, and more preferably from 50 to 99.97% by weight, based on the total solid content of the photosensitive composition.

<<(C) Basic Compound>>

The positive photosensitive composition of the present invention contains a basic compound of component (C) for restraining fluctuations in performances occurred with the passage of time from exposure to heat treatment. For instance, linewidth of resist pattern tends to change depending on the period between the exposure and the heat treatment. By using the basic compound of component (C), such a change of linewidth is advantageously restrained.

In addition, in order to improve edge roughness of pattern and to restrain development defect, a mixture of at least two basic compounds having different structures of component (C-1) is used according to one embodiment of the present invention, The mixture of two or more basic compounds having different structures means a mixture or two or more basic compounds having different physical properties. The physical property includes for example, pKa, molecular size, melting point, boiling point, vapor pressure and log P. The pKa denotes pKa of a conjugate acid (of the basic compound).

For instance, a mixture of basic compounds having different pKa's may include not only a mixture of a basic compound having a low pKa and a basic compound having a high pKa but also a mixture of basic compounds having relatively low pKa's but slightly different pka's from each other and a mixture of basic compounds having relatively high pKa's but slightly different pka's from each other. Specifically, a difference of the pKa between two basic compounds is preferably not less than 0.1, and more preferably not less than 0.5.

The pKa is a measure of basicity of a basic nitrogen atom, and it is known that the pKa corresponds to a charge density on the nitrogen atom. The charge density of nitrogen atom can be determined by a molecular orbital calculation, for example, using MOPAC, A value of the charge density obtained by such a method is used as a measure of the basicity. Although various methods for the calculation are known, the calculation is ordinarily performed in the following manner. A molecular structure of the desired molecule is sterically optimized by molecular mechanics calculation (e.g., using a MM2 parameter), and a charge density is determined by MOPAC (using an AM1 parameter), which is a molecular orbital calculation method taking the electron state of molecule into consideration. With respect to the charge density, in case of using a mixture of two basic compounds, a difference of the charge densitiy on nitrogen atom between the compounds is preferably not less than 0.01, and more preferably not less than 0,02.

It is believed that the molecular size is a factor to control diffusibility. The molecular size indicates a size of molecule and is able to be digitalized in various manners. For example, a molecular structure of the desired molecule is sterically optimized by molecular mechanics calculation (e.g., using a MM2 parameter), and a surface area or volume is determined by MOPAC (using an PM3 parameter), which is a molecular orbital calculation method taking the electron state of molecule into consideration. In general, the volume is more preferably used than the surface area. Since the desired diffusibility, i.e., the desired molecular size may vary depending on the photosensitive composition, it is difficult to generally define an ideal size. However, it is ordinarily possible to control the diffusibility by a mixture of a basic compound having a large molecular size and a basic compound having a small molecular size. In case of using the volume value of molecule obtained by the above-described calculation method, a difference in the molecular size is preferably not less than 10 Å$^3$, and more preferably not less than 15 Å$^3$.

The melting point, boiling point and vapor pressure are factors that dominate volatility and compatibility of molecule, and they also may control distribution of the molecule in a resist film, in some cases. A difference in the melting point or boiling point is preferably not less than 10° C., and more preferably not less than 20° C.

The log P is known as an index representing hydrophilicity/hydrophobicity of molecule and it is an important factor relating to compatibility in a resist film. By mixing basic compounds having different log P's, distribution of the compounds in the resist film. A difference in the log P value is preferably not less than 0.2, and more preferably not less than 0.4.

As is apparent from the description above, to mix two or more basic compounds having different structures ordinarily results in a mixture of compounds having two or more different physical properties. However, a mixture of compounds in which only one physical property is different is sufficient for use in the present invention. Also, it should be noted that the values of difference are not restricted to the preferred ranges described above, respectively.

The basic compounds to be used preferably have a structure represented by any one of formulae (A) to (E) shown below.

(A)

In the above formula, $R^{250}$, $R^{251}$ and $R^{252}$ which may be the same or different, each independently represent a hydrogen atom, an alkyl group having from 1 to 20 carbon atoms, an aminoalkyl group having from 1 to 20 carbon atoms, a hydroxyalkyl group having from 1 to 20 carbon atoms or a substituted or unsubstituted aryl group having from 6 to 20 carbon atoms, or $R^{250}$ and $R^{251}$ may be combined with each other to form a ring, and the alkyl chain may contain an oxygen atom, a sulfur atom or a nitrogen atom,

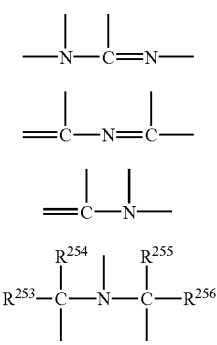

In the above formulae, $R^{253}$, $R^{254}$, $R^{255}$ and $R^{256}$. Which may be the same or different, each independently represent an alkyl group having from 1 to 6 carbon atoms.

Preferred examples of the basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, substituted or unsubstituted aminoalkylmorpholines, mono-, di- or trialkylamines, substituted or unsubstituted anilines, substituted or unsubstituted piperidines and mono- or diethanolamine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Preferred specific examples of the basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0]undec-7-ene, 2,4,5-triphenylimidazole, tri(n-butyl)amine, tri(n-octyl)amine, N-phenyldiethanolamine, N-hydroxyethylpiperidine, 2,6-diisopropylaniline and N-cyclohexyl-N'-morpholinoethylthiourea. However, the basic compounds for use in the present invention should not be limited thereto.

More preferred compounds include substituted or unsubstituted guanidines, substituted or unsubstituted aminopyrrolidines, substituted or unsubstituted pyrazoles, substituted or unsubstituted pyrazolines, substituted or unsubstituted piperazines, substituted or unsubstituted aminomorpholines, substituted or unsubstituted aminoalkylmorpholines and substituted or unsubstituted piperidines. Compounds having an imidazole structure, a diazabicyclo structure, an onium hydroxide structure, an onium carboxylate structure or an aniline structure are also preferred.

The compound having an imidazole structure includes imidazole, 2,4,5-triphenylimidazole and benzimidazole. The compound having a diazabicyclo structure includes 1,4-diazabicyclo[2.2.2]octane, 1,5-diazabicyclo[4.3.0]non-5-ene and 1,8-diazabicyclo[5.4.0]undec-7-ene. The compound having an onium hydroxide structure includes a triarylsulfonium hydroxide, phenacyl sulfonium hydroxide and a 2-oxoalkyl-containing sulfonium hydroxide, e.g., triphenylsulfonium hydroxide, tris(t-butylphenyl)sulfonium hydroxide, bis(tert-butylphenyl)iodonium hydroxide, phenacyl thiophenium hydroxide or 2-oxopropylthiophenium hydroxide. The compound having an onium carboxylate structure includes a compound wherein an anion portion of the compound having an onium hydroxide structure is replaced by a carboxylate, e.g., acetate, adamantane-1-carboxylate or a perfluoroalkyl carboxylate. The compound having an aniline structure includes 2,6-diisopropylaniline and N,N-dimethylaniline. The basic compound for use in the present invention should not be construed as being limited to these specific examples.

According to one embodiment of the present invention, a mixture of at least two basic compounds having different structures of component (C-1), which are appropriately selected from the basic compounds described above, is used as the basic compound of component (C), Specifically, for example, two basic compounds having different structures, three basic compounds having different structures or four or more basic compounds having different structures may be used. In case of using at least two basic compounds having different structures, it is preferred that an amount of the basic compound that is used in the smallest amount is not less than 10% by weight base on the total amount of the basic compounds used. By using at least two basic compounds having different structures according to the present invention, the edge Toughness of patterns improved and the development defect is restrained.

Specific examples of preferred combination of the basic compounds include a combination of tri(n-butylamine) and diisopropylaniline, a combination of tri(n-butylamine) and N,N-dimethylpyridine, a combination of tri(n-butylamine) and 1,8-diazabicyclo[5.4.0]undec-7-ene, a combination of tri(n-butylamine) and triphenylimidazole, a combination of diisopropylaniline and N,N-dimethylpyridine, a combination of diisopropylaniline and 1,8-diazabicyclo[5.4.0]undec-7-ene, a combination of diisopropylaniline and triphenylimidazole, a combination of 1,5-diazabicyclo[4.3.0]non-5-ene and antipyrine, a combination of diisopropylaniline and dicyclohexylmethylamine, a combination of antipyrine and tri(n-butylamine), a combination of hydroxyantipyrine and antipyrine, a combination of tetramethylammonium hydroxide and diisopropylaniline, a combination of tetramethylammonium hydroxide and tetrabutylammonium hydroxide, a combination of tetramethylammonium hydroxide and tri(n-butylamine), a combination of diisopropylaniline, dicyclohexylmethylamine and tri(n-butylamine), a combination of tri(n-butylamine), 1,8-diazabicyclo[5.4.0]undec-7-ene and diisopropylaniline, and a combination of tri(n-butylamine), 1,8-diazabicyclo[5.4.0]undec-7-ene and diisopropylaniline.

The total amount of two or more basic compounds used is ordinarily from 0.001 to 10% by weight, and preferably 0.01 to 5% by weight, based on the solid content of the positive photosensitive composition. When the amount is less than 0.001% by weight, the effect of addition of basic compounds is not obtained. When the amount exceeds 10% by weight, on the other hand, the sensitivity tends to decrease or the developability tends to degrade in the unexposed area.

According to another embodiment of the present invention, a basic compound containing a substituted or unsubstituted aliphatic hydrocarbon group having not less than 8 carbon atoms, and preferably from 8 to 19 carbon atoms, of component (C-2) is used as the basic compound of component (C).

The basic compound of component (C-2) has at least one substituted or unsubstituted aliphatic hydrocarbon group having not less than 8 carbon atoms in the molecules thereof and may naturally contain two or more substituted or unsubstituted aliphatic hydrocarbon groups each having not less than 8 carbon atoms.

Examples of the substituted or unsubstituted aliphatic hydrocarbon group having not less than 8 carbon atoms include n-octyl, isooctyl, tert-octyl, n-nonyl, isononyl, tert-nonyl, n-decyl, isodecyl, tert-decyl, n-undecyl, isoundecyl, tert-undecyl, n-dodecyl, isododecyl tert-dodecyl, n-tridecyl, isotridecyl, tert-tridecyl, n-tetradecyl, isotetradecyl, tert-tetradecyl, n-pentadecyl, isopentadecyl, tert-pentadecyl, n-hexadecyl, isohexadecyl, tert-hexadecyl, n-heptadecyl, isoheptadecyl, tert-heptadecyl, n-octadecyl, isooctadecyl, tert-octadecyl, n-nonadecyl, isononadecyl and tert-nonadecyl groups. These groups may be substituted with a substituent. Examples of the substituent include an alkyl group, for example, methyl, ethyl, n-propyl, isopropyl, n-butyl, isobutyl or tert-butyl group, an aralkyl group, for example, benzyl group, an aryl group, for example, phenyl group, an allyl group and a halogen atom.

The aliphatic hydrocarbon group more preferably has from 10 to 19 carbon atoms.

Examples of the basic compound containing a substituted or unsubstituted aliphatic hydrocarbon group having not less than 8 carbon atoms are set forth below, but the present invention should not be construed as being limited thereto.

Octylamine, dioctylamine, trioctylamine, dioctylmethylamine, nonylamine, dinonylamine, trinonylamine, dinonylmethylamine, decylamine, didecylamine, tridecylamine, didecylmethylamine, undecylamine, diundecylamine, triundecylamine, diundecylmethylamine, dodecylamine, didodecylamine, tridodecylamine, didodecylmethylamine, tridecylamine, ditridecylamine, tritridecylamine, ditridecylmethylamine, tetradecylamine, ditetradecylamine, tritetradecylamine, ditetradecylmethylamine, pentadecylamine, dipentadecylamine, tripentadecylamine, dipentadecylmethylamine, hexadecylamine, dihexadecylamine, trihexadecylamine, dihexadecylmethylamine, heptadecylamine, diheptadecylamine, triheptadecylamine, diheptadecylmethylamine, octadecylamine, dioctadecylamine, trioctadecylamine, dioctadecylmethylamine, nonadecylamine, dinonadecylamine, trinonadecylamine, dinonadecylmethylamine, isooctylamine, diisooctylamine, triisooctylamine, isooctylmethylamine, isononylamine, diisononylamine, triisononylamine, diisononylmethylamine, isodecylamine, diisodecylamine, triisodecylamine, diisodecylmethylamine, isoundecylamine, diisoundecylamine, triisoundecylamine, diisoundecylmethylamine, isododecylamine, diisododecylamine, triisododecylamine, diisododecylmethylamine, triisodecylamine, diisotridecylamine, triisotridecylamine, diisotridecylmethylamine, isotetradecylamine, diisotetradecylamine, triisotetradecylamine, diisotetradecylmethylamine, isopentadecylamine, diisopentadecylamine, triisopentadecylamine, diisopentadecylmethylamine, isohexadecylamine, diisohexadecylamine, triisohexadecylamine, diisohexadecylmethylamine, isoheptadecylamine, diiisoheptadecylamine, triisoheptadecylamine, diisoheptadecylmethylamine, isooctadecylamine, diisooctadecylamine, triisooctadecylamine, diisooctadecylmethylamine, isononadecylamine, diisononadecylamine, triisononadecylamine, diisononadecylmethylamine.

Of these compounds, tridecylamine, tetradecylamine, pentadecylamine, hexadecylamine, octadecylamine, didecylamine, methyloctadecylamine, triisodecylamine, N,N-dimethylundecylamine, N,N-dimethyldodecylamine, tridodecylamine, methyldioctadecylamine and trioctylamine are more preferred.

The basic compound of component (C-2) can be used in combination with a conventionally known basic compound. Examples of the basic compound suitable for use in combination with the basic compound of component (C-2) include a nitrogen-containing basic compound.

The nitrogen-containing basic compound used is suitably that does not sublime and deteriorate the resist performances, and includes, for example, an organic amine, a basic ammonium salt and a basic sulfonium salt.

Of the nitrogen-containing basic compounds, organic amines are preferred in view of excellent image characteristics. For example, the basic compounds described in JP-A-63-149640, JP-A-5-249662, JP-A-5-127369, JP-A-5-289322, JP-A-5-249683, JP-A-5-289340, JP-A-5-232706, JP-A-5-252282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-W-7-508840 (the term "JP-W" as used herein means an "unexamined published international patent application"), and U.S. Pat. Nos. 5,525,453, 5,629,134 and 5,667,938 are employed.

Specific preferred examples of nitrogen-containing basic compound include 1,5-diazabicyclo[4.3.0]non-5-ene, 1,8-diazabicyclo[5.4.0]undec-7-ene, 1,4-diazabicyclo[2.2.2]octane, 4-dimethylaminopyridine, 1-naphthylamine, piperidine, hexamethylenetetramine, an imidazole, a hydroxypyridine, a pyridine, 4,4'-diaminodiphenyl ether, pyridinium p-toluenesulfonate, 2,4,6-trimethylpyridinuim p-toluenesulfonate, tetramethylammonium p-toluenesulfonate, tetrabutylammonium lactate, triethylamine and tributylamine.

Of these compounds, organic amines, for example, 1,5-diazabicyclo[4.3.0]non-5-ene, 1,8-diazabicyclo[5.4.0]undec-7-ene, 1,4-diazabicyclo[2.2.2]octane, 4-dimethylaminopyridine, 1-naphthylamine, piperidine, hexamethylenetetramine, an imidazole, a hydroxypyridine, a pyridine, 4,4'-diaminodiphenyl ether, triethylamine and tributylamine are more preferred.

The basic compounds of component (C-2) may be used individually or as a mixture of two or more thereof, The total amount of basic compound including the basic compound containing a substituted or unsubstituted aliphatic hydrocarbon group having not less than 8 carbon atoms and other basic compounds used in combination is ordinarily from 0.001 to 10% by weight, and preferably 0.01 to 5% by weight, based on the solid content of the positive photosensitive composition. When the amount is less than 0.001% by weight, an effect of the addition of basic compound is not obtained. When the amount exceeds 10% by weight, on the other hand, the sensitivity tends to decrease or the developability tends to degrade in the unexposed area.

A mixing ratio of the basic compound containing a substituted or unsubstituted aliphatic hydrocarbon group having not less than 8 carbon atoms to other basic compounds used in combination is ordinarily from 10/90 to 90/10 by weight, preferably from 15/85 to 85/15 by weight, and more preferably from 20/80 to 80/20 by weight.

According to still another embodiment of the present invention, a basic compound selected from an oxygen-containing primary aliphatic amine, an oxygen-containing secondary aliphatic amine and an oxygen-containing tertiary aliphatic amine, of component (C-3) is used as the basic compound of component (C). The oxygen-containing primary aliphatic amine means a primary amine represented by R—NH$_2$, wherein R represents a group containing an oxygen atom. Preferably, the group represented by R includes an ether bond. To the oxygen-containing secondary aliphatic amine and oxygen-containing tertiary aliphatic amine, the above described explanation is also applied.

Examples of the primary, secondary or tertiary oxygen-containing aliphatic amine include methoxyethoxyethylamine, bis(methoxyethoxyethyl)amine, tris[2-(methoxymethoxy)ethyl]amine, tris[2-(methoxyethoxy)ethyl]amine, tris(2-[(2-methoxyethoxymethoxy)ethyl]amine, tris[2-(2-methoxyethoxy)ethyl]amine, tris[2-(1-methoxyethoxy)ethyl]amine, tris[2-(1-ethoxypropoxy)ethyl]amine, tris[2-(2-(2-hydroxyethoxy)ethoxy]ethyl)amine, 4,7,13,16,21,24-hexaoxa-1,10-diazabicyclo[8.8.8]hexacosane, 4,7,13,18-tetraoxa-1,10-diazabicyclo[8.5.5]eicosane and 1,4,10,13-tetraoxa-7,16-diazabicyclooctadecane.

As the basic compound of component (C-3), for example, trismethoxymethoxyethylamine and trismethoxyethoxyethylamine are more preferably used.

The basic compound of component (C-3) can be used in combination with a conventionally known basic compound that does not contain an oxygen atom. Examples of the basic compound suitable for use in combination with the basic compound of component (C-3) include a nitrogen-containing basic compound.

The nitrogen-containing basic compound used is suitably that does not sublime and deteriorate the resist performances, and includes, for example, an organic amine, a basic ammonium salt and a basic sulfonium salt.

Of the nitrogen-containing basic compounds, organic amines are preferred in view of excellent image characteristics. For example, the basic compounds described in JP-A-63-149640, JP-A-5-249662, JP-A-5-127369, JP-A-5-289322, JP-A-5-249663, JP-A-5-289340, JP-A-5-232706, JP-A-5-252282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-W-7-508840 (the term "JP-W" as used herein means an "unexamined published international patent application"), and U.S. Pat. Nos. 5,525,453, 5,629,134 and 5,667,938 are employed.

Specific preferred examples of nitrogen-containing basic compound include 1,5-diazabicyclo[4.3.0]non-5-ene, 1,8-diazabicyclo[5.4.0]undec-7-ene, 1,4-diazabicyclo[2.2.2]octane, 4-dimethylaminopyridine, 1-naphthylamine, piperidine, hexamethylenetetramine, an imidazole, a hydroxypyridine, a pyridine, 4,4'-diaminodiphenyl ether, pyridinium p-toluenesulfonate, 2,4,6-trimethylpyridinuim p-toluenesulfonate, tetramethylammonium p-toluenesulfonate, tetrabutylammonium lactate, triethylamine and tributylamine.

Of these compounds, organic amines, for example, 1,5-diazabicyclo[4.3.0]non-5-ene, 1,8-diazabicyclo[5.4.0]undec-7-ene, 1,4-diazabicyclo[2.2.2]octane, 4-dimethylaminopyridine, 1-naphthylamine, piperidine, hexamethylenetetramine, an imidazole, a hydroxypyridine, a pyridine, 4,4'-diaminodiphenyl ether, triethylamine and tributylamine are more preferred.

The basic compounds of component (C-3) nay be used individually or as a mixture of two or more thereof. The total amount of basic compound including the oxygen-containing primary, secondary or tertiary aliphatic amine and other basic compounds (C') used in combination is ordinarily from 0.001 to 10% by weight, and preferably 0.01 to 5% by weight, based on the solid content of the positive photosensitive composition. When the amount is less than 0.001% by weight, an effect of the addition of basic compound is not obtained. When the amount exceeds 10% by weight, on the other hand, the sensitivity tends to decrease or the developability tends to degrade in the unexposed area.

A mixing ratio of the oxygen-containing primary, secondary or tertiary aliphatic amine to other basic, compounds (CI) used in combination is ordinarily from 10/90 to 90/10 by weight, preferably from 15/85 to 85/15 by weight, and more preferably from 20/80 to 80/20 by weight.

<(D) Fluorine-base and/or Silicon-base Surface Active Agent>

It is preferred that the positive photosensitive composition of the present invention contains one or more of fluorine-base and/or silicon-base surface active agent (a fluorine atom-containing surface active agent, a silicon atom-containing surface active agent and a surface active agent containing both a fluorine atom and a silicon atom).

By the addition of the surface active agent of component (D), the positive photosensitive composition of the present invention can provide, at high sensitivity and good resolution, resist patterns having good adhesion and less defect in development, when an exposure light source of 250 nm or less, especially 220 nm or less is used.

Specific examples of the surface active agent of component (D) include those as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. Commercially available surface active agents described below may also be used as they are.

Examples of the commercially available surface active agent used include fluorine-base or silicon-base surface active agents, e.g., Eftop EFS301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corps). A polysiloxane polymer KP-341 (manufactured by Shin-Etsu Chemical Co., Ltd.) is also used as a silicon-base surface active agent.

The amount of surface active agent used is preferably from 0.0001 to 2% by weight, and more preferably from 0.001 to 1% by weight, based on the total amount of the positive photosensitive composition (excluding a solvent).

<(E) Organic Solvent>

The positive photosensitive composition of the present invention is used by dissolving the above-described components in the desired organic solvent.

Examples of the organic solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethyformamide, dimethylsulfoxide, N-methylpyrrolidone and tetrahydrofuran.

In the present invention, it is preferred to use a mixed solvent comprising a mixture of a solvent containing a hydroxy group and a solvent free from a hydroxy group. The use of such a mixed solvent makes it possible to restrain the generation of particles during storage of the resist solution.

Examples of the hydroxy group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Of these solvents, propylene glycol monomethyl ether and ethyl lactate are particularly preferred.

Examples of the solvent free from a hydroxy group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Of these solvents, propylene glycol monomethyl ether acetate, ethyl ethoxypropionate 2-heptanone, γ-butyrolactone, cyclohexanone and butyl acetate are particularly preferred, and propylene glycol monomethyl ether acetate, ethyl ethoxypropionate and 2-heptanone are most preferred.

A mixing ratio (by weight) of the hydroxy group-containing solvent to the solvent free from a hydroxy group ranges from 1/99 to 99/1, preferably from 10/90 to 90/10, and more preferably from 20/80 to 60/40. A mixed solvent containing not less than 50% by weight of the solvent free from a hydroxy group is also particularly preferred in view of uniform coating.

<(F) Acid Decomposable Dissolution Inhibiting Compound>

It is preferred that the positive photosensitive composition of the present invention contains a dissolution inhibiting low molecular weight compound of component (F) (hereinafter also referred to as an "acid decomposable dissolution inhibiting compound") having a group capable of being decomposed by the action of an acid to increase solubility in an alkali developing solution and having a molecular weight of not more than 3,000.

In order to prevent deterioration in transmittance at 220 nm or less, an alicyclic or aliphatic compound having an acid decomposable group, for example, a cholic acid derivative having an acid decomposable group as described in *Proceeding of SPIE*, 2724, 355 (1966) is preferred as the acid decomposable dissolution inhibiting compound of component (F). Examples of the acid decomposable group and alicyclic structure are similar to those described regarding the acid decomposable resin of component (B) above.

The amount of acid decomposable dissolution inhibiting compound of component (F) used is preferably from 3 to 50% by weight, and more preferably 5 to 40% by weight, based on the solid content of the total positive photosensitive composition.

Specific examples of the acid decomposable dissolution inhibiting compound of component (F) are set forth below, but the present invention should not be construed as being limited thereto.

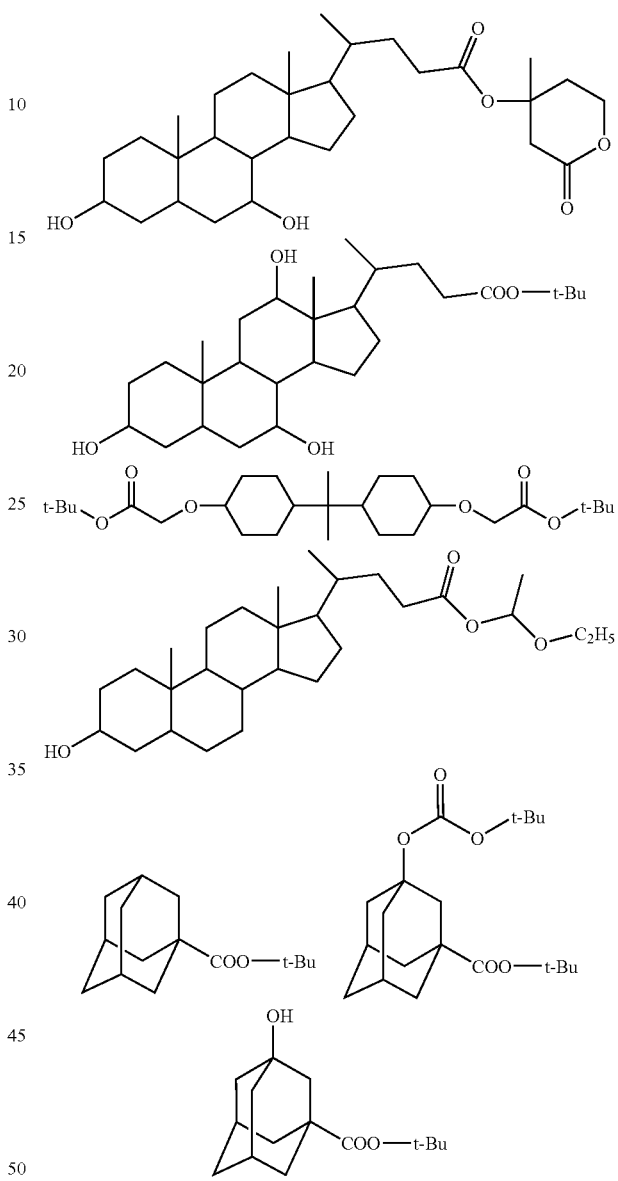

<(G) Alkali-soluble Resin>

The positive photosensitive composition of the present invention may contain a resin of component (G), which does not contain an acid-decomposable group, insoluble in water but soluble in an alkali developing solution. By the addition of such a resin, the sensitivity of the photosensitive composition can be improved.

In the present invention, a novolac resin having a molecular weight of from about 1,000 to about 20,000 and a polyhydroxystyrene derivative having a molecular weight of from about 3,000 to about 50,000 are used as such a resin. Since these resins have a large absorption of light of 250 nm or less, they are preferably used after being subjected to partial hydrogenation or in an amount not larger than 30% by weight based on the total amount of resin.

Resins having a carboxy group as an alkali-solubilizing group are also used. The carboxy group-containing resin preferably has a monocyclic or polycyclic alicyclic hydrocarbon group for improving dry etching resistance. Specific examples of such a resin include a methacrylic ester/(meth)acrylic acid copolymer having an alicyclic hydrocarbon structure which does not exhibit acid decomposability and a (meth)acrylic ester resin containing an alicyclic hydrocarbon group having a carboxy group at the terminal thereof.

<Other Additives>

Into the positive photosensitive composition of the present invention, a dye, a plasticizer, a surface active agent other than the surface active agent of component (D), a photosensitizer and a compound for promoting dissolution in a developing solution may be incorporated.

The dissolution promoting compound in a developing solution for use in the present invention is a low molecular weight compound having a molecular weight of not more than 1,000 and having at least two phenolic hydroxy groups or at least one carboxy group. In case of containing a carboxy group, an alicyclic or aliphatic compound is preferred because of the same reason as described above.

The amount of dissolution promoting compound used is preferably from 2 to 50% by weight, and more preferably from 5 to 30% by weight, based on the resin capable of being decomposed by the action of an acid to increase solubility in an alkali developing solution of component (B). The amount exceeding 50% by weight is not preferred, because another problem of the increase in development residue or the deformation of patterns at development may occur, such a phenolic compound having a molecular weight of not more than 1,000 can be easily synthesized by one skilled in the art with reference to methods as described, for example, in JP-A-4-122938, JP-A-2-28531, U.S. Pat. No. 4,916,210 and European Patent 219,294.

Specific examples of the carboxy group-containing alicyclic or aliphatic compound include a carboxylic acid derivative having a steroid structure, e.g., cholic acid, deoxycholic acid or lithocholic acid, an adamantanecarboxylic acid derivative, adamantanedicarboxylic acid, cyclohexanecarboxylic acid and cyclohexanedicarboxylic acid, but the present invention should not be construed as being limited thereto.

To the photosensitive composition of the present invention, a surface active agent other than the fluorine-base and/or silicon-base surface active agent of component (D) may be added, Specific examples of such surface active agent include a nonionic surface active agent, for example, a polyoxyethylene alkyl ether, e.g., polyoxyethylene lauryl ether, polyoxyethylene stearyl ether, polyoxyethylene alkyl ether or polyoxyethylene oleyl ether, a polyoxyethylene alkyl aryl ether, e.g., polyoxyethylene octyl phenol ether or polyoxyethylene nonyl phenol ether, a polyoxyethylene/polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tristearate, and a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The surface active agents may be used individually or in combination of two or more thereof, <Method for Use>

The positive photosensitive composition of the present invention is applied onto a desired substrate after dissolving the above components in a desired organic solvent, preferably in the mixed solvent as described above.

Specifically, the positive photosensitive composition is applied to a substrate (e.g., silicon/silicon dioxide coating) as used for the production of a precision integrated circuit element by appropriate coating means, for example, a spinner or a coater.

After the application of positive photosensitive composition, the resulting photosensitive layer is exposed to light through a desired mask, followed by baking and development, Thus, good resist patterns are obtained. As light for the exposure, a far ultraviolet ray having preferably a wavelength of 250 nm or shorter, and more preferably 220 nm or shorter is used. Specific examples thereof include a KrF excimer laser beam (248 nm), an ArF excimer laser beam (193 nm), an $F_2$ excimer laser bean (157 nm), an X-ray and an electron beam.

In the development step, a developing solution as described below is used. The developing solution for the positive photosensitive composition of the present invention includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A developing solution prepared by adding an appropriate amount of an alcohol or a surface active agent to the aqueous alkaline solution is also used.

The present invention is described in more detail with reference to the following examples, but the present invention should not be construed as being limited thereto.

SYNTHESIS EXAMPLE OF RESIN

Synthesis Example (1)

Synthesis of Resin (1) (Side Chain Type)

2-Ethyl-2-adamantyl methacrylate and butyrolactone methacrylate in a molar ratio of 55/45 were dissolved in a mixed solvent of methyl ethyl ketone and tetrahydrofuran (5/5 in volume) to prepare 100 ml of a solution having a solid concentration of 20% by weight. To the solution was added 2% by mole of V-65 manufactured by Wako Pure Chemical Industries, Ltd., and the solution was added dropwise to 10 ml of methyl ethyl ketone heated at 60° C. under a nitrogen gas stream over a period of 4 hours. After the completion of the addition, the reaction solution was heated for 4 hours and 1% by mole of V-65 was again added thereto, followed by stirring for 4 hours. Then, the reaction solution was cooled to room temperature and poured into 3 liters of a mixed solvent of distilled water and isopropyl alcohol (1/1 in volume) to crystallize, and the white powder deposited was recovered to obtain Resin (1).

A monomer unit composition ratio of the resin determined by $C^{13}$NMR was 46/54. A weight average molecular weight thereof measured by GPC method and calculated in terms of standard polystyrene was 10,700.

Resins (2) to (18) were synthesized in a similar manner to Synthesis Example (1) respectively. The monomer unit composition ratio and weight average molecular weight of each of Resins (2) to (18) are shown in Table 1 below. In Table 1, Repeating Units 1, 2, 3 and 4 denote the repeating units of Resins (2) to (18) shown below in order from left to right, respectively.

TABLE 1
| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 2 | 53 | 40 | 7 | — | 13,400 |
| 3 | 46 | 34 | 20 | — | 9,400 |
| 4 | 42 | 31 | 27 | — | 8,300 |
| 5 | 49 | 42 | 9 | — | 9,900 |
| 6 | 42 | 30 | 28 | — | 10,300 |
| 7 | 39 | 35 | 26 | — | 8,900 |
| 8 | 46 | 22 | 30 | 2 | 12,900 |
| 9 | 42 | 20 | 32 | 6 | 11,600 |
| 10 | 46 | 42 | 12 | — | 9,200 |
| 11 | 38 | 32 | 30 | — | 11,300 |
| 12 | 42 | 18 | 38 | 2 | 13,800 |
| 13 | 38 | 31 | 29 | 2 | 11,100 |
| 14 | 50 | 31 | 19 | — | 11,700 |
| 15 | 35 | 6 | 16 | 43 | 13,200 |
| 16 | 50 | 20 | 20 | 10 | 11,500 |
| 17 | 50 | 40 | 10 | — | 12,300 |
| 18 | 40 | 10 | 40 | 10 | 11,300 |
Structures of Resins (1) to (18) are shown below.
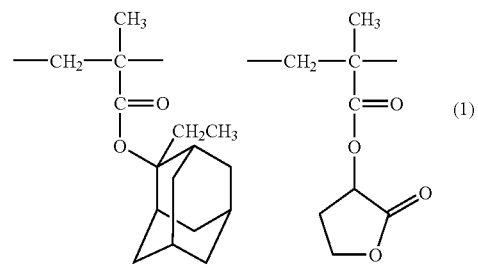
(1)
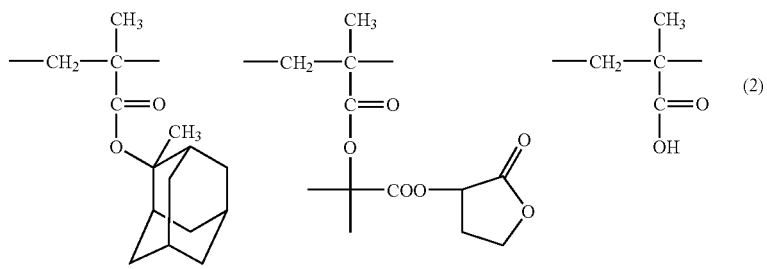
(2)
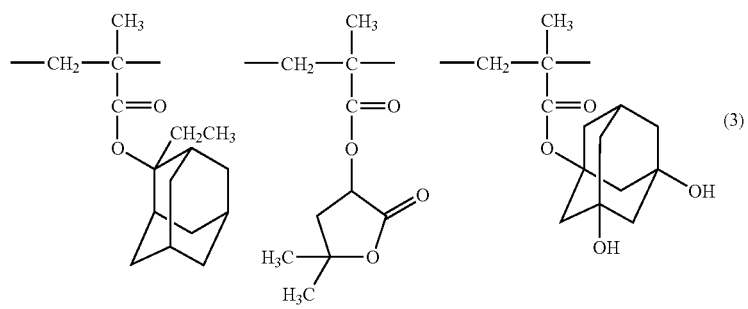
(3)

TABLE 1-continued
| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
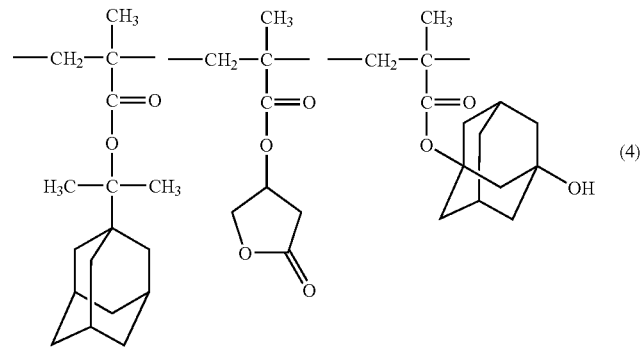
(4)
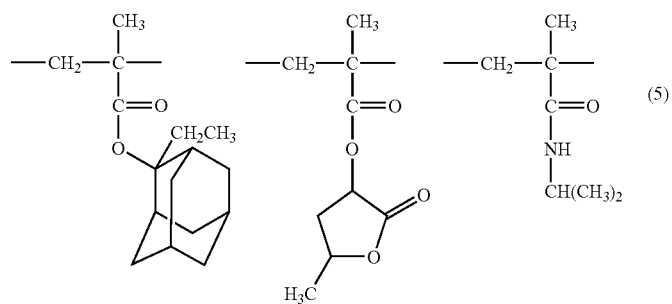
(5)
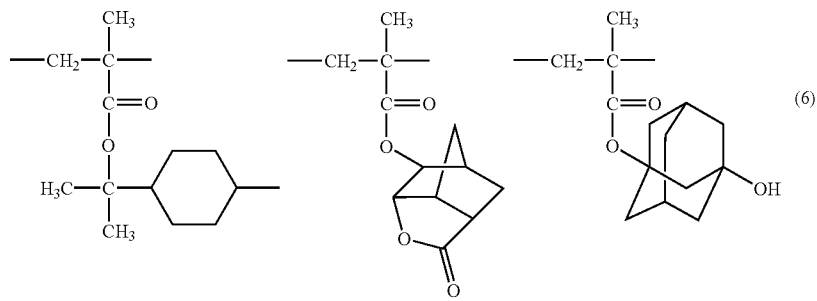
(6)
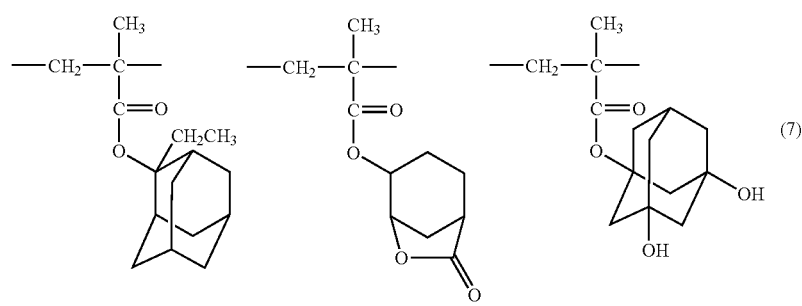
(7)

TABLE 1-continued
| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
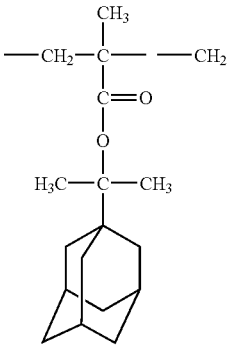
(8)
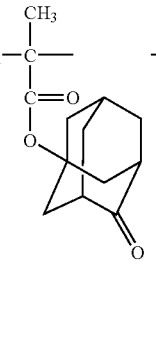
(9)
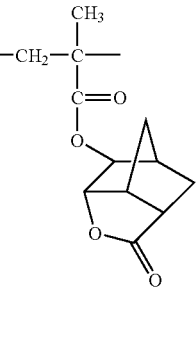
(10)
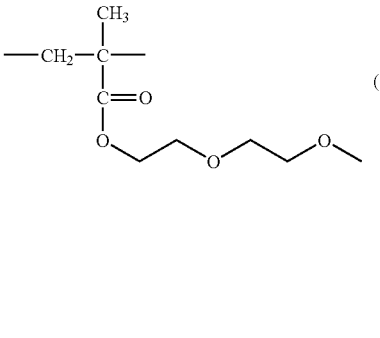
(11)

TABLE 1-continued

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| (12) | | | | | |
| (13) | | | | | |
| (14) | | | | | |
| (15) | | | | | |

TABLE 1-continued

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| (16) | | | | | |
| (17) | | | | | |
| (18) | | | | | |

Synthesis Example (2)

Synthesis of Resin (19) (Main Chain Type)

Into a separable flask were put tert-butyl ester of norbornenecarboxylic acid, butyrolactone ester of norbornenecarboxylic acid and maleic anhydride in a molar ratio of 40/10/50 and tetrahydrofuran in an amount necessary for forming a solution having a reaction concentration of 60% by weight, and the solution was heated at 60° C. under a nitrogen gas stream. After the reaction temperature was stabilized, 2% by mole of a radical initiator (V-601 manufactured by Wako Pure Chemical Industries, Ltd.) was added to initiate a reaction. After heating for 12 hours, the reaction mixture was diluted twice with tetrahydrofuran and poured into a solvent mixture of hexane and isopropyl alcohol (1/1 in volume) to deposit white powder. The powder was collected by filtration and dried to obtain Resin (19).

Resin (19) was subjected to molecular weight analysis by a GPC method and it was found that a weight average molecular weight thereof calculated in terms of polystyrene was 8,300. A molar ratio of repeating units corresponding to the tert-butyl ester of norbornenecarboxylic acid, butyrolactone ester of norbornenecarboxylic acid and maleic anhydride determined from an NMR spectrum was 42/8/50.

Resins (20) to (30) were synthesized in a similar manner to Synthesis Example (2) respectively, The monomer unit composition ratio and weight average molecular weight of each of Resins (20) to (30) are shown in Table 2 below. In Table 2, Alicyclic Olefin Units 1, 2 and 3 denotes the repeating units of Resins (80) to (30) shown below in order from left to right, respectively.

TABLE 2
| Resin | Alicyclic Olefin Unit 1 (mol %) | Alicyclic Olefin Unit 2 (mol %) | Alicyclic Olefin Unit 3 (mol %) | Maleic Anhydride Unit (mol %) | Weight Average Molecular Weight |
|---|---|---|---|---|---|
| 20 | 35 | 15 | — | 50 | 8,200 |
| 21 | 20 | 30 | — | 50 | 8,600 |
| 22 | 36 | 14 | — | 50 | 9,100 |
| 23 | 31 | 19 | — | 50 | 7,900 |
| 24 | 35 | 5 | 10 | 50 | 8,300 |
| 25 | 33 | 17 | — | 50 | 8,500 |
| 26 | 38 | 12 | — | 50 | 8,900 |
| 27 | 31 | 6 | 13 | 50 | 8,100 |
| 28 | 33 | 7 | 10 | 50 | 9,100 |
| 29 | 40 | 10 | — | 50 | 9,300 |
| 30 | 34 | 16 | — | 50 | 8,800 |
Structures of Resins (19) to (30) are shown below.
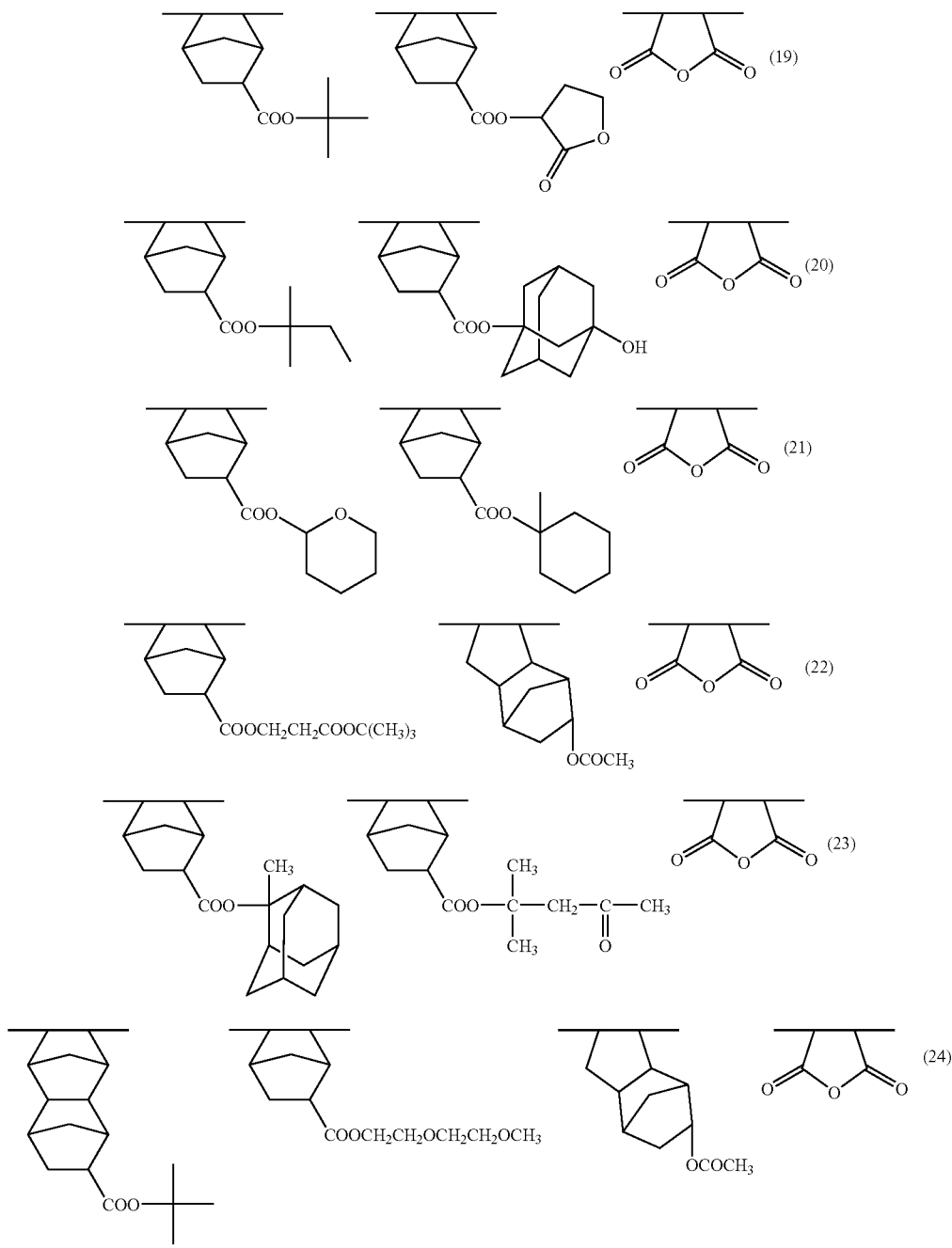

TABLE 2-continued

| Resin | Alicyclic Olefin Unit 1 (mol %) | Alicyclic Olefin Unit 2 (mol %) | Alicyclic Olefin Unit 3 (mol %) | Maleic Anhydride Unit (mol %) | Weight Average Molecular Weight |
|---|---|---|---|---|---|

(25)

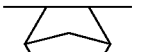

(26)

(27)

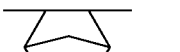

(28)

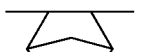

(29)

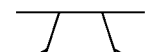

(30)

Synthesis Example (3)

Synthesis of Resin (31) (Hybrid Type)

Into a reaction vessel were put norbornene, maleic anhydride, tert-butyl acrylate and 2-methyloyclohexyl-2-propyl acrylate in a molar ratio of 35/35/20/10 and dissolved in tetrahydrofuran to form a solution having a solid content of 60% by weight, and the solution was heated at 65° C. under a nitrogen gas stream. After the reaction temperature was stabilized, 1% by mole of a radical initiator (V-601 manufactured by Wako Pure Chemical Industries, Ltd.) was added to initiate a reaction. After heating for 8 hours, the reaction mixture was diluted twice with tetrahydrofuran and poured into hexane of five times in volume to deposit white powder. The powder was collected by filtration and dissolved in methyl ethyl ketone and the solution was poured into a mixed solvent of hexane and tert-butyl methyl ether (1/1 in volume) of five times in volume to reprecipitate. The white powder deposited was collected by filtration and dried to obtain Resin (31).

Resin (31) was subjected to molecular weight analysis by a GPC method and it was found that a weight average molecular weight thereof calculated in terms of polystyrene was 12,100. A molar ratio of repeating units corresponding to the norbornene, maleic anhydride, tert-butyl acrylate and 2-methylcyclohexyl-2-propyl acrylate determined from an NMR spectrum was 32/39/19/10.

Resins (32) to (44) were synthesized in a similar manner to Synthesis Example (3) respectively. The unit composition ratio and weight average molecular weight of each of Resins (32) to (44) are shown in Table 3 below. In Table 3, Norbornene Unit, Acid Anhydride Unit and (Meth)acrylate Unit denotes the repeating units of Resins (32) to (44) shown below in order from left to right, respectively.

TABLE 3

| Resin | Norbornene Unit (mol %) | Acid Anhydride Unit (mol %) | (Meth)acrylate Unit (mol %) | Weight Average Molecular Weight |
|---|---|---|---|---|
| 32 | 20/15 | 40 | 15/10 | 11,900 |
| 33 | 32 | 37 | 20/8/3 | 10,500 |
| 34 | 16 | 21 | 36/27 | 13,900 |
| 35 | 15 | 22 | 34/29 | 12,300 |
| 36 | 17 | 20 | 33/30 | 12,400 |
| 37 | 18 | 24 | 32/26 | 13,000 |
| 38 | 15 | 19 | 36/30 | 12,700 |
| 39 | 15 | 20 | 29/10/26 | 13,100 |
| 40 | 17 | 21 | 31/31 | 12,800 |
| 41 | 18 | 17/3 | 30/32 | 13,300 |
| 42 | 16 | 19 | 31/12/11/11 | 12,600 |
| 43 | 20 | 22 | 58 | 14,700 |
| 44 | 23 | 28 | 35/14 | 13,300 |

Structures of Resins (31) to (44) are shown below.

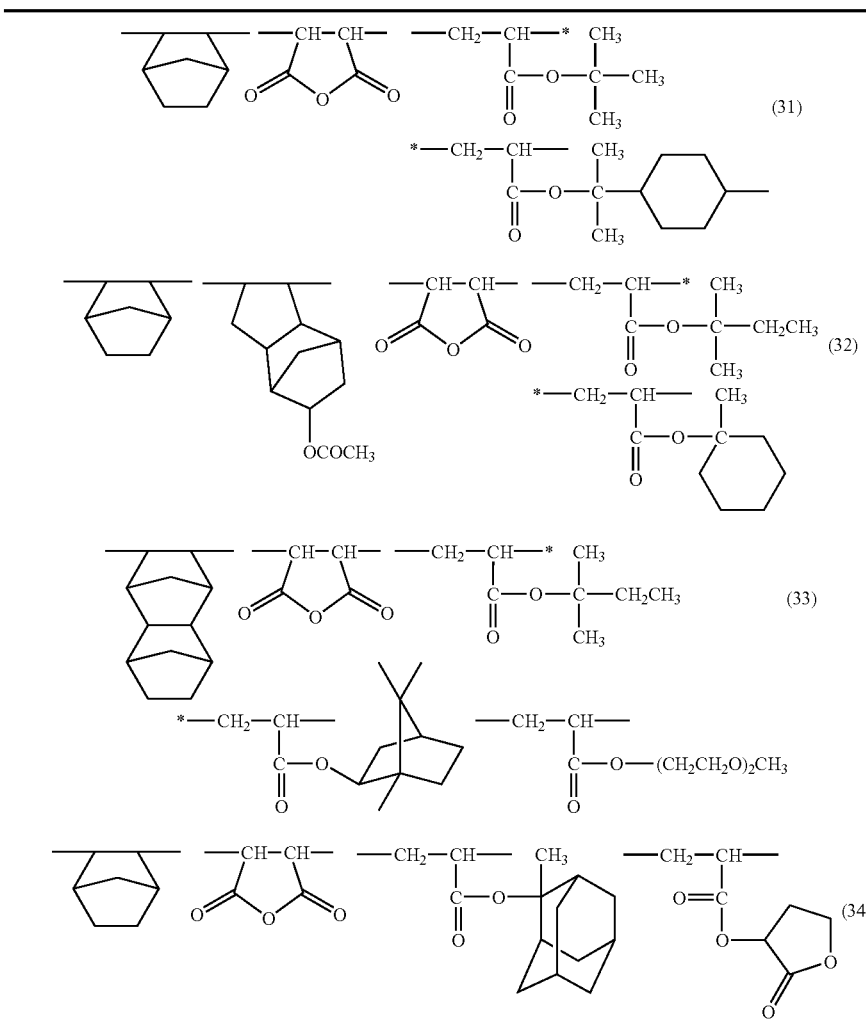

TABLE 3-continued
| | | Acid | | Weight Average |
|---|---|---|---|---|
| Resin | Norbornene Unit (mol %) | Anhydride Unit (mol %) | (Meth)acrylate Unit (mol %) | Molecular Weight |
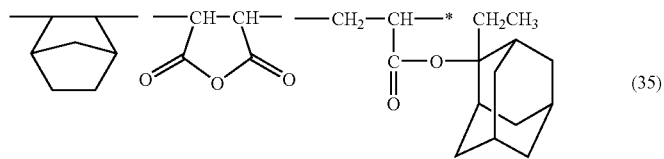
(35)
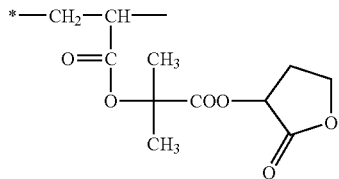
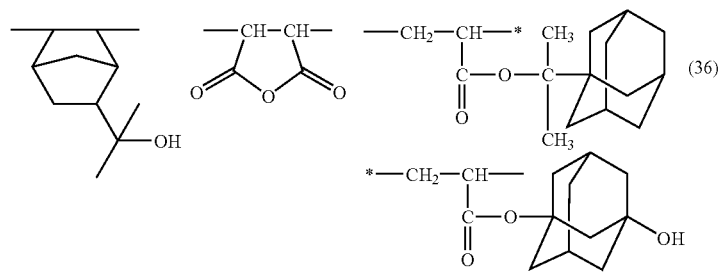
(36)
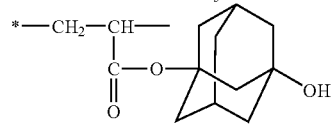
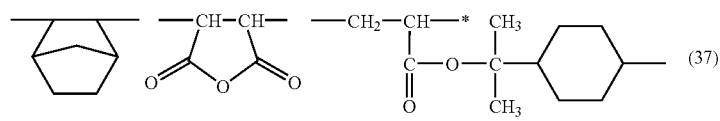
(37)
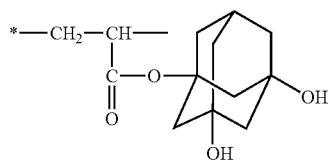
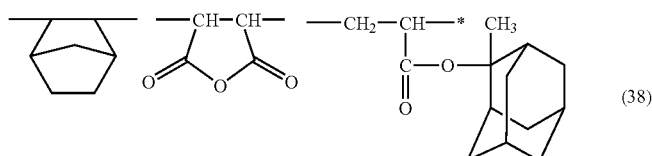
(38)
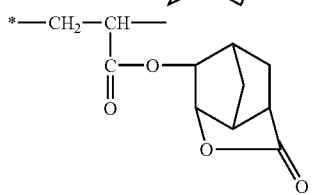

TABLE 3-continued
| | | Acid | | Weight Average |
|---|---|---|---|---|
| Resin | Norbornene Unit (mol %) | Anhydride Unit (mol %) | (Meth)acrylate Unit (mol %) | Molecular Weight |
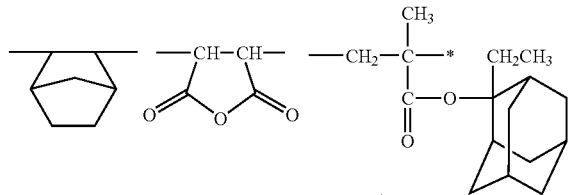
(39)
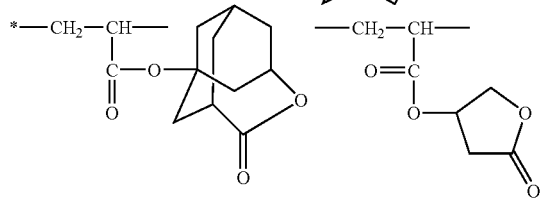
(40)
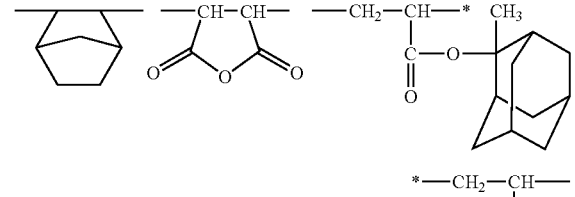
(41)
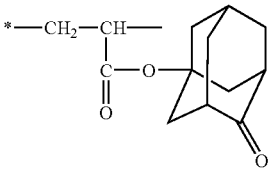
(42)

TABLE 3-continued

| Resin | Norbornene Unit (mol %) | Acid Anhydride Unit (mol %) | (Meth)acrylate Unit (mol %) | Weight Average Molecular Weight |
|---|---|---|---|---|
| (43) | | | | |
| (44) | | | | |

Synthesis Example (4)

Synthesis of Resin (45) (Hybrid Type)

Into a reaction vessel were put tert-butyl ester of norbornenecarboxylic acid, maleic anhydride, 2-methyl-2-adamantyl acrylate and norbornenelactone acrylate in a molar ratio of 20/20/35/25 and dissolved in a mixed solvent of methyl ethyl ketone and tetrahydrofuran (1/1 in volume) to form a solution having a solid content of 60% by weight, and the solution was heated at 65° C. under a nitrogen gas stream. After the reaction temperature was stabilized, 3% by mole of a radical initiator (V-Gal manufactured by Wako Pure Chemical Industries, Ltd.) was added to initiate a reaction. After heating for 12 hours, the reaction mixture was poured into hexane of five times in volume to deposit white powder. The powder was collected by filtration and dissolved in a mixed solvent, of methyl ethyl ketone and tetrahydrofuran (1/1 in volume), the solution was poured into a solvent mixture of hexane and methyl tert-butyl ether (1/1 in volume) of five times in volume to deposit white powder, and the powder was collected by filtration. This procedure was repeated once again and the powder deposited was dried to obtain Resin (45).

Resin (45) was subjected to molecular weight analysis (RI analysis) by a GPC method and it was found that a weight average molecular weight thereof calculated in terms of polystyrene was 11,600. An amount of the remaining monomer was 0.4%. A molar ratio of repeating units corresponding to the tert-butyl ester of norbornenecarboxylic acid, maleic anhydride, 2-methyl-2-adamantyl acrylate and norbornenelactone acrylate determined from an NMR spectrum was 18/23/34/25.

Resins (46) to (69) were synthesized in a similar manner to Synthesis Example (4) respectively, The monomer unit Composition ratio and weight average molecular weight of each of Resins (46) to (69) are shown in Table 4 below. In Table 4, Alicyclic Olefin Unit, Monomer Unit of Formula (VIII) and Acrylic Monomer Unit denotes the repeating units of Resins (46) to (69) shown below in order from left to right, respectively,

TABLE 4

| Resin | Alicyclic Olefin Unit (mol %) | Monomer of Formula (VIII) (Acid Anhydride) (mol %) | Acrylic Monomer Unit (mol %) | Weight Average Molecular Weight |
|---|---|---|---|---|
| 46 | 24 | 29 | 31/16 | 12,300 |
| 47 | 21 | 28 | 32/29 | 11,100 |
| 48 | 22 | 27 | 28/23 | 11,300 |
| 49 | 27 | 31 | 24/18 | 10,700 |
| 50 | 32 | 38 | 20/10 | 9,700 |
| 51 | 31 | 35 | 21/13 | 9,200 |
| 52 | 29 | 35 | 20/16 | 8,900 |
| 53 | 35 | 39 | 23/3 | 8,700 |
| 54 | 28 | 36 | 22/14 | 10,600 |
| 55 | 28/8 | 44 | 20 | 9,100 |

TABLE 4-continued
| Resin | Alicyclic Olefin Unit (mol %) | Monomer of Formula (VIII) (Acid Anhydride) (mol %) | Acrylic Monomer Unit (mol %) | Weight Average Molecular Weight |
|---|---|---|---|---|
| 56 | 30/6 | 42 | 22 | 7,700 |
| 57 | 46 | 47/3 | 4 | 6,300 |
| 58 | 37/6 | 48 | 9 | 6,800 |
| 59 | 34/10 | 51 | 5 | 7,400 |
| 60 | 41 | 43 | 10/6 | 6,700 |
| 61 | 39 | 42 | 11/8 | 8,800 |
| 62 | 36 | 42 | 10/12 | 9,300 |
| 63 | 39 | 43 | 14/4 | 9,800 |
| 64 | 38 | 42 | 15/5 | 9,300 |
| 65 | 24 | 27 | 25/24 | 12,600 |
| 66 | 19 | 24 | 40/17 | 9,500 |
| 67 | 29 | 32 | 34/5 | 10,400 |
| 68 | 20 | 25 | 26/5/24 | 13,400 |
| 69 | 16 | 24 | 32/24/4 | 12,700 |
Structures of Resins (45) to (69) are shown below.
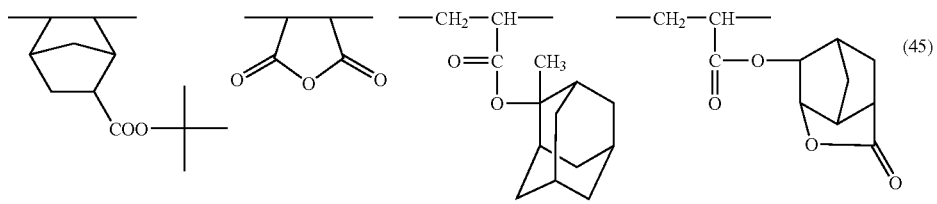
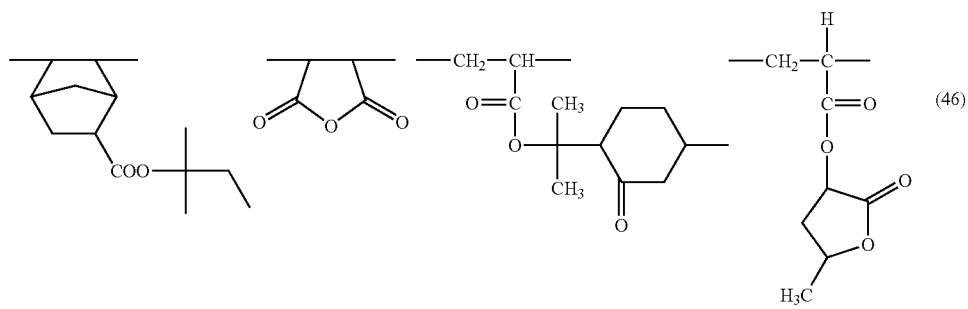
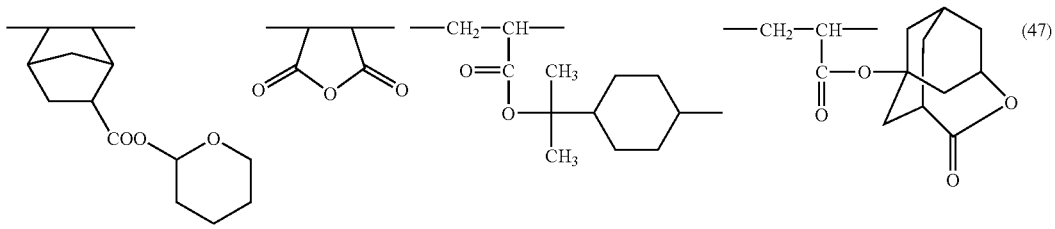
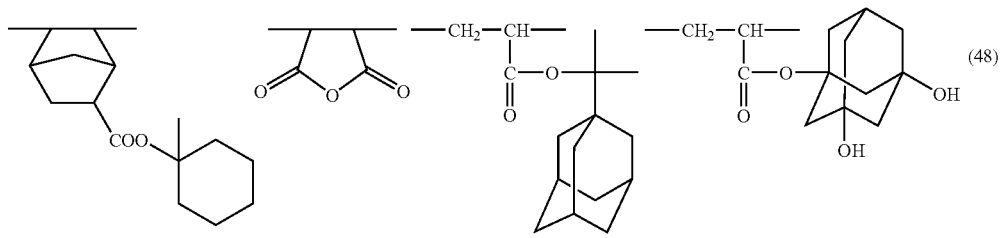

TABLE 4-continued

| Resin | Alicyclic Olefin Unit (mol %) | Monomer of Formula (VIII) (Acid Anhydride) (mol %) | Acrylic Monomer Unit (mol %) | Weight Average Molecular Weight |
|---|---|---|---|---|

(49), (50), (51), (52), (53), (54)

TABLE 4-continued

| Resin | Alicyclic Olefin Unit (mol %) | Monomer of Formula (VIII) (Acid Anhydride) (mol %) | Acrylic Monomer Unit (mol %) | Weight Average Molecular Weight |
|---|---|---|---|---|

(55), (56), (57), (58), (59), (60)

TABLE 4-continued

| Resin | Alicyclic Olefin Unit (mol %) | Monomer of Formula (VIII) (Acid Anhydride) (mol %) | Acrylic Monomer Unit (mol %) | Weight Average Molecular Weight |
|---|---|---|---|---|

(61) — (62) — (63) — (64) — (65) — (66)

TABLE 4-continued

| Resin | Alicyclic Olefin Unit (mol %) | Monomer of Formula (VIII) (Acid Anhydride) (mol %) | Acrylic Monomer Unit (mol %) | Weight Average Molecular Weight |
|---|---|---|---|---|

(67), (68), (69) [chemical structures]

Examples 1 to 76 and Comparative Examples 1 to 4

<Preparation of Photosensitive Composition>

In each of Examples 1 to 76 and Comparative Examples 1 to 4, the components as shown in Tables 5 to 8 below were dissolved to prepare a solution having a solid concentration of 12% by weight. The resulting solution was filtered through a Teflon filter having a pore size of 0.1 μm, whereby a positive photosensitive composition was prepared.

The photosensitive composition was evaluated by the methods described below. The results obtained are shown in Tables 9 to 11 below.

TABLE 5

| Example | Resin (10 g) | Acid Generator (g) | Other Additive (g) | Basic Compound (0.03 g) | Surface Active Agent (0.03 g) | Solvent (weight ratio) |
|---|---|---|---|---|---|---|
| 1 | (1) | Z2 (0.045) | — | 1/2 = 1/1 | W-1 | A1/B1 = 95/5 |
| 2 | (2) | Z2 (0.045) | — | 1/3 = 1/1 | W-1 | A1 = 100 |
| 3 | (3) | Z3 (0.045) | — | 2/7 = 1/1 | W-2 | A1/B1 = 90/10 |
| 4 | (4) | Z8 (6.047) | — | 3/6 = 1/1 | W-2 | A3/B2 = 80/20 |
| 5 | (5) | Z5 (0.043) | — | 4/8 = 1/1 | W-3 | A2/B1 = 90/10 |
| 6 | (6) | Z19 (0.090) | — | 4/9 = 1/1 | W-3 | A4/B1 = 90/10 |
| 7 | (7) | Z20 (0.090) | — | 3/10 = 1/1 | W-4 | A1/B1 = 50/50 |
| 8 | (8) | Z21 (0.095) | — | 9/10 = 1/1 | W-4 | A1/B1 = 90/10 |
| 9 | (9) | Z21 (0.098) | LCB (1) | 1/3/9 = 1/1/1 | W-1 | A5/B2 = 90/10 |
| 10 | (10) | Z34 (0.045) | — | 2/4/8 = 1/1/1 | W-1 | A1/B1 = 95/5 |
| 11 | (11) | Z31 (0.075) | — | 1/4/10 = 1/1/1 | W-2 | A1/B1 = 90/10 |
| 12 | (12) | Z38 (0.090) | — | 2/5 = 1/1 | W-2 | A1/B1 = 95/5 |
| 13 | (13) | Z2 (0.030) Z31 (0.050) | — | 3/6 = 1/1 | W-3 | A1/B1 = 95/5 |

TABLE 5-continued

| Example | Resin (10 g) | Acid Generator (g) | Other Additive (g) | Basic Compound (0.03 g) | Surface Active Agent (0.03 g) | Solvent (weight ratio) |
|---|---|---|---|---|---|---|
| 14 | (14) | Z3 (0.030) Z38 (0.050) | — | 1/7 = 1/1 | W-3 | A1/B1 = 95/5 |
| 15 | (15) | Z2 (0.030) Z38 (0.045) | LCB (1) | 2/9 = 1/1 | W-4 | A1/B1 = 80/20 |
| 16 | (16) | Z31 (0.095) | — | 1/3 = 1/1 | W-4 | A1/D1 = 80/20 |
| 17 | (17) | Z40 (0.090) | — | 3/7 = 1/1 | W-4 | A1/B1 = 95/5 |
| 18 | (18) | Z36 (0.090) | — | 4/6 = 1/1 | W-4 | A1/B1 = 95/5 |
| 19 | (19) | Z19 (0.060) Z14 (0.030) | — | 5/8 = 1/1 | W-4 | A1/B1 = 95/5 |
| 20 | (20) | Z2 (0.045) | — | 6/7 = 1/1 | W-4 | A1/B1 = 95/5 |

TABLE 6

| Example | Resin (10 g) | Acid Generator (g) | Other Additive (g) | Basic Compound (0.03 g) | Surface Active Agent (0.03 g) | Solvent (weight ratio) |
|---|---|---|---|---|---|---|
| 21 | (21) | Z2 (0.045) | — | 4/8 = 1/1 | W-1 | A1/B1 = 95/5 |
| 22 | (22) | Z19 (0.090) | — | 3/7/9 = 1/1/1 | W-1 | A1/B1 = 80/20 |
| 23 | (23) | Z2 (0.040) Z11 (0.040) | — | 4/8 = 1/1 | W-2 | A1/B1 = 90/10 |
| 24 | (24) | Z13 (0.043) | — | 2/7 = 1/1 | W-2 | A3/B2 = 80/20 |
| 25 | (25) | Z13 (0.045) Z12 (0.020) | — | 5/6 = 1/1 | W-3 | A2/B1 = 90/10 |
| 26 | (26) | Z8 (0.045) | — | 2/4/9 = 1/1/1 | W-3 | A4/B1 = 90/10 |
| 27 | (27) | Z8 (0.045) | — | 3/8 = 1/1 | W-4 | A1/B1 = 50/50 |
| 28 | (28) | Z8 (0.045) Z12 (0.020) | — | 4/7 = 1/1 | W-4 | A1/B1 = 90/10 |
| 29 | (29) | Z30 (0.060) Z26 (0.020) | LCB (1) | 4/7 = 1/1 | W-1 | A5/B2 = 90/10 |
| 30 | (30) | Z30 (0.070) Z27 (0.020) | — | 2/3/8 = 1/1/1 | W-1 | A1/B1 = 95/5 |
| 31 | (31) | Z8 (0.040) Z29 (0.030) | — | 3/4/5 = 1/1/1 | W-2 | A1/B1 = 90/10 |
| 32 | (32) | Z33 (0.060) | — | 6/8 = 1/1 | W-2 | A1/B1 = 95/5 |
| 33 | (33) | Z34 (0.040) | — | 3/4/8 = 1/1/1 | W-3 | A1/B1 = 95/5 |
| 34 | (34) | Z33 (0.040) Z30 (0.020) | — | 2/5/9 = 1/1/1 | W-3 | A1/B2 = 95/5 |
| 35 | (35) | Z33 (0.040) Z30 (0.020) | — | 3/6/9 = 1/1/1 | W-4 | A1/B1 = 80/20 |
| 36 | (36) | Z34 (0.040) Z36 (0.080) | — | 2/5/8 = 1/1/1 | W-4 | A1/B1 = 80/20 |
| 37 | (27) | Z40 (0.060) Z34 (0.020) | — | 1/3/7 = 1/1/1 | W-4 | A1/B1 = 95/5 |
| 38 | (38) | Z38 (0.040) Z33 (0.040) | — | 6/8/10 = 1/1/1 | W-4 | A1/B1 = 95/5 |
| 39 | (39) | Z23 (0.050) Z30 (0.030) | — | 3/7/9 = 1/1/1 | W-4 | A1/B1 = 95/5 |
| 40 | (40) | Z2 (0.045) Z7 (0.020) | LCB (1) | 2/8 = 1/1 | W-4 | A1/B1 = 95/5 |

TABLE 7

| Example | Resin (10 g) | Acid Generator (g) | Other Additive (g) | Basic Compound (0.03 g) | Surface Active Agent (0.03 g) | Solvent (weight ratio) |
|---|---|---|---|---|---|---|
| 41 | (41) | Z9 (0.045) | — | 1/4/7 = 1/1/1 | W-1 | A1/B1 = 95/5 |
| 42 | (42) | Z10 (0.045) | — | 2/3/8 = 1/1/1 | W-1 | A1/B1 = 80/20 |
| 43 | (43) | Z2 (0.035) Z1 (0.010) | — | 5/6/9 = 1/1/1 | W-2 | A1/B1 = 90/10 |
| 44 | (44) | Z6 (0.040) | — | 4/7 = 1/1 | W-2 | A3/B2 = 80/20 |
| 45 | (45) | Z6 (0.030) Z1 (0.015) | — | 3/8 = 1/1 | W-3 | A2/B1 = 90/10 |
| 46 | (46) | Z16 (0.040) | — | 2/9 = 1/1 | W-3 | A4/B1 = 90/10 |
| 47 | (47) | Z2 (0.045) Z18 (0.010) | — | 2/8/9 = 1/1/1 | W-4 | A1/B1 = 50/50 |

TABLE 7-continued

| Example | Resin (10 g) | Acid Generator (g) | Other Additive (g) | Basic Compound (0.03 g) | Surface Active Agent (0.03 g) | Solvent (weight ratio) |
|---|---|---|---|---|---|---|
| 48 | (48) | Z19 (0.040) Z20 (0.040) | — | 3/7/9 = 1/1/1 | W-4 | A1/B1 = 90/10 |
| 49 | (49) | Z8 (0.045) Z12 (0.020) | — | 4/8 = 1/1 | W-1 | A5/B2 = 90/10 |
| 50 | (50) | Z33 (0.040) | — | 5/7 = 1/1 | W-1 | A1/B1 = 95/5 |
| 51 | (51) | Z30 (0.060) Z36 (0.020) | — | 2/3/8 = 1/1/1 | W-2 | A1/B1 = 90/10 |
| 52 | (52) | Z33 (0.040) | — | 4/5/9 = 1/1/1 | W-2 | A1/B1 = 95/5 |
| 53 | (53) | Z33 (0.040) Z30 (0.020) | — | 3/6/8 = 1/1/1 | W-3 | A1/B1 = 95/5 |
| 54 | (54) | Z40 (0.060) Z34 (0.020) | — | 2/5/7 = 1/1/1 | W-3 | A1/B1 = 95/5 |
| 55 | (55) | Z23 (0.050) Z30 (0.030) | — | 3/4/8 = 1/1/1 | W-4 | A1/B1 = 80/20 |
| 56 | (56) | Z9 (0.045) | — | 5/7/9 = 1/1/1 | W-4 | A1/B1 = 80/20 |
| 57 | (57) | Z9 (0.045) | — | 2/4/8 = 1/1/1 | W-4 | A1/B1 = 95/5 |
| 58 | (58) | Z2 (0.035) Z1 (0.010) | — | 3/5/9 = 1/1/1 | W-4 | A1/B1 = 95/5 |
| 59 | (59) | Z6 (0.050) | — | 2/6/7 = 1/1/1 | W-4 | A1/B1 = 95/5 |
| 60 | (60) | Z16 (0.040) | — | 3/9 = 1/1 | W-4 | A1/B1 = 95/5 |

TABLE 8

| Example | Resin (10 g) | Acid Generator (g) | Other Additive (g) | Basic Compound (0.03 g) | Surface Active Agent (0.03 g) | Solvent (weight ratio) |
|---|---|---|---|---|---|---|
| 61 | (61) | Z2 (0.045) Z8 (0.010) | — | 4/10 = 1/1 | W-1 | A1/B1 = 95/5 |
| 62 | (62) | Z33 (0.040) | — | 1/10 = 1/1 | W-1 | A1/B1 = 80/20 |
| 63 | (63) | Z8 (0.045) Z12 (0.020) | — | 1/4/10 = 1/1/1 | W-2 | A1/B1 = 90/10 |
| 64 | (64) | Z16 (0.040) | — | 3/7 = 1/1 | W-2 | A3/B2 = 80/20 |
| 65 | (65) | Z2 (0.045) Z20 (0.020) | — | 2/5/8 = 1/1/1 | W-3 | A2/B1 = 90/10 |
| 66 | (66) | Z8 (0.045) Z12 (0.020) | — | 3/6 = 1/1 | W-3 | A4/B1 = 90/10 |
| 67 | (67) | Z23 (0.050) Z30 (0.030) | — | 1/2/9 = 1/1/1 | W-1 | A1/B1 = 90/10 |
| 68 | (68) | Z33 (0.040) | — | 2/3/5 = 1/1/1 | W-1 | A1/B1 = 95/5 |
| 69 | (69) | Z30 (0.040) Z26 (0.020) | — | 4/6/8 = 1/1/1 | W-4 | A1/B1 = 90/10 |
| 70 | (16) | Z9 (0.045) | — | 5/9 = 1/1 | W-4 | A1/B1 = 80/20 |
| 71 | (16) | Z31 (0.095) | — | 3/6/10 = 1/1/1 | W-3 | A2/B1 = 90/10 |
| 72 | (16) | Z40 (0.090) | — | 1/6 = 1/1 | W-2 | A1/B1 = 95/5 |
| 73 | (16) | Z36 (0.090) | — | 1/6/10 = 1/1/1 | W-1 | A1/B1 = 95/5 |
| 74 | (17) | Z2 (0.045) Z12 (0.020) | — | 4/3/1 = 1/1/1 | W-3 | A1/B1 = 90/10 |
| 75 | (17) | Z14 (0.045) Z22 (0.020) | — | 8/1 = 1/1 | W-2 | A1/B1 = 90/10 |
| 76 | (17) | Z2 (0.045) Z12 (0.020) | — | 9/1/3 = 1/1/1 | W-1 | A1/B1 = 80/20 |
| Comparative Example 1 | (1) | Z6 (0.045) | — | 2 | W-1 | A1/B1 = 95/5 |
| Comparative Example 2 | (13) | Z6 (0.040) Z36 (0.080) | — | 1 | W-1 | A1/B1 = 95/5 |
| Comparative Example 3 | (16) | Z6 (0.040) Z39 (0.080) | — | 3 | W-1 | A1/B1 = 95/5 |
| Comparative Example 4 | (17) | Z6 (0.045) | — | 10 | W-1 | A1/B1 = 95/5 |

The abbreviations used in Tables 5 to 8 are described below.
LCB: t-Butyl lithocholate
The abbreviations of the basic compounds are as follows. The ratio of basic compounds shown in Tables 5 to 8 is indicated by a weight ratio, and the total amount of the basic compounds is 0.03 g.

2: Triphenylimidazole
3: Diisopropylaniline
4: Antipyrine
5: Hydroxyanzipyrine
6: 1,8-Diazabicyclo[5.4.0]undec-5-ene
7: 1,5-Diazabicyclo[4.3.0]non-5-ene
8; Tetramethylammonium hydroxide 9: Tetrabutylammonium hydroxide
10: Dicyclohexylmethylamine The abbreviations of the surface active agents are as follows.

amine, the charge on the nitrogen atom thereof is substantially corresponds to the pKa, and in case of a compound having a hydroxy ion (e.g., Basic Compounds 8 and 9), the charge on the oxygen atom of OH⁻ corresponds to the pKa.

TABLE A

| Basic Compound | Volume[a] ($A^3$) | Log P[b] | Charge Density on N[c] | Charge Density 2 on N[d] | Charge Density on O Of OH[e] | Melting Point (° C.) | Boiling point (° C. or ° C./mmHg) |
|---|---|---|---|---|---|---|---|
| 1 | 158.60 | 3.779 | −0.273 | — | — | −70 | 216 |
| 2 | 187.33 | 5.480 | −0.188 | −0.130 | — | 275–277 | — |
| 3 | 134.92 | 3.651 | −0.332 | — | — | −45 | 257 |
| 4 | 88.19 | —[f] | −0.286 | −0.050 | — | 111–114 | — |
| 5 | 122.19 | —[f] | −0.192 | −0.087 | — | 184–186 | — |
| 6 | 111.86 | 1.680 | −0.304 | −0.251 | — | — | 80–83/ 0.6 mm |
| 7 | 87.46 | 0.816 | −0.285 | −0.226 | — | — | 95–98/ 7.5 mm |
| 8 | 71.47 | —[f] | 0.200 | — | −0.457 | — | — |
| 9 | 180.13 | —[f] | 0.209 | — | −0.446 | — | — |
| 10 | 156.94 | 3.327 | −0.275 | — | — | 194–196 | 265 |

Note:
[a] determined by optimizing molecular mechanically an initial structure using a MM2 parameter, optimizing an secondary structure using a PM3 parameter, and calculating a volume by MOPAC according to a CAChe system.
[b] determined, by an ordinary atomic calculation method.
[c] determined by optimizing molecular mechanically an initial structure using a MM2 parameter, optimizing an secondary structure using an AM1 parameter, and calculating a charge density by MOPAC according to a CAChe system.
[d] determined in the same manner as in [c], only in case of a compound having two nitrogen atoms in its molecule.
[e] determined in the game manner as in [c], only in case of a compound wherein the basicity results from OH⁻.
[f] unable to be determined, because the compound contains an atom that is not included in a parameter of the calculation method of log P used.

<Evaluation of Pattern>

W-1: Megafax F176 (manufactured by Dainippon Ink and Chemicals, Inc.) (fluorine-base)
W-2: Megafac R08 (manufactured by Dainippon Ink and Chemicals, Inc.) (fluorine- and silicon-base)
W-3: Polysiloxane Polymer KP-341 (manufactured by Shin-Etsu Chemical Co., Ltd.) (silicon-base)
W-4: Troysol S-366 (manufactured by Troy Chemical Co., Ltd.)

The abbreviations of the solvents are as follows. The ratio of solvents in case of using two or more thereof shown in Tables 5 to 8 is indicated by a weight ratio.

A1: Propylene glycol methyl ether acetate
A2: 2-Heptanone
A3; Ethyl ethoxypropionate
A4: γ-Butyrolactone
A5: Cyclohexanone
B1; Propylene glycol methyl ether
B2: Ethyl lactate The basic compounds used in Examples 1 to 76 have the physical properties shown in Table A below. By comparing the basic compounds used in each example with the physical properties thereof shown in Table A, it can be seen that two basic compounds having different physical properties are mixed. It is also recognized that a difference in at least one physical property is sufficient for the mixture of basic compounds according to the present invention.

The value of pKa, which is one of indexes of the physical properties, is not described in Table A, since it changes depending on a solvent used for measurement. The charge density is shown in Table A instead of the pKa. In case of an On a silicon substrate which had been subjected to a hexamethyldisilazane treatment was uniformly coated a reflection preventing film (DUV-42 manufactured by Brewer Science, Inc.) at a thickness of 600 angstroms by a spin coater, dried at 100° C. for 90 seconds on a hot plate, and further dried by heating at 190° C. for 240 seconds. Thereafter, each of the photosensitive compositions described above was coated thereon by a spin coater and dried at 120° C. for 90 seconds to form a resist film having a thickness of 0.30 µm. The resist film was subjected to exposure using an ArF excimer laser stepper (manufacture by ISI Co., Ltd.; NA=0.6) through a mask and heated at 120° C. for 90 seconds on a hot plate immediately after the exposure. Then the resist film was developed with a 2.38% by weight aqueous tetramethylammonium hydroxide solution at 23° C. for 60 seconds, rinsed with pure water for 30 seconds, and dried to form an L/S pattern of 0.15 µm.

(1) Evaluation of Fluctuation in Linewidth

An L/S pattern was formed in the same manner as above except for conducting the heat treatment one hour after the exposure in place of immediately after the exposure. The linewidth of the pattern was measured using a critical dimension scanning electron microscope, and difference between the line width thus obtained and 0.15 µm was determined. As the difference is smaller, the fluctuation of linewidth with the passage of time between the exposure and the heat treatment is less.

(2) Evaluation of Edge Roughness

The evaluation of edge roughness was conducted by measuring edge roughness of isolated pattern using a critical dimension scanning electron microscope (CD-SEM). Specifically, a distance from the standard line where the edge should be present to the edge or the line pattern was measured in 50 points in the area of a length of 5 μm of the line pattern using a CO-SEM (S-8840, manufactured by Hitachi, Ltd.), standard deviation was determined and 3σ was calculated. As the value is smaller, the better quality is obtained.

(3) Evaluation of Development Defect

With the resist pattern obtained above, a number-of development defect occurred was measured by a device (KLA-2112 manufactured by KLA-Tencor Corp.). The primary datum was designated as the number of development defect.

TABLE 9

| Example | Fluctuation in Linewidth (μm) | Edge Roughness (nm) | Development Defect |
|---|---|---|---|
| 1 | 0.002 | 4 | 3 |
| 2 | 0.002 | 3 | 2 |
| 3 | 0.003 | 4 | 3 |
| 4 | 0.002 | 5 | 1 |
| 5 | 0.002 | 4 | 2 |
| 6 | 0.003 | 6 | 1 |
| 7 | 0.002 | 4 | 2 |
| 8 | 0.002 | 5 | 3 |
| 9 | 0.002 | 6 | 1 |
| 10 | 0.002 | 5 | 2 |
| 11 | 0.003 | 6 | 1 |
| 12 | 0.002 | 4 | 3 |
| 13 | 0.003 | 6 | 1 |
| 14 | 0.003 | 3 | 2 |
| 15 | 0.003 | 4 | 3 |
| 16 | 0.003 | 6 | 0 |
| 17 | 0.003 | 5 | 1 |
| 18 | 0.003 | 4 | 0 |
| 19 | 0.002 | 6 | 2 |
| 20 | 0.002 | 4 | 1 |
| 21 | 0.002 | 5 | 0 |
| 22 | 0.003 | 4 | 0 |
| 23 | 0.002 | 6 | 1 |
| 24 | 0.003 | 5 | 2 |
| 25 | 0.002 | 5 | 1 |

TABLE 10

| Example | Fluctuation in Linewidth (μm) | Edge Roughness (nm) | Development Defect |
|---|---|---|---|
| 26 | 0.003 | 4 | 1 |
| 27 | 0.002 | 5 | 2 |
| 28 | 0.002 | 4 | 1 |
| 29 | 0.003 | 6 | 0 |
| 30 | 0.003 | 4 | 0 |
| 31 | 0.002 | 5 | 1 |
| 32 | 0.003 | 4 | 1 |
| 33 | 0.002 | 6 | 1 |
| 34 | 0.002 | 4 | 3 |
| 35 | 0.003 | 4 | 1 |
| 36 | 0.002 | 5 | 2 |
| 37 | 0.003 | 6 | 1 |
| 38 | 0.002 | 5 | 1 |
| 39 | 0.003 | 5 | 2 |
| 40 | 0.003 | 5 | 1 |
| 41 | 0.002 | 4 | 2 |
| 42 | 0.003 | 4 | 1 |
| 43 | 0.002 | 6 | 1 |
| 44 | 0.003 | 4 | 0 |
| 45 | 0.002 | 6 | 0 |
| 46 | 0.003 | 4 | 1 |
| 47 | 0.002 | 4 | 2 |
| 48 | 0.002 | 5 | 2 |
| 49 | 0.002 | 4 | 1 |
| 50 | 0.002 | 4 | 2 |

TABLE 11

| Example | Fluctuation in Linewidth (μm) | Edge Roughness (nm) | Development Defect |
|---|---|---|---|
| 51 | 0.002 | 4 | 2 |
| 52 | 0.003 | 6 | 1 |
| 53 | 0.003 | 4 | 0 |
| 54 | 0.003 | 5 | 1 |
| 55 | 0.002 | 4 | 1 |
| 56 | 0.003 | 4 | 2 |
| 57 | 0.003 | 6 | 0 |
| 58 | 0.002 | 4 | 1 |
| 59 | 0.002 | 6 | 0 |
| 60 | 0.002 | 5 | 1 |
| 61 | 0.003 | 4 | 2 |
| 62 | 6.002 | 6 | 2 |
| 63 | 0.003 | 4 | 0 |
| 64 | 0.002 | 4 | 0 |
| 65 | 0.002 | 4 | 1 |
| 66 | 0.003 | 5 | 1 |
| 67 | 0.002 | 5 | 1 |
| 68 | 0.003 | 6 | 2 |
| 69 | 0.002 | 4 | 2 |
| 70 | 0.002 | 4 | 0 |
| 71 | 0.002 | 5 | 1 |
| 72 | 0.002 | 6 | 2 |
| 73 | 0.003 | 6 | 1 |
| 74 | 0.003 | 5 | 0 |
| 75 | 0.002 | 4 | 2 |
| 76 | 0.002 | 6 | 2 |
| Comparative Example 1 | 0.01 | 19 | 39 |
| Comparative Example 2 | 0.01 | 16 | 37 |
| Comparative Example 3 | 0.01 | 18 | 43 |
| Comparative Example 4 | 0.01 | 19 | 42 |

From the results shown in Tables 9 to 11, it can be seen that the photosensitive compositions of Examples 1 to 76 exhibit the excellent edge roughness and restrained development defect as well as the small fluctuation in linewidth, On the contrary, the photosensitive compositions of Comparative Examples 1 to 4 are inferior in the edge roughness and development defect as compared with the photosensitive compositions of Examples.

Examples 101 to 176 and Comparative Examples 101 to 104

<Preparation of Photosensitive Composition>

In each of Example 101 to 176 and Comparative Examples 101 to 104, the components as shown in Tables 105 to 107 below were dissolved to prepare a solution having a solid concentration of 12% by weight. The resulting solution was filtered through a Teflon filter having a pore size of 0.1 μm, whereby a positive photosensitive composition was prepared.

The photosensitive composition was evaluated by the methods described below. The results obtained are shown in Tables 108 to 110 below.

TABLE 105

| Example | Resin (10 g) | Acid Generator (mg) | Basic compound (0.03 g) | Surface Active Agent (0.03 g) | solvent (weight ratio) |
|---|---|---|---|---|---|
| 101 | (1) | Z2 (45) | C1 | W-1 | A1/B1 = 95/5 |
| 102 | (2) | Z2 (45) | C1 | W-1 | A1 = 100 |
| 103 | (3) | Z3 (45) | C2 | W-2 | A1/B1 = 90/10 |
| 104 | (4) | Z8 (47) | C3 | W-2 | A3/B2 = 80/20 |
| 105 | (5) | Z5 (43) | C4 | W-3 | A2/B1 = 90/10 |
| 106 | (6) | Z19 (90) | C5 | W-3 | A4/B1 = 90/10 |
| 107 | (7) | Z20 (90) | C13 | W-4 | A1/B1 = 50/50 |
| 108 | (8) | Z21 (95) | C7 | W-1 | A1/B1 = 90/10 |
| 109 | (9) | Z21 (98) | C8 | W-1 | A5/B2 = 90/10 |
| 110 | (10) | Z34 (45) | C9 | W-1 | A1/B1 = 95/5 |
| 111 | (11) | Z31 (75) | C10 | W-2 | A1/B1 = 90/10 |
| 112 | (12) | Z38 (90) | C8 | W-2 | A1/B1 = 95/5 |
| 113 | (13) | Z2 (30) Z31 (50) | C7 | W-3 | A1/B1 = 95/5 |
| 114 | (14) | Z3 (30) Z38 (50) | C7/2 = 1/1 | W-3 | A1/B1 = 95/5 |
| 115 | (15) | Z2 (30) Z38 (45) | C9 | W-4 | A1/B1 = 80/20 |
| 116 | (16) | Z31 (95) | C11 | W-4 | A1/B1 = 80/20 |
| 117 | (17) | Z40 (90) | C12 | W-4 | A1/B1 = 95/5 |
| 118 | (18) | Z36 (90) | C11 | W-4 | A1/B1 = 95/5 |
| 119 | (19) | Z19 (60) Z14 (30) | C8 | W-4 | A1/B1 = 95/5 |
| 120 | (20) | Z2 (45) | C7/3 = 1/1 | W-4 | A1/B1 = 95/5 |
| 121 | (21) | Z2 (45) | C7/3 = 1/1 | W-1 | A1/B1 = 95/5 |
| 122 | (22) | Z19 (90) | C12 | W-1 | A1/B1 = 80/20 |
| 123 | (23) | Z2 (40) Z11 (40) | C6 | W-2 | A1/B1 = 90/10 |
| 124 | (24) | Z13 (43) | C8 | W-2 | A3/B2 = 80/20 |
| 125 | (25) | Z13 (45) Z12 (20) | C9 | W-3 | A2/B1 = 90/10 |

TABLE 106

| Example | Resin (10 g) | Acid Generator (mg) | Basic Compound (0.03 g) | Surface Active Agent (0.03 g) | Solvent (weight ratio) |
|---|---|---|---|---|---|
| 126 | (26) | Z8 (45) | C1 | W-3 | A4/B1 = 90/10 |
| 127 | (27) | Z8 (45) | C1 | W-4 | A1/B1 = 50/50 |
| 128 | (28) | Z8 (45) Z12 (20) | C1/1 = 1/1 | W-4 | A1/B1 = 90/10 |
| 129 | (29) | Z30 (60) Z26 (20) | C2/4 = 1/1 | W-1 | A5/B2 = 90/10 |
| 130 | (30) | Z30 (70) Z27 (20) | C3 | W-1 | A1/B1 = 95/5 |
| 131 | (31) | Z8 (40) Z29 (30) | C4 | W-2 | A1/B1 = 90/10 |
| 132 | (32) | Z33 (40) | C3 | W-2 | A1/B1 = 95/5 |
| 133 | (33) | Z34 (40) | C2 | W-3 | A1/B1 = 95/5 |
| 134 | (34) | Z33 (40) Z30 (20) | C5 | W-3 | A1/B2 = 95/5 |
| 135 | (35) | Z33 (40) Z30 (20) | C1 | W-4 | A1/B1 = 80/20 |
| 136 | (36) | Z34 (40) Z36 (80) | C1/3 = 1/1 | W-4 | A1/B1 = 80/20 |
| 137 | (37) | Z40 (60) Z34 (20) | C2 | W-4 | A1/B1 = 95/5 |
| 138 | (38) | Z38 (40) Z33 (40) | C4/4 = 1/1 | W-4 | A1/B1 = 95/5 |
| 139 | (39) | Z23 (50) Z30 (30) | C3 | W-4 | A1/B1 = 95/5 |
| 140 | (40) | Z2 (45) Z7 (20) | C2/5 = 1/1 | W-4 | A1/B1 = 95/5 |
| 141 | (41) | Z9 (45) | C4 | W-1 | A1/B1 = 95/5 |
| 142 | (42) | Z10 (45) | C1 | W-1 | A1/B1 = 80/20 |
| 143 | (43) | Z2 (35) Z1 (10) | C2 | W-2 | A1/B1 = 90/10 |
| 144 | (44) | Z6 (10) | C1 | W-2 | A3/B2 = 80/20 |
| 145 | (45) | Z6 (30) Z1 (15) | C3 | W-3 | A2/B1 = 90/10 |
| 146 | (46) | Z16 (40) | C4 | W-3 | A4/B1 = 90/10 |

TABLE 106-continued

| Example | Resin (10 g) | Acid Generator (mg) | Basic Compound (0.03 g) | Surface Active Agent (0.03 g) | Solvent (weight ratio) |
|---|---|---|---|---|---|
| 147 | (47) | Z2 (45) Z18 (10) | C5 | W-4 | A1/B1 = 50/50 |
| 148 | (48) | Z19 (40) Z20 (40) | C7 | W-4 | A1/B1 = 90/10 |
| 149 | (49) | Z8 (45) Z12 (20) | C1 | W-1 | A5/B1 = 90/10 |
| 150 | (50) | Z33 (40) | C2 | W-1 | A1/B1 = 95/5 |

TABLE 107

| Example | Resin (10 g) | Acid Generator (mg) | Basic Compound (0.03 g) | Surface Active Agent (0.03 g) | solvent (weight ratio) |
|---|---|---|---|---|---|
| 151 | (51) | Z30 (60) Z26 (20) | C13 | W-2 | A1/B1 = 90/10 |
| 152 | (52) | Z33 (40) | C11 | W-2 | A1/B1 = 95/5 |
| 153 | (53) | Z33 (40) Z30 (20) | C12 | W-3 | A1/B1 = 95/5 |
| 154 | (54) | Z40 (60) Z34 (20) | C9 | W-3 | A1/B1 = 95/5 |
| 155 | (55) | Z23 (30) Z30 (30) | C2/3 = 1/1 | W-4 | A1/B1 = 80/20 |
| 156 | (56) | Z9 (45) | C2/5 = 1/1 | W-4 | A1/B1 = 80/20 |
| 157 | (57) | Z9 (45) | C8 | W-4 | A1/B1 = 95/5 |
| 158 | (58) | Z2 (35) Z1 (10) | C6 | W-4 | A1/B1 = 95/5 |
| 159 | (59) | Z6 (50) | C4 | w-4 | A1/B1 = 95/5 |
| 160 | (60) | Z16 (40) | C2 | W-4 | A1/B1 = 95/5 |
| 161 | (61) | Z2 (45) Z18 (10) | C1 | W-1 | A1/B1 = 95/5 |
| 162 | (62) | Z33 (40) | C3/3 = 1/1 | W-1 | A1/B1 = 90/20 |
| 163 | (63) | Z8 (45) Z12 (20) | C4 | W-2 | A1/B1 = 90/10 |
| 164 | (64) | Z16 (40) | C1 | W-2 | A3/B2 = 80/20 |
| 165 | (65) | Z2 (45) Z20 (20) | C2 | W-3 | A2/B1 = 90/10 |
| 166 | (66) | Z8 (45) Z12 (20) | C3 | W-3 | A4/B1 = 90/10 |
| 167 | (67) | Z23 (50) Z30 (30) | C1/3 = 1/1 | W-1 | A1/B1 = 90/10 |
| 168 | (68) | Z33 (40) | C11/1 = 1/1 | W-1 | A1/B1 = 95/5 |
| 169 | (69) | Z30 (40) Z26 (20) | C5/2 = 1/1 | W-4 | A1/B1 = 90/10 |
| 170 | (16) | Z9 (45) | C11/1 = 1/1 | W-4 | A1/B1 = 80/20 |
| 171 | (16) | Z31 (95) | C12/3 = 1/1 | W-3 | A2/B1 = 90/10 |
| 172 | (16) | Z40 (90) | C10 | W-2 | A1/B1 = 95/5 |
| 173 | (16) | Z36 (90) | C9/3 = 1/1 | W-1 | A1/B1 = 95/5 |
| 174 | (17) | Z2 (45) Z12 (20) | C11/3 = 1/1 | W-3 | A1/B1 = 90/10 |
| 175 | (17) | Z2 (45) Z12 (20) | C7/6 = 1/1 | W-2 | A1/B1 = 90/10 |
| 176 | (17) | Z14 (45) Z22 (20) | C11/6 = 1/1 | W-1 | A1/B1 = 80/20 |
| Comparative Example 101 | (1) | Z6 (45) | 3 | W-1 | A1/B1 = 95/5 |
| comparative Example 102 | (13) | Z6 (40) Z36 (80) | 3 | W-1 | A1/B1 = 95/5 |
| Comparative Example 103 | (16) | Z6 (40) Z39 (80) | 3 | W-1 | A1/B1 = 95/5 |
| Comparative Example 104 | (17) | Z6 (45) | 3 | W-1 | A1/B1 = 95/5 |

The abbreviations used in Tables 105 to 107 are described below.

The acid generators are selected from Z1 to Z40 in the specific examples of component (A) described hereinbefore.

The abbreviations of the basic compounds are as follows. The ratio of basic compounds in case of using two or more thereof shown in Tables 105 to 107 is indicated by a weight ratio.

C1: Tridecylamine
C2: Tetradecylamine
C3: Pentadecylamine
C4: Hexadecylamine
C5: Octadecylamine
C6: Didecylamine
C7: Methyloctadecylamine
C8: Triisodecylamine
C9: N,N-Dimethylundecylamine
C10: N,N-Dimethyldodecylamine
C11: Tridodecylamine
C12: Methyldioctadecylamine
C13: Trioctylamine
1: 1,5-Diazabicyclo[4.3,0]non-5-ene
2: Bis(1,2,2,6,6-pentamethyl-4-piperidyl)sebacate
3: Tri-n-butylamine
4; Triphenylimidazole
5: Antipyrine
6: 2,6-Diisopropylaniline The abbreviations of the surface active agents are as follows.
W-1: Megafax F176 (manufactured by Dainippon Ink and Chemicals, Inc.) (fluorine-base)
W-2: Megafac ROB (manufactured by Dainippon Ink and Chemicals, Inc.) (fluorine- and silicon-base)
W-3: Polysiloxane Polymer KP-341 (manufactured by Shin-Etsu Chemical Co., Ltd.) (silicon-base)
W-4: Troysol S-366 (manufactured by Troy Chemical Co., Ltd.)

The abbreviations of the solvents are as follows. The ratio of solvents in case of using two or more thereof shown in Tables 105 to 107 is indicated by a weight ratio.
A1; Propylene glycol methyl ether acetate
A2: 2-Heptanone
A3: Ethyl ethoxypropionate
A4: γ-Butyrolactone
A5: Cyclohexanone
B1: Propylene glycol methyl ether
B2; Ethyl lactate <Evaluation of Pattern>

(1) Evaluation of Fluctuation in Linewidth

The evaluation of fluctuation in linewidth was conducted in the same manner as in Examples 1 to 76 and Comparative Examples 1 to 4.

(2) Evaluation of Sidelobe Resistance

On a silicon substrate which had been subjected to a hexamethyldisilazane treatment was uniformly coated a reflection preventing film (DUV-42 manufactured by Brewer Science, Inc.) at a thickness of 600 angstroms by a spin coater, dried at 100° C. for 90 seconds on a hot plate, and further dried by heating at 190° C. for 240 seconds, Thereafter, each of the photosensitive compositions described above was coated thereon by a spin coater and dried at 120° C. for 90 seconds to form a resist film having a thickness of 0.30 µm. The resist film was subjected to exposure using an ArF excimer laser stepper (manufacture by ISI Co., Ltd.; NA=0.6) through a mask and heated at 120° C. for 90 seconds on a hot plate immediately after the exposure. Then the resist film was developed with a 2.38% by weight aqueous tetramethylammoniun hydroxide solution at 23° C. for 60 seconds, rinsed with pure water for 30 seconds, and dried to obtain a resist pattern.

The evaluation of sidelobe resistance was conducted by resolving 0.22 µm to 0.20 µm using a halftone phase sift mask and observing a pattern of 0.18 µm. The pattern wherein the occurrence of sidelobe was not recognized was indicated by A, the pattern wherein the occurrence of sidelobe was slightly recognized was indicated by B, and the pattern wherein the occurrence of sidelobe was clearly recognized was indicated by C.

TABLE 108

| Example | Fluctuation in Linewidth (mµ) | Sidelobe Resistance |
|---|---|---|
| 101 | 0.002 | A |
| 102 | 0.002 | A |
| 103 | 0.002 | A |
| 104 | 0.002 | A |
| 105 | 0.002 | A |
| 106 | 0.003 | A |
| 107 | 0.002 | B |
| 108 | 0.003 | A |
| 109 | 0.002 | A |
| 110 | 0.002 | A |
| 111 | 0.002 | A |
| 112 | 0.003 | A |
| 113 | 0.002 | A |
| 114 | 0.002 | A |
| 115 | 0.003 | A |
| 116 | 0.002 | A |
| 117 | 0.002 | A |
| 118 | 0.002 | A |
| 119 | 0.002 | A |
| 120 | 0.003 | A |
| 121 | 0.002 | A |
| 122 | 0.003 | A |
| 123 | 0.002 | A |
| 124 | 0.003 | A |
| 125 | 0.002 | A |

TABLE 109

| Example | Fluctuation in Linewidth (mµ) | Sidelobe Resistance |
|---|---|---|
| 126 | 0.002 | A |
| 127 | 0.003 | A |
| 128 | 0.002 | A |
| 129 | 0.002 | A |
| 130 | 0.002 | A |
| 131 | 0.003 | A |
| 132 | 0.002 | A |
| 133 | 0.002 | A |
| 134 | 0.002 | A |
| 135 | 0.002 | A |
| 136 | 0.002 | A |
| 137 | 0.002 | A |
| 138 | 0.003 | A |
| 139 | 0.003 | A |
| 140 | 0.002 | A |
| 141 | 0.002 | A |
| 142 | 0.002 | A |
| 143 | 0.002 | A |
| 144 | 0.002 | A |
| 145 | 0.002 | A |
| 146 | 0.003 | A |
| 147 | 0.002 | A |
| 148 | 0.002 | A |
| 149 | 0.003 | A |
| 150 | 0.002 | A |

TABLE 110

| Example | Fluctuation in Linewidth (mµ) | Sidelobe Resistance |
|---|---|---|
| 151 | 0.002 | B |
| 152 | 0.002 | A |
| 153 | 0.003 | A |

TABLE 110-continued

| Example | Fluctuation in Linewidth (mµ) | Sidelobe Resistance |
|---|---|---|
| 154 | 0.003 | A |
| 155 | 0.002 | A |
| 156 | 0.002 | A |
| 157 | 0.002 | A |
| 158 | 0.002 | A |
| 159 | 0.003 | A |
| 160 | 0.003 | A |
| 161 | 0.003 | A |
| 162 | 0.002 | A |
| 163 | 0.002 | A |
| 164 | 0.003 | A |
| 165 | 0.002 | A |
| 166 | 0.003 | A |
| 167 | 0.002 | A |
| 168 | 0.002 | A |
| 169 | 0.003 | A |
| 170 | 0.002 | A |
| 171 | 0.002 | A |
| 172 | 0.003 | A |
| 173 | 0.002 | A |
| 174 | 0.002 | A |
| 175 | 0.002 | A |
| 176 | 0.002 | A |
| Comparative Example 101 | 0.01 | C |
| Comparative Example 102 | 0.01 | C |
| Comparative Example 103 | 0.01 | C |
| Comparative Example 104 | 0.01 | C |

From the results shown in Tables 108 to 110, it can be seen that the photosensitive compositions of Examples 101 to 176 exhibit the excellent sidelobe resistance (halftone exposure aptitude) as well as the small fluctuation in linewidth.

Examples 201 to 276 and Comparative Examples 201 to 204

<Preparation of Photosensitive Composition>

In each of Examples 201 to 276 and Comparative Examples 201 to 204, the components as shown in Tables 205 to 207 below were dissolved to prepare a solution having a solid concentration of 12% by weight. The resulting solution was filtered through a Teflon filter having a pore size of 0.1 µm, whereby a positive photosensitive composition was prepared.

The photosensitive composition was evaluated by the methods described below. The results obtained are shown in Tables 208 to 210 below.

TABLE 205

| Example | Resin (10 g) | Acid Generator (mg) | Basic Compound (0.03 g) | Surface Active Agent (0.03 g) | Solvent (weight ratio) |
|---|---|---|---|---|---|
| 201 | (1) | Z2 (45) | C1 | W-1 | A1/B1 = 95/5 |
| 202 | (2) | Z2 (45) | C2 | W-1 | A1 = 100 |
| 203 | (3) | Z3 (4S) | C3 | W-2 | A1/B1 = 90/10 |
| 204 | (4) | Z8 (47) | C4 | W-2 | A3/B2 = 80/20 |
| 205 | (5) | Z5 (43) | C5 | W-3 | A2/B1 = 90/10 |
| 206 | (6) | Z19 (90) | C3 | W-3 | A4/B1 = 90/10 |
| 207 | (7) | Z20 (90) | C4 | W-4 | A1/B1 = 50/50 |
| 208 | (8) | Z21 (95) | C5 | W-4 | A1/B1 = 90/10 |
| 209 | (9) | Z21 (98) | C3 | W-1 | A5/B2 = 90/10 |
| 210 | (10) | Z34 (45) | C4 | W-1 | A1/B1 = 95/5 |
| 211 | (11) | Z31 (75) | C5 | W-2 | A1/B1 = 90/10 |
| 212 | (12) | Z38 (90) | C3/Ca = 1/1 | W-2 | A1/B1 = 95/5 |
| 213 | (13) | Z2 (30) Z31 (50) | C3/Ca = 1/1 | W-3 | A1/B1 = 95/5 |
| 214 | (14) | Z3 (30) Z38 (50) | C4/Cb = 1/1 | W-3 | A1/B1 = 95/5 |
| 215 | (15) | Z2 (30) Z38 (45) | C5/Cc = 1/1 | W-4 | A1/B1 = 80/20 |
| 216 | (16) | Z31 (95) | C3/Cd = 1/1 | W-4 | A1/B1 = 80/20 |
| 217 | (17) | Z40 (90) | C4/Ce = 1/1 | W-4 | A1/B1 = 95/5 |
| 218 | (18) | Z36 (90) | C3 | W-4 | A1/B1 = 95/5 |
| 219 | (19) | Z19 (60) Z14 (30) | C4 | W-4 | A1/B1 = 95/5 |
| 220 | (20) | Z2 (45) | C3 | W-4 | A1/B1 = 95/5 |
| 221 | (21) | Z2 (45) | C3 | W-1 | A1/B1 = 95/5 |
| 222 | (22) | Z19 (90) | C4 | W-1 | A1/B2 = 80/20 |
| 223 | (23) | Z2 (40) Z11 (40) | C3 | W-2 | A1/B1 = 90/10 |
| 224 | (24) | Z13 (43) | C5 | W-2 | A3/B2 = 80/20 |
| 225 | (25) | Z13 (45) Z12 (20) | C3/Ca = 1/1 | W-3 | A2/B1 = 90/10 |

TABLE 206

| Example | Resin (10 g) | Acid Generator (mg) | Basic Compound (0.03 g) | Surface Active Agent (0.03 g) | Solvent (weight ratio) |
|---|---|---|---|---|---|
| 226 | (26) | Z8 (45) | C3/Ca = 1/1 | W-3 | A4/B1 = 90/10 |
| 227 | (27) | Z8 (45) | C4/Cb = 1/1 | W-4 | A1/B1 = 50/50 |
| 228 | (28) | Z8 (45) Z12 (20) | C5/Cd = 1/1 | W-4 | A1/B1 = 90/10 |
| 229 | (29) | Z30 (60) Z26 (20) | C1/Cd = 1/1 | W-1 | A5/B2 = 90/10 |
| 230 | (30) | Z30 (70) Z27 (20) | C3 | W-1 | A1/B1 = 95/5 |
| 231 | (31) | Z8 (40) Z29 (30) | C4 | W-2 | A1/B1 = 90/10 |
| 232 | (32) | Z33 (40) | C5 | W-2 | A1/B1 = 95/5 |
| 233 | (33) | Z34 (40) | C1 | W-3 | A1/B1 = 95/5 |
| 234 | (34) | Z33 (40) Z30 (20) | C2 | W-3 | A1/B2 = 95/5 |
| 235 | (35) | Z33 (40) Z30 (20) | C3/Ca = 1/1 | W-4 | A1/B1 = 80/20 |
| 236 | (36) | Z34 (40) Z36 (80) | C5/Cd = 1/1 | W-4 | A1/B1 = 80/20 |
| 237 | (37) | Z40 (60) Z34 (20) | C4/Cc = 1/1 | W-4 | A1/B1 = 95/5 |
| 238 | (38) | Z38 (40) Z33 (40) | C3 | W-4 | A1/B1 = 95/5 |
| 239 | (39) | Z23 (50) Z30 (30) | C1 | W-4 | A1/B1 = 95/5 |
| 240 | (40) | Z2 (45) Z7 (20) | C4 | W-4 | A1/B1 = 95/5 |
| 241 | (41) | Z9 (45) | C2 | W-1 | A1/B1 = 95/5 |
| 242 | (42) | Z10 (45) | C3/C2 = 1/1 | W-1 | A1/B1 = 80/20 |
| 243 | (43) | Z2 (35) Z1 (10) | C4/C3 = 1/1 | W-2 | A1/B1 = 90/10 |
| 244 | (44) | Z6 (40) | C3/Cd = 1/1 | W-2 | A3/B2 = 80/20 |
| 245 | (45) | Z6 (30) Z1 (15) | C4/Cb = 1/1 | W-3 | A2/B1 = 90/10 |
| 246 | (46) | Z16 (40) | C3/Cd = 1/1 | W-3 | A4/B1 = 90/10 |
| 247 | (47) | Z2 (45) Z18 (10) | C4/Cc = 1/1 | W-4 | A1/B1 = 50/50 |
| 248 | (48) | Z19 (40) Z20 (40) | C2 | W-4 | A1/B1 = 90/10 |
| 249 | (49) | Ze (45) Z12 (20) | C4 | W-1 | A5/B2 = 90/10 |
| 250 | (50) | Z33 (40) | C3 | W-1 | A1/B1 = 95/5 |

TABLE 207

| Example | Resin (10 g) | Acid Generator (mg) | Basic Compound (0.03 g) | Surface Active Agent (0.03 g) | Solvent (weight ratio) |
|---|---|---|---|---|---|
| 251 | (51) | Z30 (60) Z26 (20) | C4 | W-2 | A1/B1 = 90/10 |
| 252 | (52) | Z33 (40) | C3 | W-2 | A1/B1 = 95/5 |
| 253 | (53) | Z33 (40) Z30 (20) | C1 | W-3 | A1/B1 = 95/5 |
| 254 | (54) | Z40 (60) Z34 (20) | C3 | W-3 | A1/B1 = 95/5 |
| 255 | (55) | Z23 (50) Z30 (30) | C3/C9 = 1/1 | W-4 | A1/B1 = 80/20 |
| 256 | (56) | Z9 (45) | C3/Ca = 1/1 | W-4 | A1/B1 = 80/20 |
| 257 | (57) | Z9 (45) | C4/Cc = 1/1 | W-4 | A1/B1 = 95/5 |
| 258 | (58) | Z2 (35) Z1 (10) | C5/Cb = 1/1 | W-4 | A1/B1 = 95/5 |
| 359 | (59) | Z6 (50) | C3/Ca = 1/1 | W-4 | A2/B2 = 95/5 |
| 260 | (60) | Z16 (40) | C4 | W-4 | A1/B1 = 99/5 |
| 261 | (61) | Z2 (45) Z18 (10) | C4 | W-1 | A1/B2 = 95/5 |
| 268 | (62) | Z33 (40) | C3 | W-2 | A1/B2 = 80/20 |
| 263 | (63) | Z8 (45) Z12 (20) | C3/Cb = 1/1 | W-2 | A1/B2 = 90/10 |
| 264 | (64) | Z16 (40) | C2/Ca = 1/1 | W-2 | A3/B2 = 80/20 |
| 265 | (65) | Z2 (45) Z20 (20) | C4/Ce = 1/1 | W-3 | A2/B1 = 90/10 |

TABLE 207-continued

| Example | Resin (10 g) | Acid Generator (mg) | Basic Compound (0.03 g) | Surface Active Agent (0.03 g) | Solvent (weight ratio) |
|---|---|---|---|---|---|
| 266 | (66) | Z8 (45) Z12 (20) | C3/Ce = 1/1 | W-3 | A4/B1 = 90/10 |
| 267 | (67) | Z23 (50) Z30 (30) | C5/Ce = 1/1 | W-1 | A1/B1 = 90/10 |
| 268 | (68) | Z33 (40) | C4/Cd = 1/1 | W-1 | A2/B2 = 95/5 |
| 269 | (69) | Z30 (40) Z26 (20) | C4/Cc = 1/1 | W-4 | A1/B3 = 90/10 |
| 270 | (16) | Z9 (45) | C3/Cd = 1/1 | W-4 | A1/B1 = 80/20 |
| 271 | (16) | Z31 (95) | C4/Ca = 1/1 | W-3 | A2/B2 = 90/10 |
| 272 | (16) | Z40 (90) | C4 | W-2 | A1/B1 = 95/5 |
| 273 | (16) | Z36 (90) | C3 | W-1 | A1/B1 = 95/5 |
| 274 | (17) | Z2 (45) Z12 (20) | C4 | W-3 | A1/B1 = 90/10 |
| 275 | (17) | Z2 (45) Z12 (20) | C4 | W-2 | A1/B1 = 90/10 |
| 276 | (17) | Z14 (45) Z22 (20) | C4 | W-1 | A1/B1 = 80/20 |
| Comparative Example 201 | (1) | Z6 (45) | Ca | W-1 | A1/B1 = 95/5 |
| Comparative Example 202 | (23) | Z6 (40) Z36 (80) | Ca | W-1 | A1/B1 = 95/5 |
| Comparative Example 203 | (16) | Z6 (40) Z39 (80) | Cc | W-1 | A1/B1 = 95/5 |
| Comparative Example 204 | (17) | Z6 (45) | Cc | W-1 | A1/B1 = 95/5 |

The abbreviations used in Tables 205 to 207 are described below.

The acid generators are selected from Z1 to Z40 in the specific examples of component (A) described hereinbefore.

The abbreviations of the basic compounds are as follows. The ratio of basic compounds in case of using two or more thereof shown in Tables 205 to 207 is indicated by a weight ratio.
C1: Methoxyethoxyethylamine
C2: Bis(methoxyethoxyethyl)amine
C3: Tris(methoxymethoxyethyl)amine
C4; Tris(methoxyethoxyethyl)amine
C5: Tris(methoxyethoxymethoxyethyl)amine
Ca: Tributylamine
Cb: Trioctylamine
Cc: 2,6-Diisopropylaniline
Cd: 1,5-Diazabicyclo[4.3.0]non-5-ene
Ce: Antipyrine The abbreviations of the surface active agents are as follows.
W-1: Megafax F176 (manufactured by Dainippon Ink and Chemicals, Inc.) (fluorine-base)
W-2: Megafac R08 (manufactured by Dainippon Ink and Chemicals, Inc.) (fluorine- and silicon-base)
W-3; Polysiloxane Polymer KP-341 (manufactured by Shin-Etsu Chemical Co., Ltd.) (silicon-base)
W-4: Troysol S-366 (manufactured by Troy Chemical Co., Ltd.)

The abbreviations of the solvents are as follows. The ratio of solvents in case of using two or more thereof shown in Tables 205 to 207 is indicated by a weight ratio.
A1: Propylene glycol methyl ether acetate
A2: 2-Heptanone
A3: Ethyl ethoxypropionate
A4: γ-Butyrolactone
A5: Cyclohexanone
B1: Propylene glycol methyl ether
B2: Ethyl lactate <Evaluation of Pattern>

(1) Evaluation of Fluctuation in Linewidth

The evaluation of fluctuation in linewidth was conducted in the same manner as in Examples 1 to 76 and Comparative Examples 1 to 4.

(2) Evaluation of Development Defect

On a silicon wafer was coated a reflection preventing film (ARC 25 manufactured by Brewer Science, Inc.) at a thickness of 30 nm by a spin coater, followed by drying. Then, each of the photosensitive compositions described above was coated thereon by a spin coater and dried at 115° C. for 90 seconds in each of Examples 201 to 218 and Comparative Examples 1 to 2, or at 135° C. for 90 seconds in each of Examples 219 to 276 and Comparative Examples 203 to 204 to form a positive photoresist film having a thickness of about 0.4 µm. The resist film was subjected to exposure using an ArF excimer laser (193 nm) stepper (manufacture by ISI Co., Ltd.) and then heat treatment at 115° C. for 90 seconds in each of Examples 201 to 218 and Comparative Examples 201 to 202, or at 130° C. for 90 seconds in each of Examples 219 to 276 and Comparative Examples 203 to 204. Then the resist film was developed with a 2.38% by weight aqueous tetramethylammonium hydroxide solution, rinsed with distilled water, and dried to obtain a resist pattern profile.

With the resist pattern obtained, a number of development defect occurred was measured by a device (KLA-2112 manufactured by KLA-Tencor Corp.). The primary datum was designated as the number of development defect. As the value is smaller, the development defect is better.

TABLE 208

| Example | Fluctuation in Linewidth (μm) | Number of Development Defect |
|---|---|---|
| 201 | 0.002 | 2 |
| 202 | 0.003 | 3 |
| 203 | 0.002 | 2 |
| 204 | 0.002 | 3 |
| 205 | 0.002 | 3 |
| 206 | 0.003 | 2 |
| 207 | 0.002 | 2 |
| 208 | 0.002 | 2 |
| 209 | 0.003 | 2 |
| 210 | 0.002 | 4 |
| 211 | 0.002 | 1 |
| 212 | 0.003 | 1 |
| 213 | 0.002 | 2 |
| 214 | 0.002 | 1 |
| 215 | 0.002 | 1 |
| 216 | 0.002 | 1 |
| 217 | 0.002 | 1 |
| 218 | 0.003 | 3 |
| 219 | 0.002 | 4 |
| 220 | 0.002 | 2 |
| 221 | 0.002 | 3 |
| 222 | 0.002 | 1 |
| 223 | 0.002 | 2 |
| 224 | 0.003 | 4 |
| 225 | 0.002 | 3 |

TABLE 209

| Example | Fluctuation in Linewidth (mμ) | Number of Development Defect |
|---|---|---|
| 226 | 0.002 | 5 |
| 227 | 0.002 | 2 |
| 228 | 0.002 | 1 |
| 229 | 0.003 | 3 |
| 230 | 0.002 | 2 |
| 231 | 0.003 | 4 |
| 232 | 0.002 | 3 |
| 233 | 0.002 | 1 |
| 234 | 0.002 | 2 |
| 235 | 0.002 | 3 |
| 236 | 0.002 | 2 |
| 237 | 0.003 | 4 |
| 238 | 0.002 | 2 |
| 239 | 0.003 | 3 |
| 240 | 0.002 | 4 |
| 241 | 0.002 | 3 |
| 242 | 0.003 | 1 |
| 243 | 0.002 | 2 |
| 244 | 0.002 | 3 |
| 245 | 0.003 | 4 |
| 246 | 0.002 | 2 |
| 247 | 0.002 | 4 |
| 248 | 0.003 | 3 |
| 249 | 0.003 | 1 |
| 250 | 0.002 | 3 |

TABLE 210

| Example | Fluctuation in Linewidth (mμ) | Number of Development Defect |
|---|---|---|
| 251 | 0.002 | 4 |
| 252 | 0.002 | 2 |
| 253 | 0.003 | 3 |
| 254 | 0.003 | 4 |
| 255 | 0.002 | 1 |
| 256 | 0.002 | 2 |
| 257 | 0.002 | 3 |
| 258 | 0.003 | 4 |
| 259 | 0.002 | 2 |
| 260 | 0.002 | 4 |
| 261 | 0.003 | 1 |
| 262 | 0.002 | 4 |
| 263 | 0.003 | 3 |
| 264 | 0.002 | 1 |
| 265 | 0.003 | 2 |
| 266 | 0.002 | 4 |
| 267 | 0.002 | 3 |
| 268 | 0.003 | 1 |
| 269 | 0.003 | 2 |
| 270 | 0.002 | 4 |
| 271 | 0.002 | 2 |
| 272 | 0.002 | 3 |
| 273 | 0.002 | 4 |
| 274 | 0.002 | 2 |
| 275 | 0.002 | 4 |
| 276 | 0.002 | 3 |
| Comparative Example 201 | 0.01 | 39 |
| Comparative Example 202 | 0.01 | 46 |
| Comparative Example 203 | 0.01 | 38 |
| Comparative Example 204 | 0.01 | 46 |

From the results shown in Tables 208 to 210, it can be seen that in the photosensitive compositions of Examples 201 to 276, the number of development defect occurred is very small as well as restraining the fluctuation in linewidth.

The positive photosensitive composition according to the present invention exhibits the excellent edge roughness of pattern, the excellent halftone exposure aptitude and the low occurrence of development defect as well as the small fluctuation in linewidth.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive photosensitive composition comprising (A) an acid generator that generates an acid upon irradiation of an actinic ray or radiation, (B) a resin that has a monocyclic or polycyclic alicyclic hydrocarbon structure and is decomposed by the action of an acid to increase solubility in an alkali developing solution, (C-1) a mixture of at least two basic compounds having different structures, (D) a fluorine and/or silicon surface active agent, and (E) a mixed solvent composed of a solvent containing a hydroxy group and a solvent containing no hydroxy group, wherein the resin of component (B) is a resin containing a repeating unit having a partial structure including an alicyclic hydrocarbon represented by formula (pI), (pII), (pIII), (pIV), (pV) or (pVI) described below, and a repeating unit having a group represented by any one of the following formulae (V-1) to (V-4):

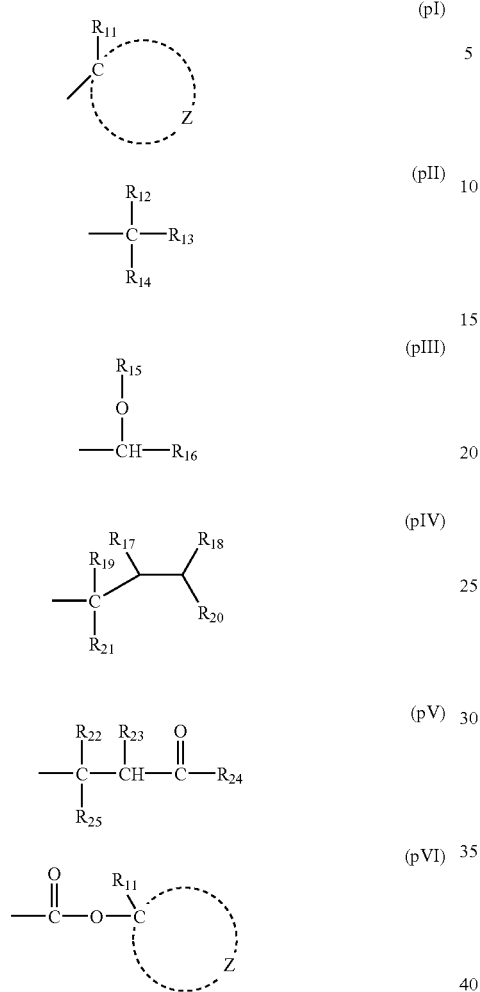

(pI)

(pII)

(pIII)

(pIV)

(pV)

(pVI)

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represents a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group; $R_{17}$ to $R_{21}$ each independently represents a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$ to $R_{25}$ each independently represents a straight chain or branched alkyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring,

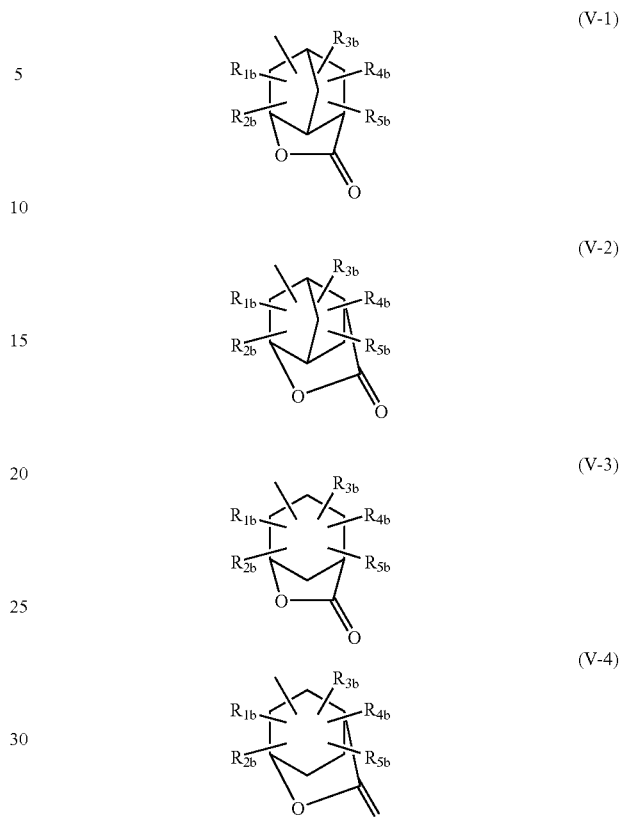

(V-1)

(V-2)

(V-3)

(V-4)

wherein $R_{1b}$, $R_{2b}$, $R_{3b}$, $R_{4b}$ and $R_{5b}$, which may be the same or different, each represents a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring, and wherein the resin of component (B) further contains a repeating unit having a lactone structure represented by the following formula (IV):

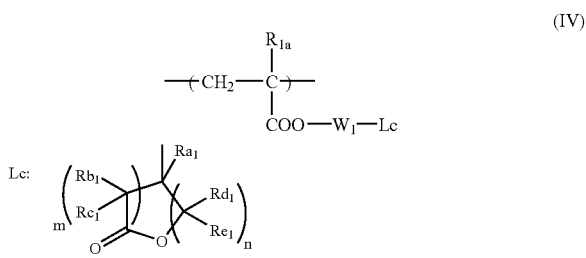

(IV)

wherein $R_{1a}$ represents a hydrogen atom or a methyl group; $W_1$ represents a single bond, an alkylene group, an ether group, a thioether group, a carbonyl group, an ester group or a combination of two or more thereof; $Ra_1$, $Rb_1$, $Rc_1$, $Rd_1$ and $Re_1$, which may be the same or different, each independently represents a hydrogen atom or an alkyl group having from 1 to 4 carbon atoms; and m and n, which may be the same or different, each independently represents an integer of from 0 to 3, provided that the sum total of m and n is from 2 to 6.

2. The positive photosensitive composition as claimed in claim 1, wherein the positive photosensitive composition further comprises (F) a dissolution inhibiting low molecular weight compound having a group capable of being decomposed by the action of an acid to increase solubility in an alkali developing solution and having a molecular weight of not more than 3,000.

3. The positive photosensitive composition as claimed in claim 1, wherein the resin of component (B) further contains a repeating unit having a group represented by the following formula (VI):

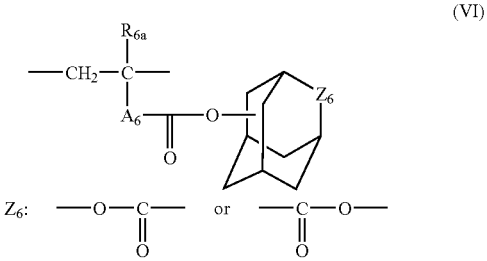

(VI)

wherein $A_6$ represents a single bond, an alkylene group, a cycloalkylene group, an ether group, a thioether group, a carbonyl group, an ester group or a combination of two or more thereof $R_{6a}$ represents a hydrogen atom, an alkyl group having from 1 to 4 carbon atoms, a cyano group or a halogen atom.

4. The positive photosensitive composition as claimed in claim 1, wherein the resin of component (B) further contains a repeating unit having a group represented by the following formula (VII):

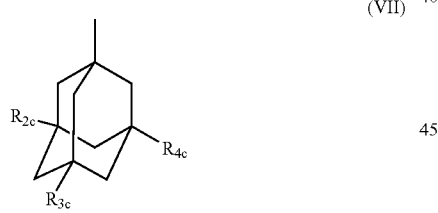

(VII)

wherein $R_{2c}$, $R_{3c}$ and $R_{4c}$, which may be the same or different, each represents a hydrogen atom or a hydroxy group, provided that at least one of $R_{2c}$, $R_{3c}$ and $R_{4c}$ represents a hydroxy group.

5. The positive photosensitive composition as claimed in claim 1, wherein the resin of component (B) further contains a repeating unit having a group represented by the following formula (VIII):

(VIII)

wherein $Z_2$ represents —O— or —N($R_{41}$)—; $R_{41}$ represents a hydrogen atom, a hydroxy group, an alkyl group, a haloalkyl group or —O—SO$_2$—$R_{42}$; and $R_{42}$ represents an alkyl group, a haloakyl group, a cycloalkyl group or a camphol residue.

6. The positive photosensitive composition as claimed in claim 1, wherein the basic compounds of component (C-1) are selected from compounds having a structure represented by any one of the following formulas (A) to (E):

(A)

wherein $R^{250}$, $R^{251}$ and $R^{252}$, which may be the same or different, each independently represents a hydrogen atom, an alkyl group having from 1 to 20 carbon atoms, an aminoalkyl group having from 1 to 20 carbon atoms, a hydroxyalkyl group having from 1 to 20 carbon atoms or a substituted or unsubstituted aryl group having from 6 to 20 carbon atoms, or $R^{250}$ and $R^{251}$ may be combined with each other to form a ring, and the alkyl chain may contain an oxygen atom, a sulfur atom or a nitrogen atom,

(B)

(C)

(D)

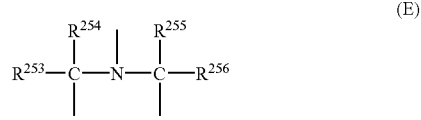

(E)

wherein $R^{253}$, $R^{254}$, $R^{255}$ and $R^{256}$, which may be the same or different, each independently represents an alkyl group having from 1 to 6 carbon atoms.

7. A positive photosensitive composition comprising (A) an acid generator that generates an acid upon irradiation of an actinic ray or radiation, (B) a resin that has a monocyclic or polycyclic alicyclic hydrocarbon structure and is decomposed by the action of an acid to increase solubility in an alkali developing solution, (C-1) a mixture of at least two basic compounds having different structures, (D) a fluorine and/or silicon surface active agent, and (E) a mixed solvent composed of a solvent containing a hydroxy group and a solvent containing no hydroxy group, wherein the resin of component (B) is a resin containing a repeating unit having a partial structure including an alicyclic hydrocarbon represented by formula (pI), (pII), (pIII), (pIV), (pV) or (pVI) described below, and repeating unit having a group represented by any one of the following formulae (V-1) to (V-4):

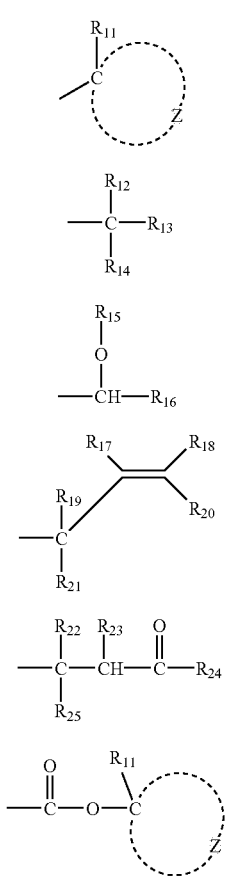

(pI)

(pII)

(pIII)

(pIV)

(pV)

(pVI)

wherein $R_{11}$ represents a methyl group, an ethyl group, an n-propyl group, isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represents a straight chain or branched alkyl group having from 1 to 4 carbon atoms or an alicyclic hydrocarbon group, provided that at least one of $R_{12}$ to $R_{15}$ or $R_{16}$ represents an alicyclic hydrocarbon group; $R_{17}$ to $R_{21}$ each independently represents a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$ to $R_{25}$ each independently represents a straight chain or branched akyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring,

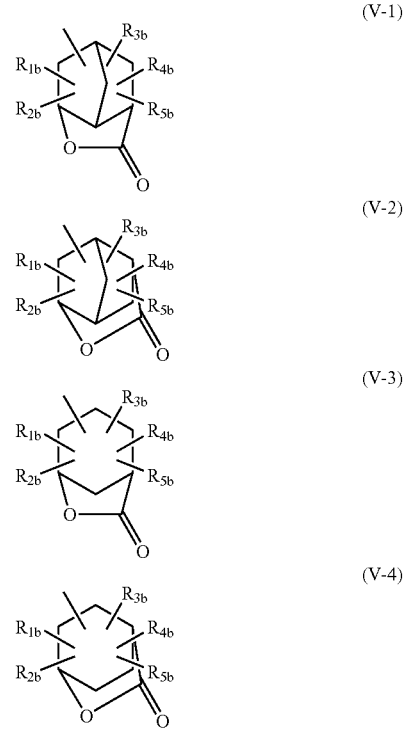

(V-1)

(V-2)

(V-3)

(V-4)

wherein $R_{1b}$, $R_{2b}$, $R_{3b}$, $R_{4b}$ and $R_{5b}$, which may be same or different, each represents a hydrogen atom, and alkyl group which may be substituted, a cycloalkyl group which may be substituted or an alkenyl group which may be substituted, or two of $R_{1b}$, $R_{2b}$, $R_{3b}$ $R_{4b}$ and $R_{5b}$ may be combined with each other to form a ring, and wherein the resin of component (B) further contains a repeating unit having a group represented by the following formula (VI):

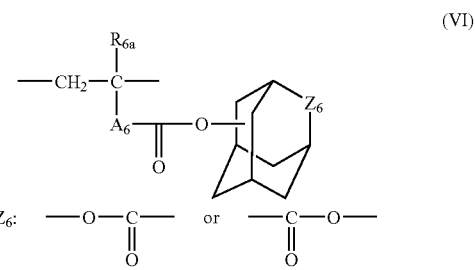

(VI)

wherein $A_6$ represents a single bond, an alkylene group, a cycloaklylene group, and ether group, a thioether group, a carbonyl group, an ester group or a combination of two or more thereof; $R_{6a}$ represents a hydrogen atom, an alkyl group having from 1 to 4 carbon atoms, a cyano group or a halogen atom.

* * * * *